United States Patent
Watanabe et al.

(10) Patent No.: US 12,117,563 B2
(45) Date of Patent: Oct. 15, 2024

(54) LIGHT RECEIVING DEVICE AND DISTANCE MEASURING MODULE

(71) Applicant: SONY SEMICONDUCTOR SOLUTIONS CORPORATION, Kanagawa (JP)

(72) Inventors: Ryota Watanabe, Kanagawa (JP); Takeshi Yamazaki, Kanagawa (JP); Sangman Han, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 461 days.

(21) Appl. No.: 17/593,435

(22) PCT Filed: Mar. 16, 2020

(86) PCT No.: PCT/JP2020/011441
§ 371 (c)(1),
(2) Date: Sep. 17, 2021

(87) PCT Pub. No.: WO2020/196024
PCT Pub. Date: Oct. 1, 2020

(65) Prior Publication Data
US 2022/0171032 A1 Jun. 2, 2022

(30) Foreign Application Priority Data
Mar. 28, 2019 (JP) .................... 2019-062995

(51) Int. Cl.
*G01S 7/481* (2006.01)
*G01S 7/4863* (2020.01)

(52) U.S. Cl.
CPC .......... *G01S 7/4816* (2013.01); *G01S 7/4863* (2013.01)

(58) Field of Classification Search
CPC ...... G01S 7/4808; G01S 7/481; G01S 7/4816; G01S 7/4817; G01S 7/483; G01S 7/486;
(Continued)

(56) References Cited

U.S. PATENT DOCUMENTS 11,378,659 B2 * 7/2022 Isogai ............... H01L 27/14623
11,652,175 B2 * 5/2023 Murase ............. H01L 31/02019
257/431
(Continued)

FOREIGN PATENT DOCUMENTS

EP 3506355 A1 7/2019
EP 3573104 A1 11/2019
(Continued)

OTHER PUBLICATIONS

International Search Report and Written Opinion of PCT Application No. PCT/JP2020/011441, issued on Jun. 2, 2020, 09 pages of ISRWO.

*Primary Examiner* — John R Lee
(74) *Attorney, Agent, or Firm* — CHIP LAW GROUP

(57) ABSTRACT

The present technology relates to a light receiving device and a distance measuring module capable of improving sensitivity. A light receiving device includes a pixel array unit in which pixels each having a first tap detecting charge photoelectrically converted by a photoelectric conversion unit and a second tap detecting charge photoelectrically converted by the photoelectric conversion unit are two-dimensionally arranged in a matrix. The first tap and the second tap each have a voltage application unit that applies a voltage, the pixel array unit has a groove portion formed by digging from a light incident surface side of a substrate to a predetermined depth, and the groove portion is arranged so as to overlap at least a part of the voltage application unit in plan view. The present technology can be applied to a distance measuring sensor or the like of the indirect ToF scheme, for example.

13 Claims, 34 Drawing Sheets

(58) Field of Classification Search
CPC ... G01S 7/4861; G01S 7/4863; H01L 27/146; H01L 27/14601; H01L 27/14609; H01L 27/1461; H01L 27/14612; H04N 25/44; H04N 25/441; H04N 25/47; H04N 25/50; H04N 25/53

See application file for complete search history.

(56) References Cited

U.S. PATENT DOCUMENTS

| | | |
|---|---|---|
| 2017/0287955 A1 | 10/2017 | Ukigaya et al. |
| 2019/0006399 A1 | 1/2019 | Otake et al. |
| 2019/0088692 A1 | 3/2019 | Wu |
| 2019/0342510 A1 | 11/2019 | Sano |
| 2022/0171032 A1* | 6/2022 | Watanabe ............. G01S 7/4863 |
| 2022/0223632 A1* | 7/2022 | Watanabe ......... H01L 27/14636 |
| 2023/0071795 A1* | 3/2023 | Watanabe ............. G01S 17/931 |

FOREIGN PATENT DOCUMENTS

| | | |
|---|---|---|
| JP | 2017-183661 A | 10/2017 |
| JP | 2018-117117 A | 7/2018 |
| JP | 2018-201005 A | 12/2018 |
| TW | 200931652 A | 7/2009 |
| WO | 2018/042785 A1 | 3/2018 |
| WO | 2018/074530 A1 | 4/2018 |
| WO | 2018/135320 A1 | 7/2018 |

* cited by examiner

FIG. 32
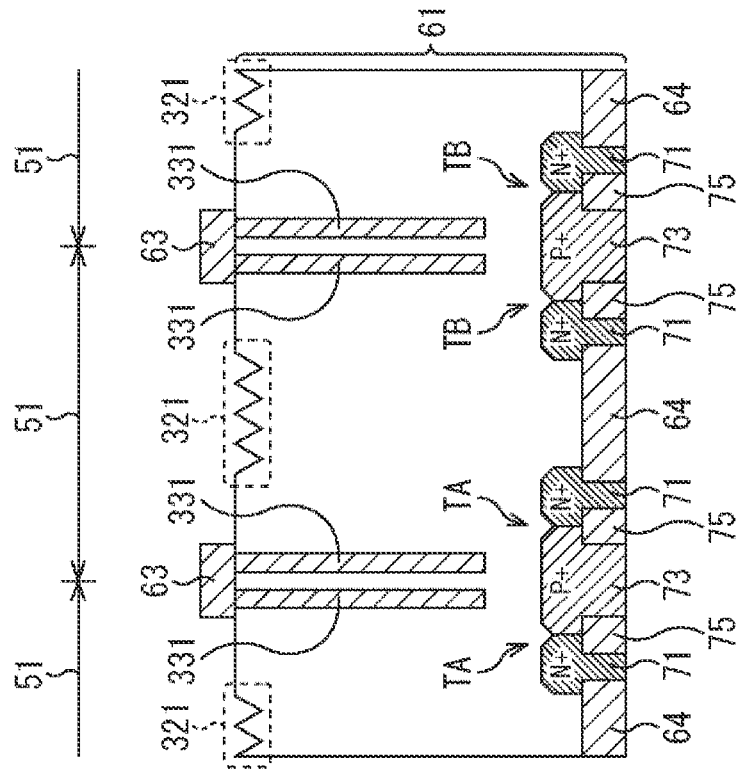
FIG. 32B
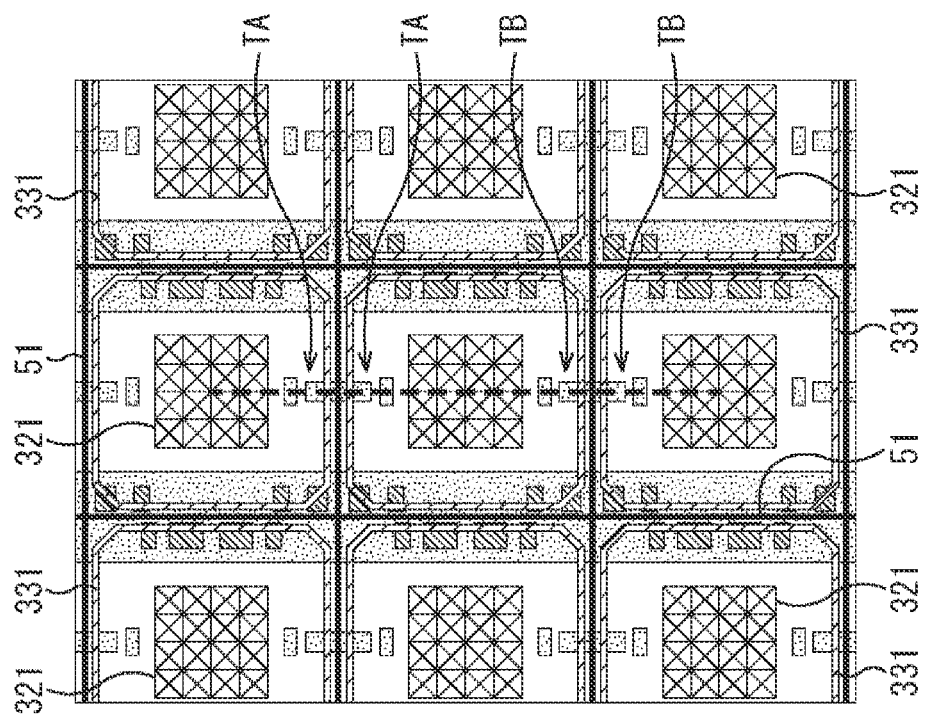
FIG. 32A

LIGHT RECEIVING DEVICE AND DISTANCE MEASURING MODULE

TECHNICAL FIELD

The present technology relates to a light receiving device and a distance measuring module, and more particularly to a light receiving device and a distance measuring module capable of improving sensitivity.

BACKGROUND ART

A distance measuring sensor using the indirect time of flight (ToF) scheme is known. In a distance measuring sensor of the indirect ToF scheme, signal charges obtained by receiving light reflected by a measurement object are distributed to two charge accumulation regions, and the distance is calculated from the distribution ratio of the signal charges. Among such distance measuring sensors, there has been proposed a distance measuring sensor that adopts a back-illumination structure to improve the light receiving characteristics (see Patent Document 1, for example).

CITATION LIST

Patent Document

Patent Document 1: International Patent Application Publication No. 2018/135320

SUMMARY OF THE INVENTION

Problems to be Solved by the Invention

In such a distance measuring sensor of the indirect ToF scheme, further improvement in sensitivity has been desired.

The present technology has been made in view of such a situation, and aims to improve sensitivity.

Solutions to Problems

A light receiving device of a first aspect of the present technology includes a pixel array unit in which pixels each having a first tap detecting charge photoelectrically converted by a photoelectric conversion unit and a second tap detecting charge photoelectrically converted by the photoelectric conversion unit are two-dimensionally arranged in a matrix. The first tap and the second tap each have a voltage application unit that applies a voltage, the pixel array unit has a groove portion formed by digging from a light incident surface side of a substrate to a predetermined depth, and the groove portion is arranged so as to overlap at least a part of the voltage application unit in plan view.

A distance measuring module of a second aspect of the present technology includes a light receiving device having a pixel array unit in which pixels each having a first tap detecting charge photoelectrically converted by a photoelectric conversion unit and a second tap detecting charge photoelectrically converted by the photoelectric conversion unit are two-dimensionally arranged in a matrix, the first tap and the second tap each having a voltage application unit that applies a voltage, the pixel array unit having a groove portion formed by digging from a light incident surface side of a substrate to a predetermined depth, and the groove portion arranged so as to overlap at least a part of the voltage application unit in plan view.

In the first and second aspects of the present technology, there is provided a pixel array unit in which pixels each having a first tap detecting charge photoelectrically converted by a photoelectric conversion unit and a second tap detecting charge photoelectrically converted by the photoelectric conversion unit are two-dimensionally arranged in a matrix. The first tap and the second tap each have a voltage application unit that applies a voltage, and the pixel array unit has a groove portion formed by digging from the light incident surface side of a substrate to a predetermined depth. The groove portion is arranged so as to overlap at least a part of the voltage application unit in plan view.

The light receiving device and the distance measuring module may be independent devices, or may be modules incorporated in another device.

BRIEF DESCRIPTION OF DRAWINGS

FIG. 32 is a diagram illustrating the seventh pixel separation structure provided with an uneven structure.

MODE FOR CARRYING OUT THE INVENTION

Figure 1:
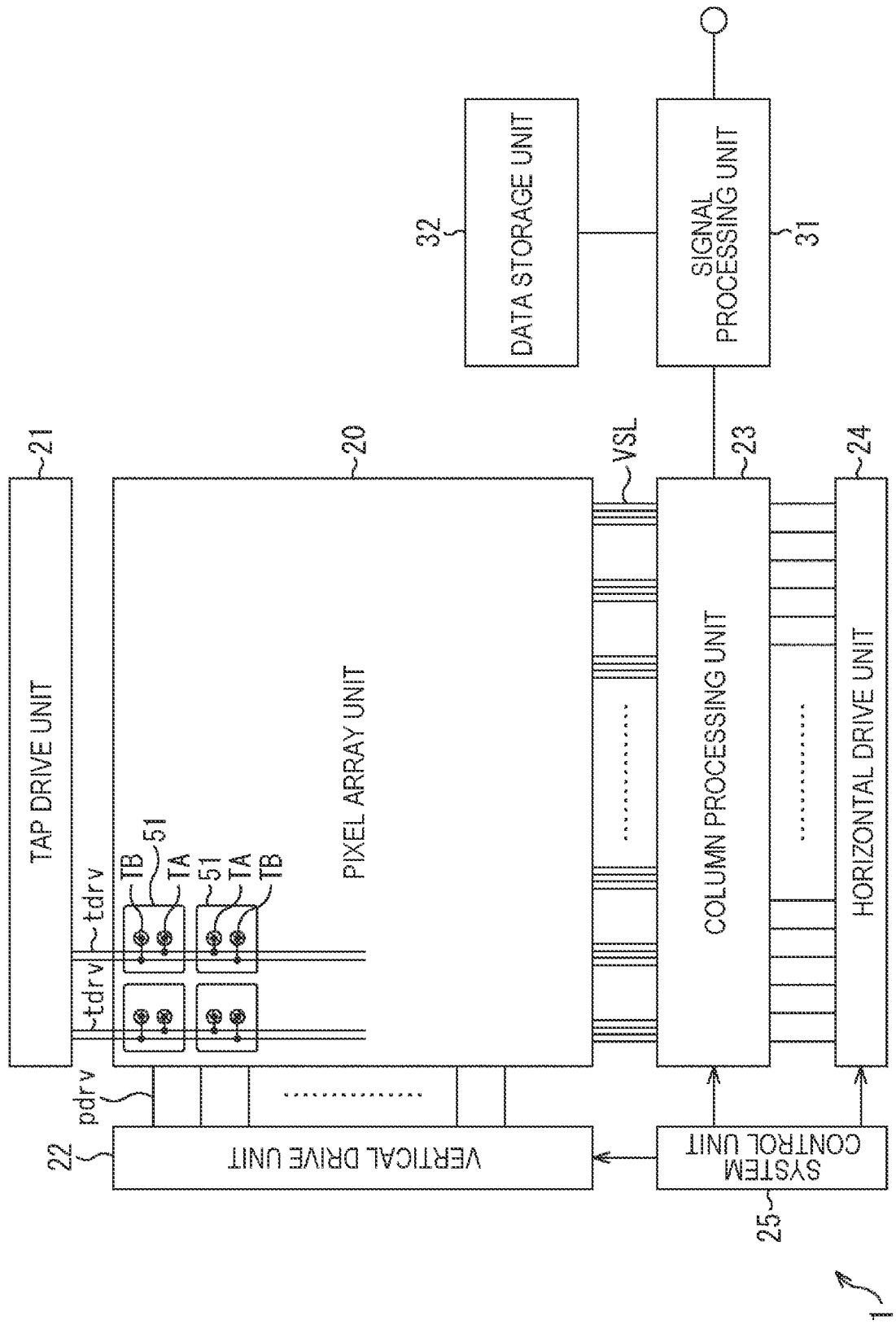
FIG. 1 is a block diagram illustrating a configuration example of a light receiving device.

Hereinafter, a mode for carrying out the present technology (hereinafter referred to as embodiment) will be described. Note that the description will be given in the following order.
1. Block diagram of light receiving device
2. Exemplary structure of pixel
3. Example of cross-sectional configuration of multiple pixels
4. Other planar shape examples of tap T
5. Equivalent circuit of pixel
6. Wiring example of vertical signal line VSL
7. Planar arrangement example of five metal films M1 to M5
8. Configuration example of DTI
9. Substrate configuration example of light receiving device
10. Configuration example of distance measuring module
11. Example of application to movable body <1. Block Diagram of Light Receiving Device>

FIG. 1 is a block diagram illustrating a configuration example of a light receiving device to which the present technology is applied.

A light receiving device 1 in FIG. 1 is a back-illuminated current assisted photonic demodulator (CAPD) sensor, and is used as a part of a distance measuring system that measures distance by the indirect ToF scheme, for example. The distance measuring system can be applied to, for example, an in-vehicle system that is mounted on a vehicle and measures the distance to an object outside the vehicle, a gesture recognition system that measures the distance to an object such as the user's hand and recognizes a gesture of the user on the basis of a measurement result, and the like.

The light receiving device 1 has a pixel array unit 20 formed on a semiconductor substrate (not illustrated) and a peripheral circuit unit arranged around the pixel array unit 20, for example. The peripheral circuit unit includes, for example, a tap drive unit 21, a vertical drive unit 22, a column processing unit 23, a horizontal drive unit 24, a system control unit 25, and the like.

The light receiving device 1 is further provided with a signal processing unit 31 and a data storage unit 32. Note that the signal processing unit 31 and the data storage unit 32 may be mounted on the same substrate as the light receiving device 1, or may be arranged on a substrate different from the light receiving device 1 in an imaging device.

The pixel array unit 20 has a configuration in which pixels 51 that generate charges according to the amount of received light and output signals according to the charges are two-dimensionally arranged in a matrix in the row direction and the column direction. That is, the pixel array unit 20 includes multiple pixels 51 that photoelectrically convert incident light and output detection signals according to charge obtained as a result. Here, the row direction refers to the arrangement direction of the pixels 51 in the horizontal direction, and the column direction refers to the arrangement direction of the pixels 51 in the vertical direction. The row direction is the lateral direction in the drawing, and the column direction is the vertical direction in the drawing.

The pixel 51 receives and photoelectrically converts light incident from the outside, particularly infrared light, and outputs a signal corresponding to the charge obtained as a result. The pixel 51 has a first tap TA for applying a predetermined voltage MIX_A (first voltage) to detect photoelectrically converted charge, and a second tap TB for applying a predetermined voltage MIX_B (second voltage) to detect photoelectrically converted charge.

The tap drive unit 21 supplies the predetermined voltage MIX_A to the first tap TA of each pixel 51 of the pixel array unit 20 through a predetermined voltage supply line tdrv, and supplies the predetermined voltage MIX_B to the second tap TB through the predetermined voltage supply line tdrv. Accordingly, two voltage supply lines tdrv of the voltage supply line tdrv that transmits the voltage MIX_A and the voltage supply line tdrv that transmits the voltage MIX_B are wired in one pixel column of the pixel array unit 20.

In the pixel array unit 20, a pixel drive line pdrv is wired along the row direction for each pixel row with respect to the matrix-shaped pixel array. The pixel drive line pdrv transmits a drive signal for performing driving when reading a detection signal from a pixel. Note that while the pixel drive line pdrv is depicted as one wiring in FIG. 1, the pixel drive line pdrv is not limited to one, and actually includes multiple wirings. One end of the pixel drive line pdrv is connected to an output end of the vertical drive unit 22 corresponding to each row.

Additionally, four vertical signal lines VSL are wired along the column direction for each pixel column of the multiple pixels arranged in a matrix of the pixel array unit 20. Although details of the four vertical signal lines VSL will be described later with reference to FIGS. 14 to 17, by wiring the four vertical signal lines VSL for each pixel column, multiple rows can be read simultaneously, the S/N ratio is improved, and reading time is shortened.

The vertical drive unit 22 includes a shift register, an address decoder, and the like, and drives the pixels of the pixel array unit 20 simultaneously or row by row, for example. That is, the vertical drive unit 22 is included, together with the system control unit 25 that controls the vertical drive unit 22, in a drive unit that controls the operation of each pixel of the pixel array unit 20

The detection signal output from each pixel 51 of the pixel row according to the drive control by the vertical drive unit 22 is input to the column processing unit 23 through the vertical signal line VSL. The column processing unit 23 performs predetermined signal processing on the detection signal output from each pixel 51 through the vertical signal line VSL, and temporarily holds the detection signal after the signal processing.

Specifically, the column processing unit 23 performs noise removal processing, analog to digital (AD) conversion processing, and the like as signal processing.

The horizontal drive unit 24 includes a shift register, an address decoder, and the like, and sequentially selects unit circuits corresponding to pixel columns of the column processing unit 23. By the selective scanning by the horizontal drive unit 24, the detection signals subjected to the signal processing for each unit circuit in the column processing unit 23 are sequentially output to the signal processing unit 31.

The system control unit 25 includes a timing generator that generates various timing signals and the like, and performs drive control of the tap drive unit 21, the vertical drive unit 22, the column processing unit 23, the horizontal drive unit 24, and the like on the basis of the various timing signals generated by the timing generator.

The signal processing unit 31 has at least an arithmetic processing function, and performs various signal processing such as arithmetic processing on the basis of the detection signal output from the column processing unit 23. When the signal processing unit 31 performs signal processing, the data storage unit 32 temporarily stores data necessary for the processing.

The light receiving device 1 is configured as described above.

<2. Exemplary Structure of Pixel>

Next, the structure of the pixel 51 provided in the pixel array unit 20 will be described.

Figure 2:
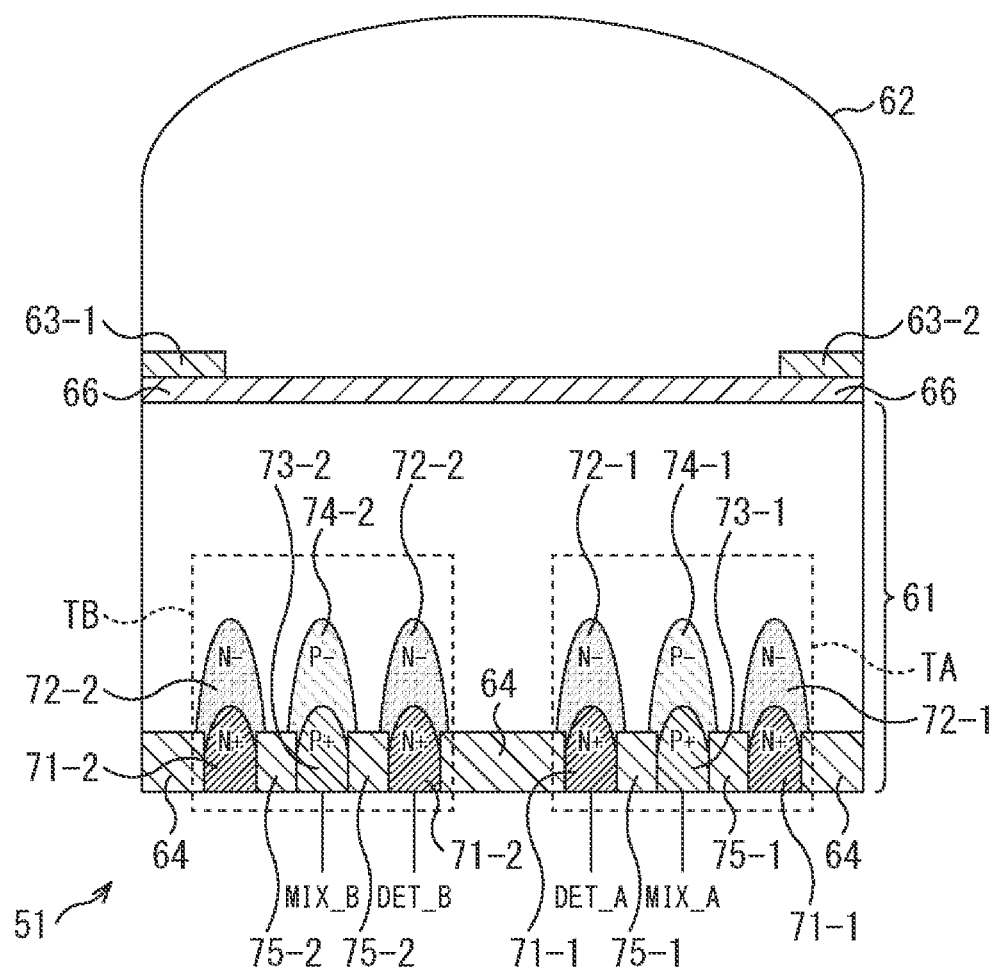
FIG. 2 is a cross-sectional view illustrating a configuration example of a pixel.

FIG. 2 illustrates a cross-sectional view of one pixel 51 provided in the pixel array unit 20.

The pixel 51 receives and photoelectrically converts light incident from the outside, particularly infrared light, and outputs a signal corresponding to the charge obtained as a result.

The pixel 51 has, for example, a substrate 61 including a P-type semiconductor layer such as a silicon substrate and an on-chip lens 62 formed on the substrate 61. The substrate 61 corresponds to a photoelectric conversion unit that photoelectrically converts light incident on the pixel 51 from the outside.

The substrate 61 includes, for example, a high-resistance P-Epi substrate having a substrate concentration of 1E+13 order or less, and is formed so that the resistance (resistivity) of the substrate 61 is 500 [Ωcm] or more, for example. Here, the relationship between the substrate concentration and the resistance of the substrate 61 is, for example, resistance of 2000 [Ωcm] when the substrate concentration is 6.48E+12 [cm$^3$], resistance of 1000 [Ωcm] when the substrate concentration is 1.30E+13 [cm$^3$], resistance of 500 [Ωcm] when the substrate concentration is 2.59E+13 [cm$^3$], and resistance of 100 [Ωcm] when the substrate concentration is 1.30E+14 [cm$^3$].

In FIG. 2, an upper surface of the substrate 61 is a back surface of the substrate 61, and is a light incident surface on which light from the outside is incident on the substrate 61. On the other hand, a lower surface of the substrate 61 is a front surface of the substrate 61, and a multilayer wiring layer (not illustrated) is formed. A fixed charge film 66 including a single-layer film or a laminated film having a positive fixed charge is formed on the light incident surface of the substrate 61, and the on-chip lens 62 that condenses light incident from the outside and causes the light to enter the substrate 61 is formed on an upper surface of the fixed charge film 66. The fixed charge film 66 brings the light incident surface side of the substrate 61 into a hole accumulation state and curbs generation of dark current.

An inter-pixel light-shielding film 63-1 and an inter-pixel light-shielding film 63-2 for preventing crosstalk between adjacent pixels are formed at a pixel boundary portion on the fixed charge film 66. Hereinafter, in a case where it is not particularly necessary to distinguish between the inter-pixel light-shielding film 63-1 and the inter-pixel light-shielding film 63-2, they are also simply referred to as an inter-pixel light-shielding film 63.

In this example, while light from the outside enters the substrate 61 through the on-chip lens 62, the inter-pixel light-shielding film 63 is formed to prevent the light entering from the outside from entering a region of the adjacent pixel 51. That is, light that enters the on-chip lens 62 from the outside and travels into another pixel adjacent to the pixel 51 is shielded by the inter-pixel light-shielding film 63-1 or the inter-pixel light-shielding film 63-2, and is prevented from entering another adjacent pixel.

Since the light receiving device 1 is a back-illuminated CAPD sensor, the light incident surface of the substrate 61 is a so-called back surface, and a wiring layer including wiring and the like is not formed on the back surface. Additionally, a multilayer wiring layer including wiring for driving a transistor or the like formed in the pixel 51, wiring for reading a detection signal from the pixel 51, and the like is formed in a portion of a surface of the substrate 61 on a side opposite to the light incident surface.

An oxide film 64, the first tap TA, and the second tap TB are formed on the side of a surface opposite to the light incident surface in the substrate 61, that is, a portion inside the lower surface in FIG. 2.

In this example, the oxide film 64 is formed in the center portion of the pixel 51 in the vicinity of the surface of the substrate 61 opposite to the light incident surface, and the first tap TA and the second tap TB are formed at both ends of the oxide film 64.

Here, the first tap TA includes an N+ semiconductor region 71-1 and an N− semiconductor region 72-1 having a donor impurity concentration lower than that of the N+ semiconductor region 71-1, which are N-type semiconductor regions, and a P+ semiconductor region 73-1 and a P− semiconductor region 74-1 having an acceptor impurity concentration lower than that of the P+ semiconductor region 73-1, which are P-type semiconductor regions. Here, examples of the donor impurity include an element belonging to Group 5 in the periodic table of elements such as phosphorus (P) and arsenic (As) with respect to Si, and examples of the acceptor impurity include an element belonging to Group 3 in the periodic table of elements such as boron (B) with respect to Si. An element to be a donor impurity is referred to as a donor element, and an element to be an acceptor impurity is referred to as an acceptor element.

In FIG. 2, the N+ semiconductor region 71-1 is formed at a position adjacent to the oxide film 64 on the right side at the portion inside the front surface that is the surface of the substrate 61 opposite to the light incident surface. Additionally, the N− semiconductor region 72-1 is formed above the N+ semiconductor region 71-1 in FIG. 2 so as to cover (surround) the N+ semiconductor region 71-1.

Moreover, the P+ semiconductor region 73-1 is formed on the right side of the N+ semiconductor region 71-1. Additionally, the P− semiconductor region 74-1 is formed above the P+ semiconductor region 73-1 in FIG. 2 so as to cover (surround) the P+ semiconductor region 73-1.

Moreover, an N+ semiconductor region 71-1 is formed on the right side of the P+ semiconductor region 73-1. Additionally, the N− semiconductor region 72-1 is formed above the N+ semiconductor region 71-1 in FIG. 2 so as to cover (surround) the N+ semiconductor region 71-1.

Similarly, the second tap TB includes an N+ semiconductor region 71-2 and an N− semiconductor region 72-2 having a donor impurity concentration lower than that of the N+ semiconductor region 71-2, which are N-type semiconductor regions, and a P+ semiconductor region 73-2 and a P− semiconductor region 74-2 having an acceptor impurity concentration lower than that of the P+ semiconductor region 73-2, which are P-type semiconductor regions.

In FIG. 2, the N+ semiconductor region 71-2 is formed at a position adjacent to the oxide film 64 on the left side at the portion inside the front surface that is the surface of the substrate 61 opposite to the light incident surface. Additionally, the N− semiconductor region 72-2 is formed above the N+ semiconductor region 71-2 in FIG. 2 so as to cover (surround) the N+ semiconductor region 71-2.

Moreover, the P+ semiconductor region 73-2 is formed on the left side of the N+ semiconductor region 71-2. Additionally, the P− semiconductor region 74-2 is formed above the P+ semiconductor region 73-2 in FIG. 2 so as to cover (surround) the P+ semiconductor region 73-2.

Moreover, the N+ semiconductor region 71-2 is formed on the left side of the P+ semiconductor region 73-2. Additionally, the N− semiconductor region 72-2 is formed above the N+ semiconductor region 71-2 in FIG. 2 so as to cover (surround) the N+ semiconductor region 71-2.

An oxide film 64 similar to the central portion of the pixel 51 is formed at the end portion of the pixel 51 at the portion inside the front surface that is the surface of the substrate 61 opposite to the light incident surface.

Hereinafter, in a case where it is not necessary to particularly distinguish between the first tap TA and the second tap TB, they are simply referred to as a tap T.

Additionally, hereinafter, in a case where it is not particularly necessary to distinguish between the N+ semiconductor region 71-1 and the N+ semiconductor region 71-2, they are also simply referred to as an N+ semiconductor region 71, and in a case where it is not particularly necessary to distinguish between the N− semiconductor region 72-1 and the N− semiconductor region 72-2, they are simply referred to as an N− semiconductor region 72.

Moreover, hereinafter, in a case where it is not particularly necessary to distinguish between the P+ semiconductor region 73-1 and the P+ semiconductor region 73-2, they are also simply referred to as a P+ semiconductor region 73, and in a case where it is not particularly necessary to distinguish between the P− semiconductor region 74-1 and the P− semiconductor region 74-2, they are simply referred to as a P− semiconductor region 74.

Additionally, in the substrate 61, a separation portion 75-1 for separating the N+ semiconductor region 71-1 and the P+ semiconductor region 73-1 is formed by an oxide film or the like between the regions. Similarly, a separation portion 75-2 for separating the N+ semiconductor region 71-2 and the P+ semiconductor region 73-2 is also formed by an oxide film or the like between the regions. Hereinafter, in a case where it is not particularly necessary to distinguish between the separation portion 75-1 and the separation portion 75-2, they are simply referred to as a separation portion 75.

The N+ semiconductor region 71 provided in the substrate 61 functions as a charge detection unit for detecting the amount of light incident on the pixel 51 from the outside, that is, the amount of signal carriers generated by photoelectric conversion by the substrate 61. Note that in addition to the N+ semiconductor region 71, the N− semiconductor region 72 having a low donor impurity concentration can also be regarded as a part of the charge detection unit. The N− semiconductor region 72 having a low donor impurity concentration may be omitted. Additionally, the P+ semiconductor region 73 functions as a voltage application unit for injecting a majority carrier current into the substrate 61, that is, for applying a voltage directly to the substrate 61 to generate an electric field in the substrate 61. Note that in addition to the P+ semiconductor region 73, the P− semiconductor region 74 having a low acceptor impurity concentration can also be regarded as a part of the voltage application unit. The P− semiconductor region 74 having a low acceptor impurity concentration may be omitted.

Although details will be described later, a floating diffusion (FD) portion (hereinafter also particularly referred to as FD portion A) which is a floating diffusion region (not illustrated) is directly connected to the N+ semiconductor region 71-1, and the FD portion A is further connected to the vertical signal line VSL through an amplification transistor or the like (not illustrated).

Similarly, another FD portion (hereinafter also particularly referred to as FD portion B) different from the FD portion A is directly connected to the N+ semiconductor region 71-2, and the FD portion B is further connected to the vertical signal line VSL through an amplification transistor or the like (not illustrated). Here, the vertical signal line VSL connected to the FD portion A and the vertical signal line VSL connected to the FD portion B are different vertical signal lines VSL.

For example, in a case where the distance to the object is to be measured by the indirect ToF scheme, infrared light is emitted from the imaging device provided with the light receiving device 1 toward the object. Then, when the infrared light is reflected by the object and returns to the imaging device as reflected light, the substrate 61 of the light receiving device 1 receives and photoelectrically converts the incident reflected light (infrared light). The tap drive unit 21 drives the first tap TA and the second tap TB of the pixel 51, and distributes signals according to charge DET obtained by photoelectric conversion to the FD portion A and the FD portion B.

For example, at a certain timing, the tap drive unit 21 applies a voltage to the two P+ semiconductor regions 73 through a contact or the like. Specifically, for example, the tap drive unit 21 applies a voltage of MIX_A=1.5V to the P+ semiconductor region 73-1 of the first tap TA, and applies a voltage of MIX_B=0V to the P+ semiconductor region 73-2 of the second tap TB.

Then, an electric field is generated between the two P+ semiconductor regions 73 in the substrate 61, and a current flows from the P+ semiconductor region 73-1 to the P+ semiconductor region 73-2. In this case, holes in the substrate 61 move in the direction of the P+ semiconductor region 73-2, and electrons move in the direction of the P+ semiconductor region 73-1.

Accordingly, when infrared light (reflected light) from the outside enters the substrate 61 through the on-chip lens 62 in such a state and the infrared light is photoelectrically converted in the substrate 61 to be converted into a pair of an electron and a hole, the obtained electron is guided in the direction of the P+ semiconductor region 73-1 by the electric field between the P+ semiconductor regions 73 and moves into the N+ semiconductor region 71-1.

In this case, the electrons generated by photoelectric conversion are used as signal carriers (signal charge) for detecting a signal corresponding to the amount of infrared light incident on the pixel 51, that is, the amount of received infrared light.

As a result, in the N+ semiconductor region 71-1, charge according to electrons moving into the N+ semiconductor region 71-1 is accumulated, and the charge is detected by the column processing unit 23 through the FD portion A, the amplification transistor, the vertical signal line VSL, and the like.

That is, accumulated charge DET_A in the N+ semiconductor region 71-1 is transferred to the FD portion A directly connected to the N+ semiconductor region 71-1, and a signal corresponding to the charge DET_A transferred to the FD portion A is read by the column processing unit 23 through the amplification transistor and the vertical signal line VSL. Then, processing such as AD conversion processing is performed on the read signal in the column processing unit 23, and a detection signal obtained as a result is supplied to the signal processing unit 31.

This detection signal is a signal indicating the amount of charge according to the electrons detected by the N+ semiconductor region 71-1, that is, the amount of charge DET_A accumulated in the FD portion A. In other words, the detection signal is a signal indicating the amount of infrared light received by the pixel 51.

Note that at this time, similarly to the case of the N+ semiconductor region 71-1, a detection signal corresponding to electrons detected in the N+ semiconductor region 71-2 may also be appropriately used for distance measurement.

Additionally, at the next timing, a voltage is applied to the two P+ semiconductor regions 73 through a contact or the like by the tap drive unit 21 so as to generate an electric field in a direction opposite to the electric field generated in the substrate 61 up to this point. Specifically, for example, a voltage of MIX_A=0V is applied to the P+ semiconductor region 73-1 of the first tap TA, and a voltage of MIX_B=1.5V is applied to the P+ semiconductor region 73-2 of the second tap TB.

As a result, an electric field is generated between the two P+ semiconductor regions 73 in the substrate 61, and a current flows from the P+ semiconductor region 73-2 to the P+ semiconductor region 73-1.

When infrared light (reflected light) from the outside enters the substrate 61 through the on-chip lens 62 in such a state and the infrared light is photoelectrically converted in the substrate 61 to be converted into a pair of an electron and a hole, the obtained electron is guided in the direction of the P+ semiconductor region 73-2 by the electric field between the P+ semiconductor regions 73 and moves into the N+ semiconductor region 71-2.

As a result, in the N+ semiconductor region 71-2, charge according to electrons moving into the N+ semiconductor region 71-2 is accumulated, and the charge is detected by the column processing unit 23 through the FD portion B, the amplification transistor, the vertical signal line VSL, and the like.

That is, accumulated charge DET_B in the N+ semiconductor region 71-2 is transferred to the FD portion B directly connected to the N+ semiconductor region 71-2, and a signal corresponding to the charge DET_B transferred to the FD portion B is read by the column processing unit 23 through the amplification transistor and the vertical signal line VSL. Then, processing such as AD conversion processing is performed on the read signal in the column processing unit 23, and a detection signal obtained as a result is supplied to the signal processing unit 31.

Note that at this time, similarly to the case of the N+ semiconductor region 71-2, a detection signal corresponding to electrons detected in the N+ semiconductor region 71-1 may also be appropriately used for distance measurement.

In this way, when detection signals obtained by photoelectric conversion in different periods are obtained in the same pixel 51, the signal processing unit 31 calculates distance information indicating the distance to the object on the basis of the detection signals and outputs the distance information to the subsequent stage.

A method of distributing the signal carriers to different N+ semiconductor regions 71 and calculating the distance information on the basis of the detection signals corresponding to the signal carriers in this manner is called the indirect ToF method.

<Planar Shape Example of Tap T>

Figure 3:
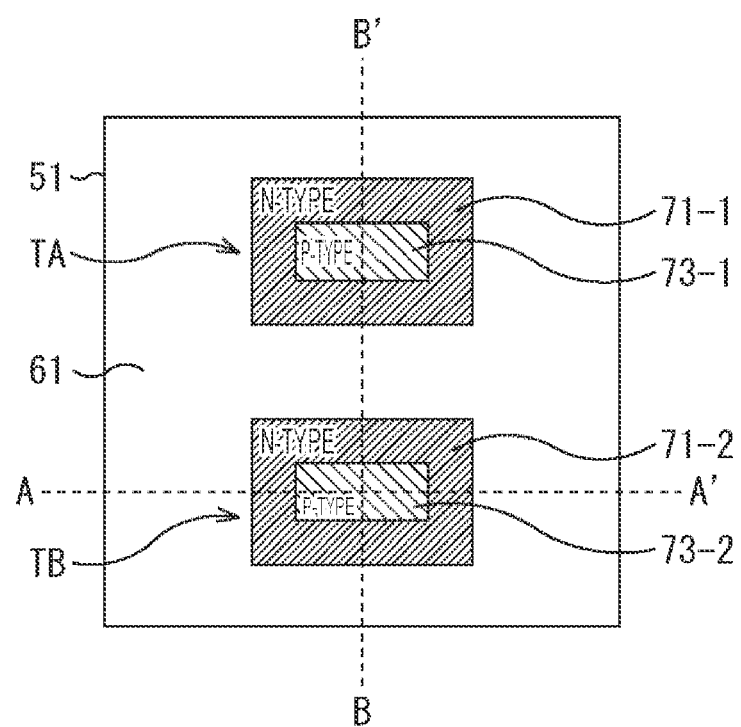
FIG. 3 is a plan view of a first tap and a second tap of a pixel.

FIG. 3 is a plan view of the first tap TA and the second tap TB in the pixel 51.

Note that in FIG. 3, parts corresponding to those in FIG. 2 are denoted by the same reference numerals, and the description thereof will be omitted as appropriate.

As illustrated in FIG. 3, each tap T has a structure in which the P+ semiconductor region 73 is surrounded by the N+ semiconductor region 71. More specifically, a rectangular P+ semiconductor region 73 is formed at the center position of the tap T, and the P+ semiconductor region 73 is surrounded by a rectangular, or more specifically, a rectangular frame-shaped N+ semiconductor region 71.

Note that in FIG. 3, the separation portion 75 between the P+ semiconductor region 73 and the N+ semiconductor region 71 and the oxide film 64 are omitted.

The infrared light incident from the outside is condensed on the center portion of the pixel 51, that is, the middle portion between the first tap TA and the second tap TB by the on-chip lens 62. As a result, it is possible to curb occurrence of crosstalk due to incidence of infrared light on the pixel 51 adjacent to the pixel 51. Additionally, when infrared light is directly incident on the tap T, charge separation efficiency, that is, contrast between active and inactive tap (Cmod) and modulation contrast are reduced. Hence, such reduction can also be curbed.

Here, the tap T on which the signal according to the charge DET obtained by the photoelectric conversion is read, that is, the tap T on which the charge DET obtained by the photoelectric conversion is to be detected is also referred to as an active tap.

Conversely, the tap T on which the signal according to the charge DET obtained by the photoelectric conversion is basically not read, that is, the tap T which is not the active tap is also referred to as an inactive tap.

In the above-described example, the tap T to which a voltage of 1.5 V is applied to the P+ semiconductor region 73 is the active tap, and the tap T to which a voltage of 0 V is applied to the P+ semiconductor region 73 is the inactive tap.

Cmod is calculated by the following Formula (1), and is an index indicating what percentage of the charge generated by the photoelectric conversion of the incident infrared light can be detected in the N+ semiconductor region 71 of the tap T which is the active tap, that is, whether a signal according to the charge can be taken out, and indicates the charge separation efficiency. In Formula (1), I0 is a signal detected by one of the two charge detection units (P+ semiconductor regions 73), and I1 is a signal detected by the other of the two charge detection units.

$$Cmod=\{|I0-I1|/(I0+I1)\}\times 100 \qquad (1)$$

Accordingly, for example, when infrared light incident from the outside enters the region of the inactive tap and photoelectric conversion is performed in the inactive tap, there is a high possibility that electrons, which are signal carriers generated by the photoelectric conversion, move to the N+ semiconductor region 71 in the inactive tap. Then, charge of some of the electrons obtained by photoelectric conversion is not detected in the N+ semiconductor region 71 in the active tap, and Cmod, that is, charge separation efficiency decreases.

Hence, in the pixel 51, by condensing the infrared light near the central portion of the pixel 51 at a position substantially equidistant from the two taps T, the probability that the infrared light incident from the outside is photoelectrically converted in the region of the inactive tap can be reduced, and the charge separation efficiency can be improved. Additionally, in the pixel 51, the modulation contrast can also be improved. In other words, electrons obtained by photoelectric conversion can be easily guided to the N+ semiconductor region 71 in the active tap.

<Exemplary Structure in which DTI for Pixel Separation is Provided>

In the structure of the pixel 51 illustrated in FIG. 2, a separation structure can be provided between the pixel 51 and the pixel 51 in order to improve the separation characteristic between adjacent pixels and curb crosstalk.

Figure 4:
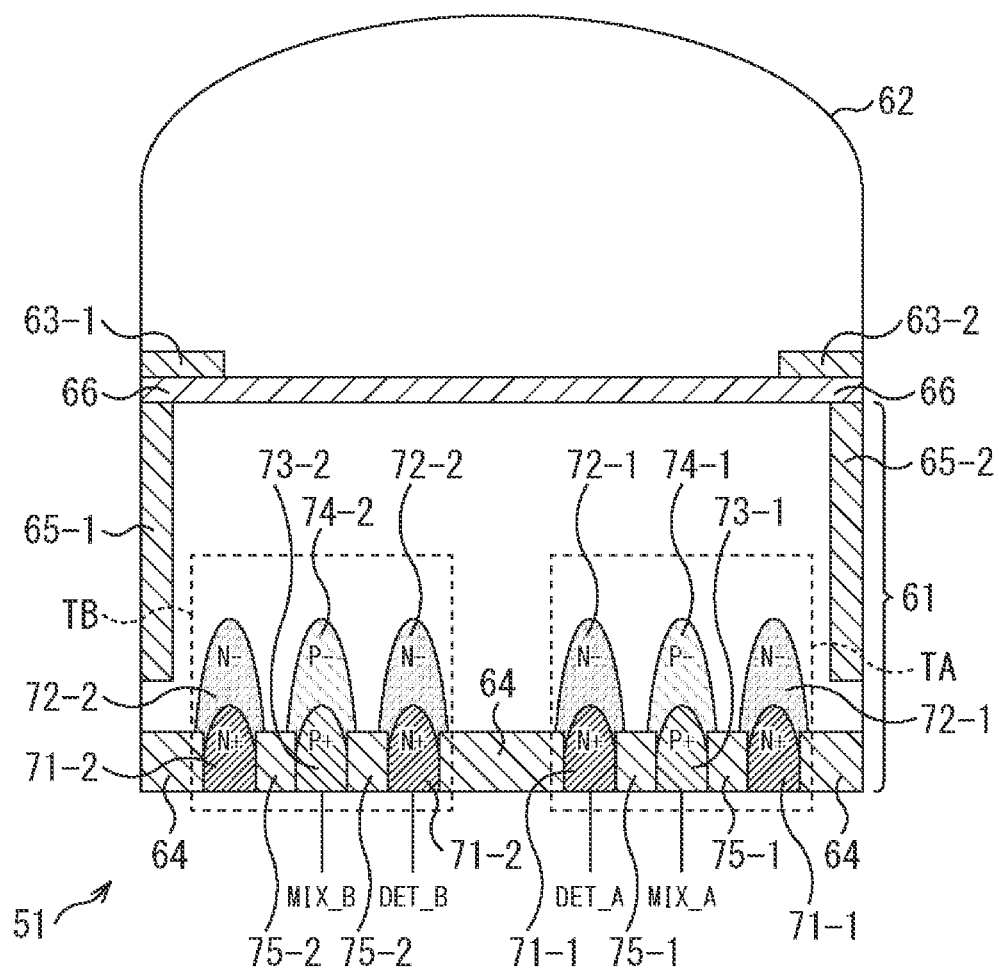
FIG. 4 is a cross-sectional view of a pixel provided with a separation structure.

FIG. 4 is a cross-sectional view illustrating a configuration of the pixel 51 illustrated in FIG. 2 in which a separation structure is provided between adjacent pixels.

In FIG. 4, parts corresponding to those in FIG. 2 are denoted by the same reference numerals, and description of the parts is omitted.

The pixel 51 in FIG. 4 is different from the pixel 51 illustrated in FIG. 2 in that deep trench isolations (DTIs) 65-1 and 65-2 as pixel separation portions are provided, and is the same as the pixel 51 of FIG. 2 in other points. The DTIs 65-1 and 65-2 are formed in the substrate 61 at a boundary portion with the adjacent pixel 51 at a predetermined depth from the back surface side of the substrate 61. Hereinafter, in a case where it is not particularly necessary to distinguish between the DTI 65-1 and the DTI 65-2, they are simply referred to as a DTI 65. The DTI 65 can include, for example, an oxide film. Additionally, for example, the DTI 65 may have a structure in which the outer periphery of a metal film of tungsten (W), aluminum (Al), copper (Cu), titanium (Ti), or the like is covered (surrounded) with an insulating film of silicon oxide (SiO2), silicon oxynitride (SiON), or the like.

By forming the embedded DTI 65 in this manner, the separation characteristic of infrared light between pixels can be improved, and the occurrence of crosstalk can be curbed.

<3. Example of Cross-Sectional Configuration of Multiple Pixels>

In the cross-sectional configuration of the pixel 51 illustrated in FIGS. 2 and 4, the multilayer wiring layer formed on the front surface side opposite to the light incident surface of the substrate 61 is omitted.

Figure 5:
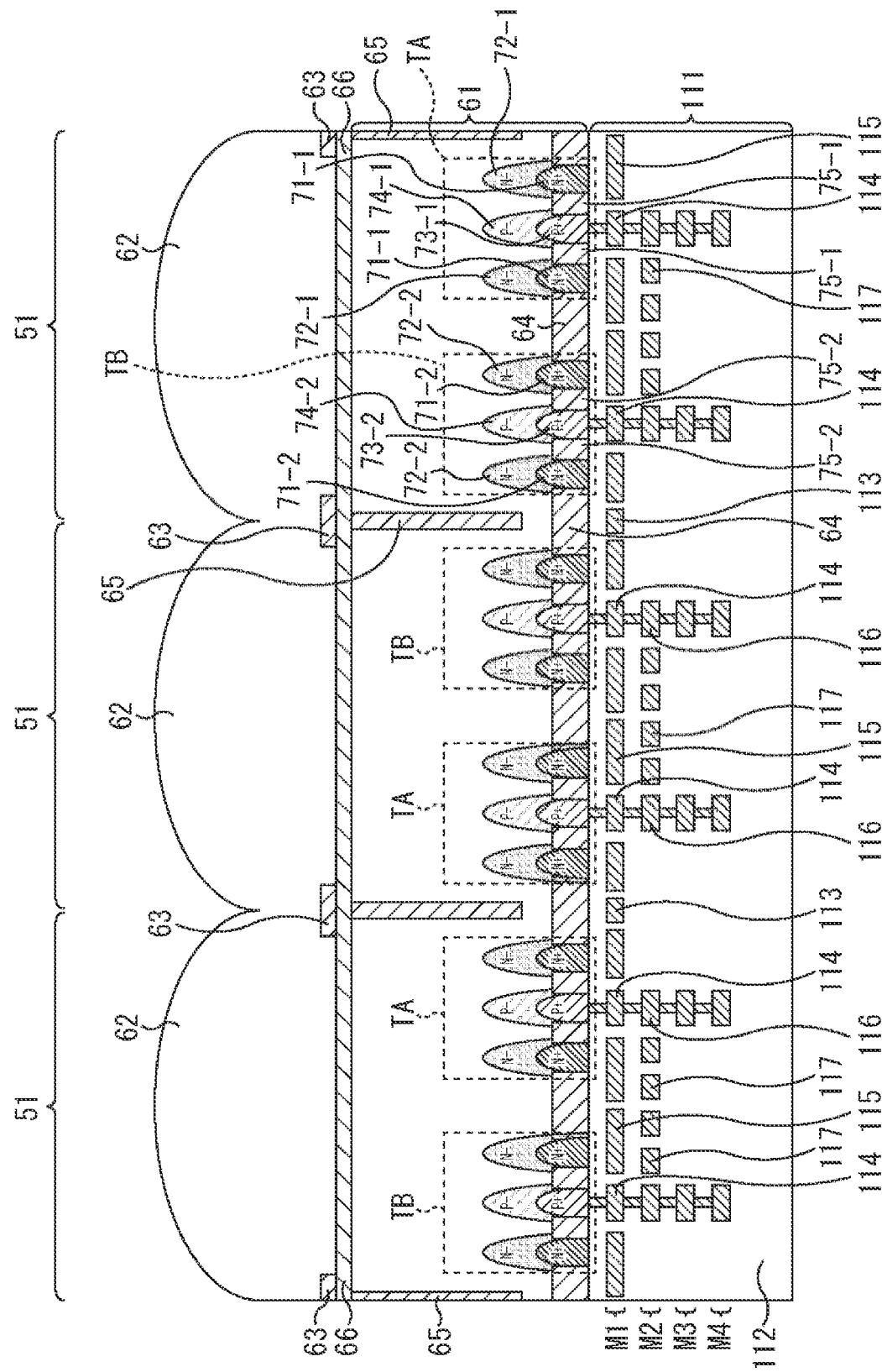
FIG. 5 is a cross-sectional view of multiple pixels.
Figure 6:
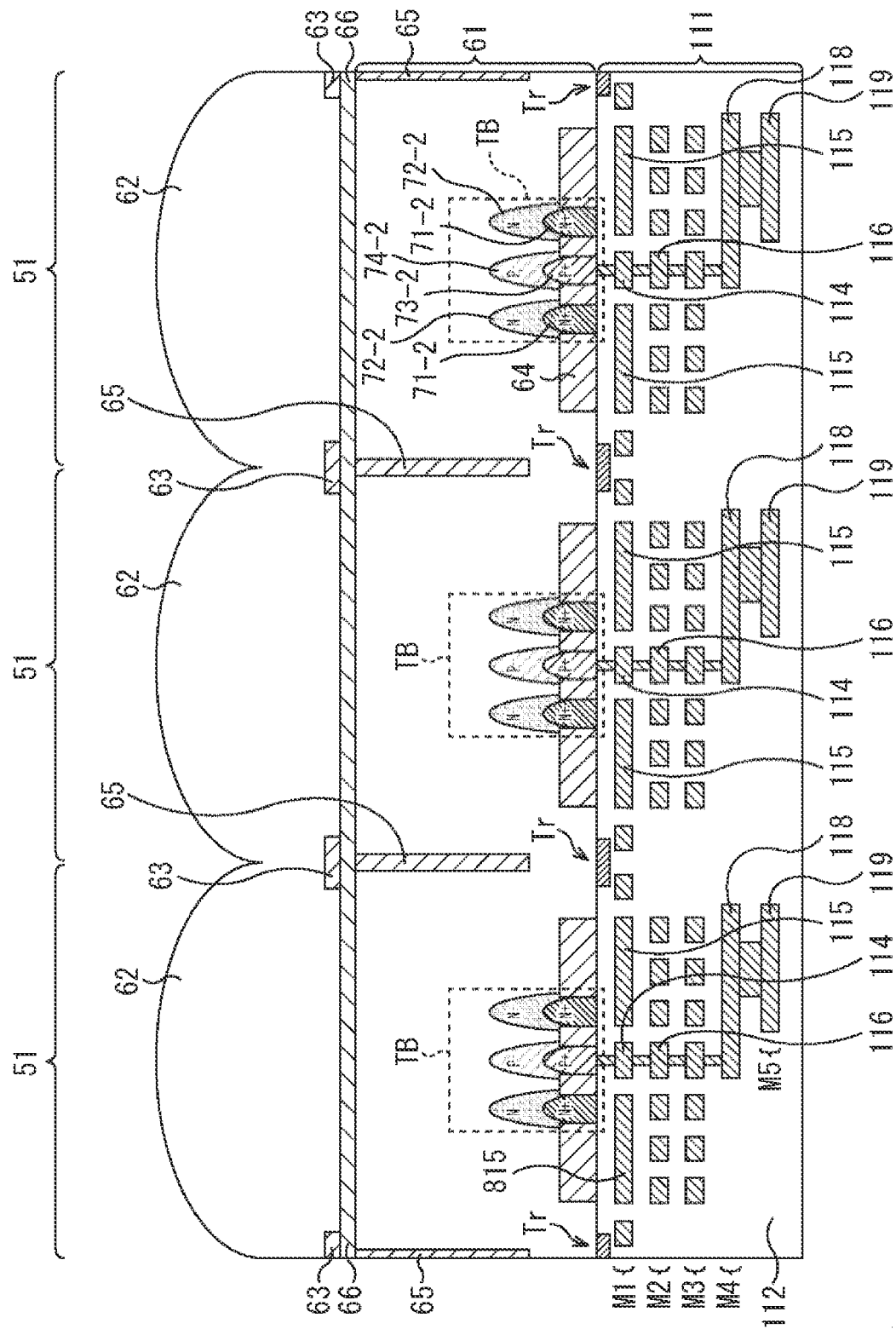
FIG. 6 is a cross-sectional view of multiple pixels.

Hence, FIGS. 5 and 6 illustrate cross-sectional views of multiple adjacent pixels without omitting the multilayer wiring layer.

FIG. 5 is a cross-sectional view taken along line B-B' of FIG. 3, and FIG. 6 is a cross-sectional view taken along line A-A' of FIG. 3.

Note that FIGS. 5 and 6 are cross-sectional views in which multiple pixels 51 including the DTI 65 illustrated in FIG. 4 are arranged. In FIGS. 5 and 6, too, parts corresponding to those in FIGS. 3 and 4 are denoted by the same reference numerals, and description of the parts is omitted.

A multilayer wiring layer 111 is formed on a side opposite to the light incident surface side of the substrate 61 on which the on-chip lens 62 is formed for each pixel. In other words, the substrate 61, which is a semiconductor layer, is disposed between the on-chip lens 62 and the multilayer wiring layer 111. The multilayer wiring layer 111 includes five metal films M1 to M5 and an interlayer insulating film 112 formed between the metal films. Note that in FIG. 5, of the five metal films M1 to M5 of the multilayer wiring layer 111, the outermost metal film M5 is not illustrated because it is in an invisible place. However, the metal film M5 is illustrated in FIG. 6, which is a cross-sectional view from a direction different from the cross-sectional view of FIG. 5.

As illustrated in FIG. 6, a pixel transistor Tr is formed in a pixel boundary region at an interface portion of the multilayer wiring layer 111 with the substrate 61. The pixel transistor Tr is any of a transfer transistor 121, a reset transistor 123, an amplification transistor 124, a selection transistor 125, or the like, which will be described later with reference to FIGS. 12 and 13.

Of the five metal films M1 to M5 of the multilayer wiring layer 111, the metal film M1 closest to the substrate 61 includes a power supply line 113 for supplying a power supply voltage, voltage application wiring 114 for applying a predetermined voltage to the P+ semiconductor region 73-1 or 73-2, and a reflection member 115 that is a member reflecting incident light. In the metal film M1 of FIG. 6, wiring other than the power supply line 113 and the voltage application wiring 114 is the reflection member 115, but the reference numeral is partially omitted for brevity of the drawing. The reflection member 115 is provided for the purpose of reflecting incident light. The reflection member 115 is disposed below the N+ semiconductor regions 71-1 and 71-2 so as to overlap the N+ semiconductor regions 71-1 and 71-2 as charge detection units in plan view. Note that a light shielding member may be provided instead of the reflection member 115.

Figure 12:
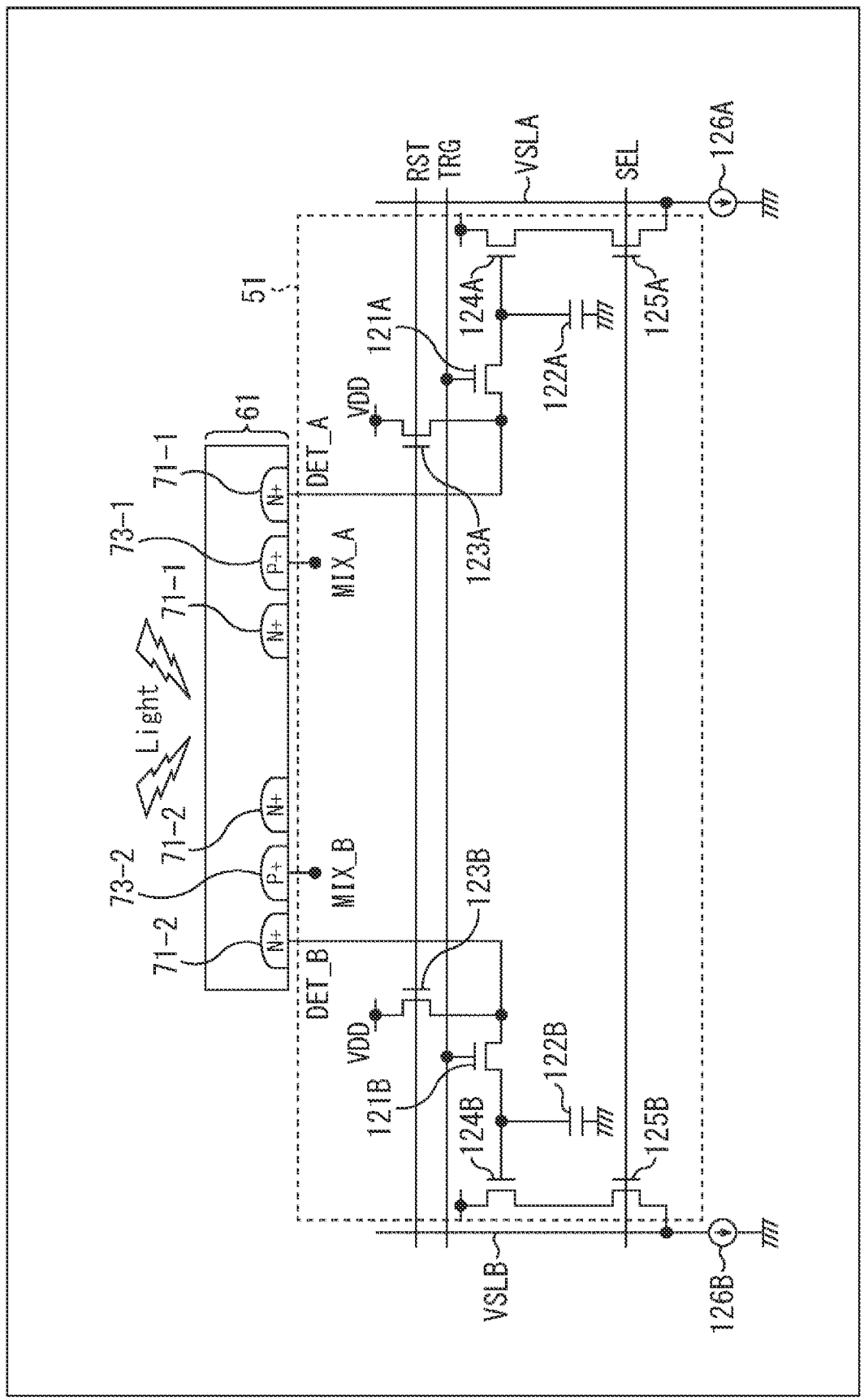
FIG. 12 is a diagram illustrating an equivalent circuit of the pixel.
Figure 13:
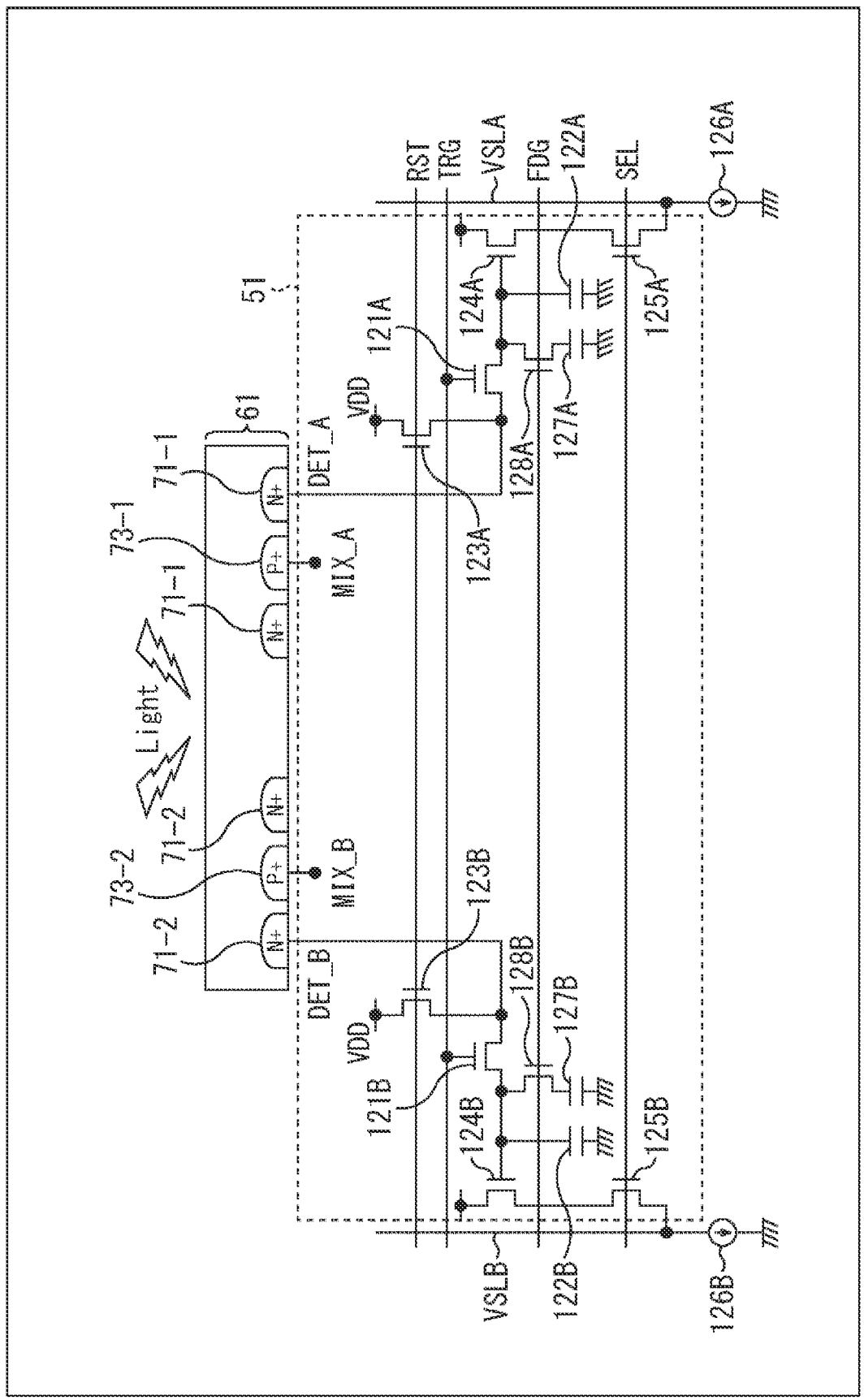
FIG. 13 is a diagram illustrating another equivalent circuit of the pixel.

In the second metal film M2 from the substrate 61 side, for example, voltage application wiring 116 connected to the voltage application wiring 114 of the metal film M1, a control line 117 that transmits a drive signal TRG, a drive signal RST, a selection signal SEL, a drive signal FDG, and the like described later in FIGS. 12 and 13, VSS wiring having a predetermined VSS potential such as GND, and the like are formed. Additionally, in the metal film M2, an FD 122 and an additional capacitor 127 described later with reference to FIGS. 12 and 13 are formed.

In the third metal film M3 from the substrate 61 side, for example, the vertical signal line VSL, the VSS wiring, and the like are formed.

In the fourth and fifth metal films M4 and M5 from the substrate 61 side, for example, voltage supply lines 118 and 119 for applying the predetermined voltage MIX_A or MIX_B to the P+ semiconductor regions 73-1 and 73-2 that are the voltage application units of the taps T are formed.

Note that details of the planar arrangement of the five metal films M1 to M5 of the multilayer wiring layer 111 will be described later with reference to FIGS. 18 to 23.

<4. Other Planar Shape Examples of Tap T>

Other planar shapes of the tap T will be described with reference to FIGS. 7 to 11.

Note that in FIGS. 7 to 11, parts corresponding to those in FIG. 3 are denoted by the same reference numerals, and the description thereof will be omitted as appropriate.

(First Modification of Tap TA)

Figure 7:
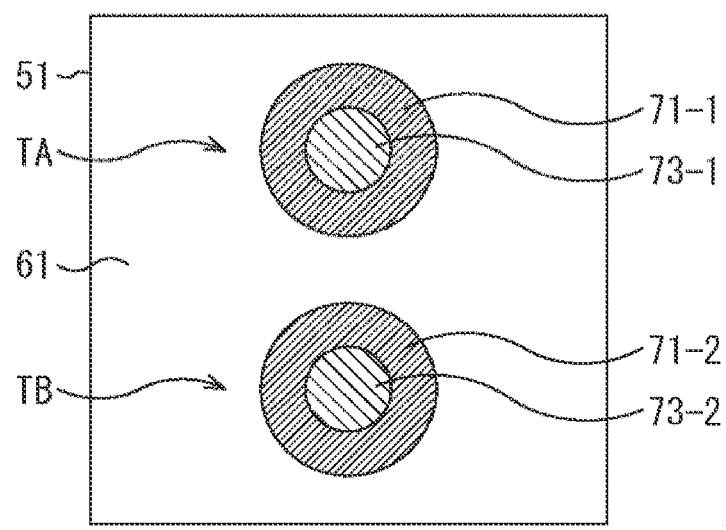
FIG. 7 is a plan view illustrating a first modification of the tap of the pixel.

FIG. 7 is a plan view illustrating a first modification of the first tap TA and the second tap TB in the pixel 51.

In FIG. 3, the planar shape of each tap T of the first tap TA and the second tap TB is rectangular.

In the first modification illustrated in FIG. 7, the planar shape of each tap T of the first tap TA and the second tap TB is circular. More specifically, a circular P+ semiconductor region 73 is formed at the center position of each tap T, and the P+ semiconductor region 73 is surrounded by a circular (annular) N+ semiconductor region 71.

(Second Modification of Tap TA)

Figure 8:
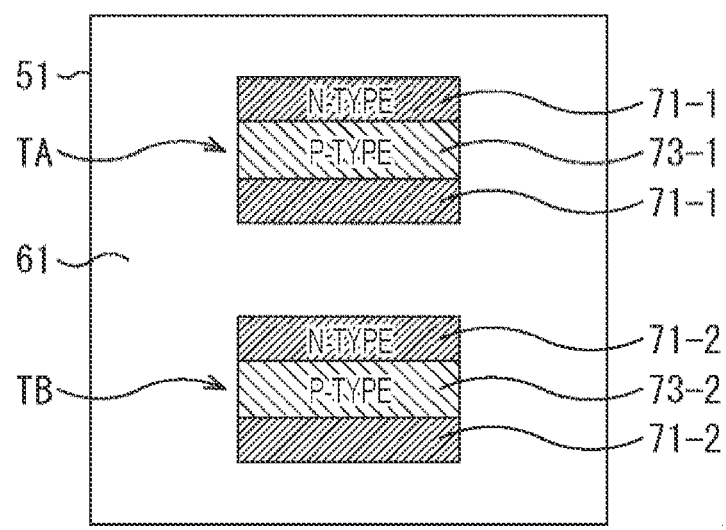
FIG. 8 is a plan view illustrating a second modification of the tap of the pixel.

FIG. 8 is a plan view illustrating a second modification of the first tap TA and the second tap TB in the pixel 51.

In FIG. 3, the N+ semiconductor region 71 of each tap T is formed so as to surround the outer periphery of the P+ semiconductor region 73. However, in the second modification illustrated in FIG. 8, line-shaped N+ semiconductor regions 71 are formed so as to sandwich a line-shaped P+ semiconductor region 73 from directions perpendicular to the longitudinal direction. Accordingly, end surfaces of the short sides of the line-shaped P+ semiconductor region 73 are not surrounded by the N+ semiconductor region 71.

The lateral lengths of the N+ semiconductor region 71 and the P+ semiconductor region 73 having the line shape may be any length, and the regions do not necessarily have to have the same length.

(Third Modification of Tap TA)

Figure 9:
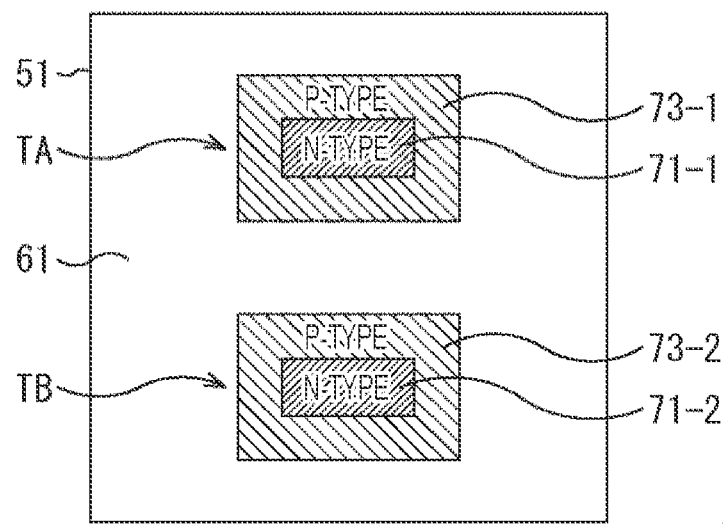
FIG. 9 is a plan view illustrating a third modification of the tap of the pixel.

FIG. 9 is a plan view illustrating a third modification of the first tap TA and the second tap TB in the pixel 51.

In FIG. 3, each tap T has a configuration in which the P+ semiconductor region 73 is surrounded by the N+ semiconductor region 71. In other words, in the tap T, the P+ semiconductor region 73 is formed on the inside, and the N+ semiconductor region 71 is formed on the outside.

The arrangement of the N+ semiconductor region 71 and the P+ semiconductor region 73 may be reversed.

Each tap T in FIG. 9 is configured by reversing the arrangement of the N+ semiconductor region 71 and the P+ semiconductor region 73 of each tap T in FIG. 3.

Specifically, each tap T in FIG. 9 has a configuration in which the rectangular N+ semiconductor region 71 is surrounded by the P+ semiconductor region 73. In other words, the N+ semiconductor region 71 is formed, and the P+ semiconductor region 73 is formed on the outside thereof.

(Fourth Modification of Tap TA)

Figure 10:
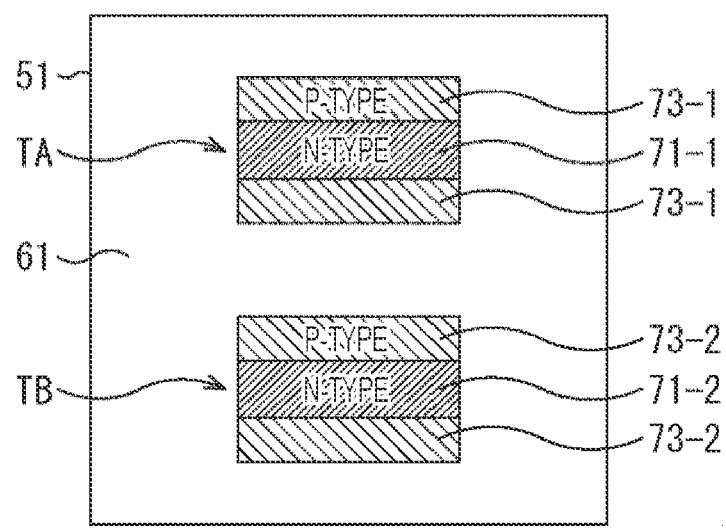
FIG. 10 is a plan view illustrating a fourth modification of the tap of the pixel.

FIG. 10 is a plan view illustrating a fourth modification of the first tap TA and the second tap TB in the pixel 51.

Each tap T in FIG. 10 is configured by reversing the arrangement of the N+ semiconductor region 71 and the P+ semiconductor region 73 of each tap T in FIG. 8.

Specifically, each tap T in FIG. 10 is formed such that the line-shaped P+ semiconductor regions 73 sandwich the line-shaped N+ semiconductor region 71 from directions perpendicular to the longitudinal direction.

The lateral lengths of the N+ semiconductor region 71 and the P+ semiconductor region 73 having the line shape may be any length, and the regions do not necessarily have to have the same length.

(Fifth Modification of Tap TA)

Figure 11:
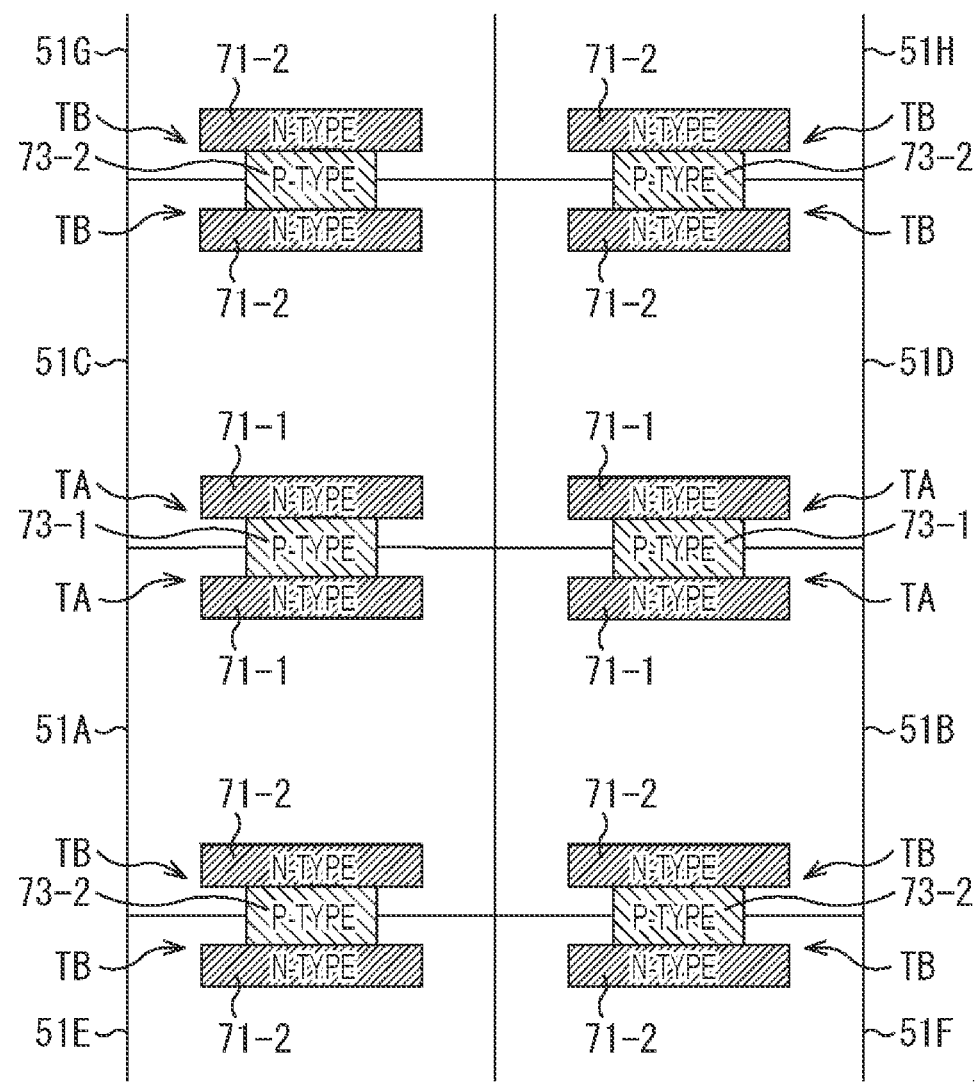
FIG. 11 is a plan view illustrating a fifth modification of the tap of the pixel.

FIG. 11 is a plan view illustrating a fifth modification of the first tap TA and the second tap TB in the pixel 51.

In FIG. 11, six pixels 51 arranged in 2×3 are distinguished as pixels 51A to 51H.

The first tap TA and the second tap TB of each pixel 51 can have a structure in which the P+ semiconductor region 73 as the voltage application unit is shared by adjacent pixels 51. Hereinafter, a structure in which the P+ semiconductor region 73 as the voltage application unit is shared by two taps T of different pixels 51 is also referred to as a shared tap structure.

The fifth modification illustrated in FIG. 11 is a shared tap structure in which the P+ semiconductor region 73 as the voltage application unit of each tap T in FIG. 8 is shared by two vertically adjacent pixels 51.

Specifically, the P+ semiconductor region 73-1 arranged at the pixel boundary between the pixel 51A and the pixel 51C serves as both the P+ semiconductor region 73 that is the voltage application unit of the first tap TA of the pixel 51A and the P+ semiconductor region 73 that is the voltage application unit of the first tap TA of the pixel 51C.

The P+ semiconductor region 73-1 arranged at the pixel boundary between the pixel 51B and the pixel 51D serves as both the P+ semiconductor region 73 that is the voltage application unit of the first tap TA of the pixel 51B and the P+ semiconductor region 73-1 that is the voltage application unit of the first tap TA of the pixel 51D.

The P+ semiconductor region 73-2 arranged at the pixel boundary between the pixel 51A and the pixel 51E serves as both the P+ semiconductor region 73 that is the voltage application unit of the second tap TB of the pixel 51B and the P+ semiconductor region 73 that is the voltage application unit of the second tap TB of the pixel 51E.

The P+ semiconductor region 73-2 arranged at the pixel boundary between the pixel 51B and the pixel 51F serves as both the P+ semiconductor region 73 that is the voltage application unit of the second tap TB of the pixel 51B and the P+ semiconductor region 73 that is the voltage application unit of the second tap TB of the pixel 51F.

Similarly, the P+ semiconductor region 73-2 arranged at the pixel boundary between the pixel 51C and the pixel 51G and the P+ semiconductor region 73-2 arranged at the pixel boundary between the pixel 51D and the pixel 51H also serve as the P+ semiconductor region 73 that is the voltage application unit of the second taps TB of the two vertically adjacent pixels 51.

As described above, in the shared tap structure in which the P+ semiconductor region 73 as the voltage application unit of each tap T is shared between adjacent pixels, too, distance can be measured by the indirect ToF scheme according to the operation described with reference to FIG. 2.

In the shared tap structure as illustrated in FIG. 11, the distance between paired P+ semiconductor regions for generating an electric field, that is, a current, such as the distance between the P+ semiconductor region 73-1 of the first tap TA and the P+ semiconductor region 73-2 of the second tap TB, becomes long. In other words, by sharing the P+ semiconductor region 73 of the voltage application unit of each tap T between adjacent pixels, the distance between the P+ semiconductor regions can be maximized. As a result, the current hardly flows between the P+ semiconductor regions of the two taps T, so that the power consumption of the pixel 51 can be reduced, and it is also advantageous for miniaturization of the pixel.

Note that while the shared tap structure of FIG. 11 is based on the tap structure of FIG. 8, in a case where a shared tap structure is based on the tap structure of FIG. 10, for example, the N+ semiconductor region 71 is shared by adjacent pixels 51.

<5. Equivalent Circuit of Pixel>

FIG. 12 illustrates an equivalent circuit of the pixel 51.

The pixel 51 has a transfer transistor 121A, an FD 122A, a reset transistor 123A, an amplification transistor 124A, and a selection transistor 125A for the first tap TA including the N+ semiconductor region 71-1, the P+ semiconductor region 73-1, and other parts.

Additionally, the pixel 51 has a transfer transistor 121B, an FD 122B, a reset transistor 123B, an amplification transistor 124B, and a selection transistor 125B for the second tap TB including the N+ semiconductor region 71-2, the P+ semiconductor region 73-2, and other parts.

The tap drive unit 21 applies the predetermined voltage MIX_A (first voltage) to the P+ semiconductor region 73-1 and applies the predetermined voltage MIX_B (second voltage) to the P+ semiconductor region 73-2. In the above-described example, one of the voltages MIX_A and MIX_B is 1.5 V, and the other is 0 V. The P+ semiconductor regions 73-1 and 73-2 are voltage application units to which the first voltage or the second voltage is applied.

The N+ semiconductor regions 71-1 and 71-2 are charge detection units that detect and accumulate charge generated by photoelectric conversion of light incident on the substrate 61.

When the drive signal TRG supplied to the gate electrode becomes active, the transfer transistor 121A is brought into conduction in response to this, and thereby transfers the charge accumulated in the N+ semiconductor region 71-1 to the FD 122A. When the drive signal TRG supplied to the gate electrode becomes active, the transfer transistor 121B is brought into conduction in response to this, and thereby transfers the charge accumulated in the N+ semiconductor region 71-2 to the FD 122B.

The FD 122A temporarily holds the charge DET_A supplied from the N+ semiconductor region 71-1. The FD 122B temporarily holds the charge DET_B supplied from the N+ semiconductor region 71-2. The FD 122A corresponds to the FD portion A described with reference to FIG. 2, and the FD 122B corresponds to the FD portion B.

When the drive signal RST supplied to the gate electrode becomes active, the reset transistor 123A is brought into conduction in response to this, and thereby resets the potential of the FD 122A to a predetermined level (power supply voltage VDD). When the drive signal RST supplied to the gate electrode becomes active, the reset transistor 123B is brought into conduction in response to this, and thereby resets the potential of the FD 122B to a predetermined level (power supply voltage VDD). Note that when the reset transistors 123A and 123B are active, the transfer transistors 121A and 121B are also active at the same time.

The amplification transistor 124A has a source electrode connected to a vertical signal line VSLA through the selection transistor 125A, thereby forming a source follower circuit with a load MOS of a constant current source circuit unit 126A connected to one end of the vertical signal line VSLA. The amplification transistor 124B has a source electrode connected to a vertical signal line VSLB through the selection transistor 125B, thereby forming a source follower circuit with the load MOS of a constant current source circuit unit 126B connected to one end of the vertical signal line VSLB.

The selection transistor 125A is connected between the source electrode of the amplification transistor 124A and the vertical signal line VSLA. When the selection signal SEL supplied to the gate electrode becomes active, the selection transistor 125A is brought into conduction in response to this, and outputs the detection signal output from the amplification transistor 124A to the vertical signal line VSLA.

The selection transistor 125B is connected between the source electrode of the amplification transistor 124B and the vertical signal line VSLB. When the selection signal SEL supplied to the gate electrode becomes active, the selection transistor 125B is brought into conduction in response to this, and outputs the detection signal output from the amplification transistor 124B to the vertical signal line VSLB.

The transfer transistors 121A and 121B, the reset transistors 123A and 123B, the amplification transistors 124A and 124B, and the selection transistors 125A and 125B of the pixel 51 are controlled by the vertical drive unit 22, for example.

<Another Equivalent Circuit Configuration Example of Pixel>

FIG. 13 illustrates another equivalent circuit of the pixel 51.

In FIG. 13, parts corresponding to those in FIG. 12 are denoted by the same reference numerals, and the description thereof will be omitted as appropriate.

In the equivalent circuit of FIG. 13, the additional capacitor 127 and a switching transistor 128 for controlling the connection thereof are added to both the first tap TA and the second tap TB in the equivalent circuit of FIG. 12.

Specifically, an additional capacitor 127A is connected between the transfer transistor 121A and the FD 122A through a switching transistor 128A, and an additional capacitor 127B is connected between the transfer transistor 121B and the FD 122B through a switching transistor 128B.

When the drive signal FDG supplied to the gate electrode becomes active, the switching transistor 128A is brought into conduction in response to this, and thereby connects the additional capacitor 127A to the FD 122A. When the drive signal FDG supplied to the gate electrode becomes active, the switching transistor 128B is brought into conduction in response to this, and thereby connects the additional capacitor 127B to the FD 122B.

For example, at high illuminance with a large amount of incident light, the vertical drive unit 22 activates the switching transistors 128A and 128B to connect the FD 122A and the additional capacitor 127A and also connect the FD 122B and the additional capacitor 127B. As a result, a larger amount of charge can be accumulated at high illuminance.

On the other hand, at low illuminance with a small amount of incident light, the vertical drive unit 22 inactivates the switching transistors 128A and 128B, and separates the additional capacitors 127A and 127B from the FDs 122A and 122B, respectively.

Although the additional capacitor 127 may be omitted as in the equivalent circuit of FIG. 12, a high dynamic range can be secured by providing the additional capacitor 127 and selectively using the additional capacitor 127 according to the amount of incident light.

<6. Wiring Example of Vertical Signal Line VSL>

In the light receiving device 1, as described with reference to FIG. 1, the four vertical signal lines VSL are arranged for each pixel column of the pixels 51 arranged in a matrix of the pixel array unit 20.

FIGS. 14 to 17 illustrate wiring examples of the light receiving device 1 in a case where four vertical signal lines VSL are arranged for one pixel column.

(First Wiring Example of Vertical Signal Line VSL)

Figure 14:
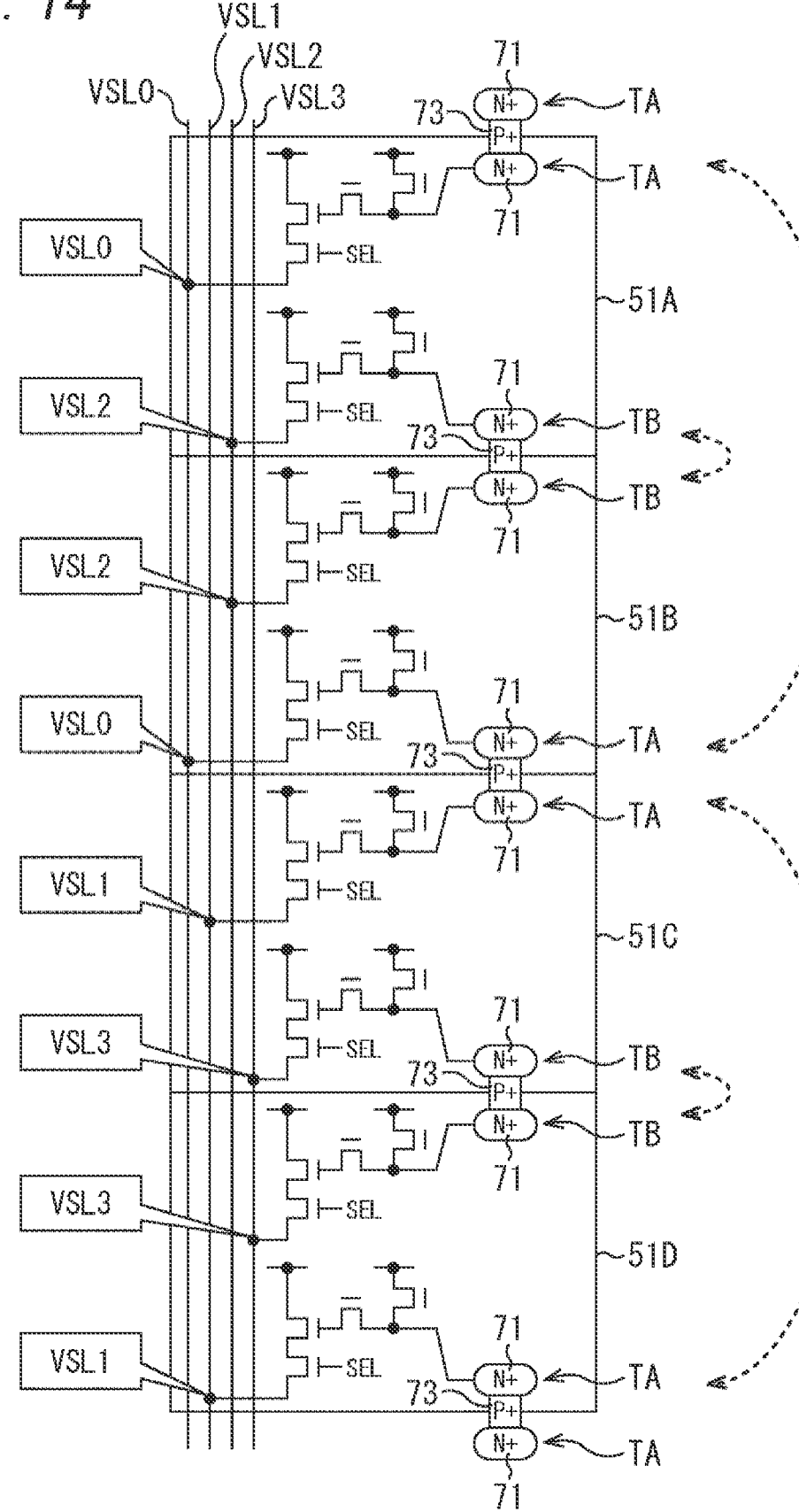
FIG. 14 is a diagram illustrating a first wiring example of vertical signal lines.

FIG. 14 illustrates a first wiring example of the vertical signal line VSL.

Since the pixel circuit of each pixel 51 illustrated in FIG. 14 is the same as the circuit illustrated in FIG. 12, reference numerals are appropriately omitted. Additionally, the shared tap structure illustrated in FIG. 11 is adopted as the configuration of the taps T of the pixels 51 in FIG. 14.

Note that while FIG. 14 illustrates only one pixel column, the same applies to the other pixel columns. Additionally, in FIG. 14, four pixels 51 arranged in one pixel column are distinguished as pixels 51A to 51D, and four vertical signal lines VSL arranged in one pixel column are distinguished as vertical signal lines VSL0 to VSL3.

In the first wiring example of FIG. 14, two vertically adjacent pixels 51 form one pair, the first taps TA of the paired two pixels 51 are connected to the same vertical signal line VSL, and the second taps TB of the paired two pixels 51 are connected to the same vertical signal line VSL.

Specifically, the first taps TA of the pair of the pixel 51A and the pixel 51B are connected to the vertical signal line VSL0, and the second taps TB of the pair of the pixel 51A and the pixel 51B are connected to the vertical signal line VSL2. The first taps TA of the pair of the pixel 51C and the pixel 51D are connected to the vertical signal line VSL1, and the second taps TB of the pair of the pixel 51C and the pixel 51D are connected to the vertical signal line VSL3.

As a result, the vertical signal line VSL0 outputs the detection signal of the first taps TA of the pair of the pixel 51A and the pixel 51B to the column processing unit 23, and the vertical signal line VSL1 outputs the detection signal of the first taps TA of the pair of the pixel 51C and the pixel 51D to the column processing unit 23. The vertical signal line VSL2 outputs the detection signal of the second taps TB of the pair of the pixel 51A and the pixel 51B to the column processing unit 23, and the vertical signal line VSL3 outputs the detection signal of the second taps TB of the pair of the pixel 51C and the pixel 51D to the column processing unit 23. Accordingly, the four vertical signal lines VSL0 to VSL3 are arranged such that the two vertical signal lines (vertical signal lines VSL0, VSL1) transmitting the detection signal of the first taps TA are adjacent to each other, and the two vertical signal lines (vertical signal lines VSL2, VSL3) transmitting the detection signal of the second taps TB are adjacent to each other (TA, TA, TB, TB).

By arranging the four vertical signal lines VSL0 to VSL3 for one pixel column, in a first drive mode in which the detection signal of each pixel 51 is output in units of one pixel, the light receiving device 1 can output the detection signal to the outside of the pixel array unit 20 (column processing unit 23) in units of two rows of odd rows or even rows. Accordingly, the reading speed can be increased.

On the other hand, in a second drive mode in which the detection signals of two taps T are added up and output, the light receiving device 1 can add up the detection signals of the first taps TA or the second taps TB of the pair of two pixels and output the detection signals to the outside of the pixel array unit 20 in units of four rows. In order to improve resolution, even in a case where the number of pixels increases and the signal amount per pixel is small, a sufficient S/N ratio can be secured by adding up the detection signals of two pixels.

(Second Wiring Example of Vertical Signal Line VSL)

Figure 15:
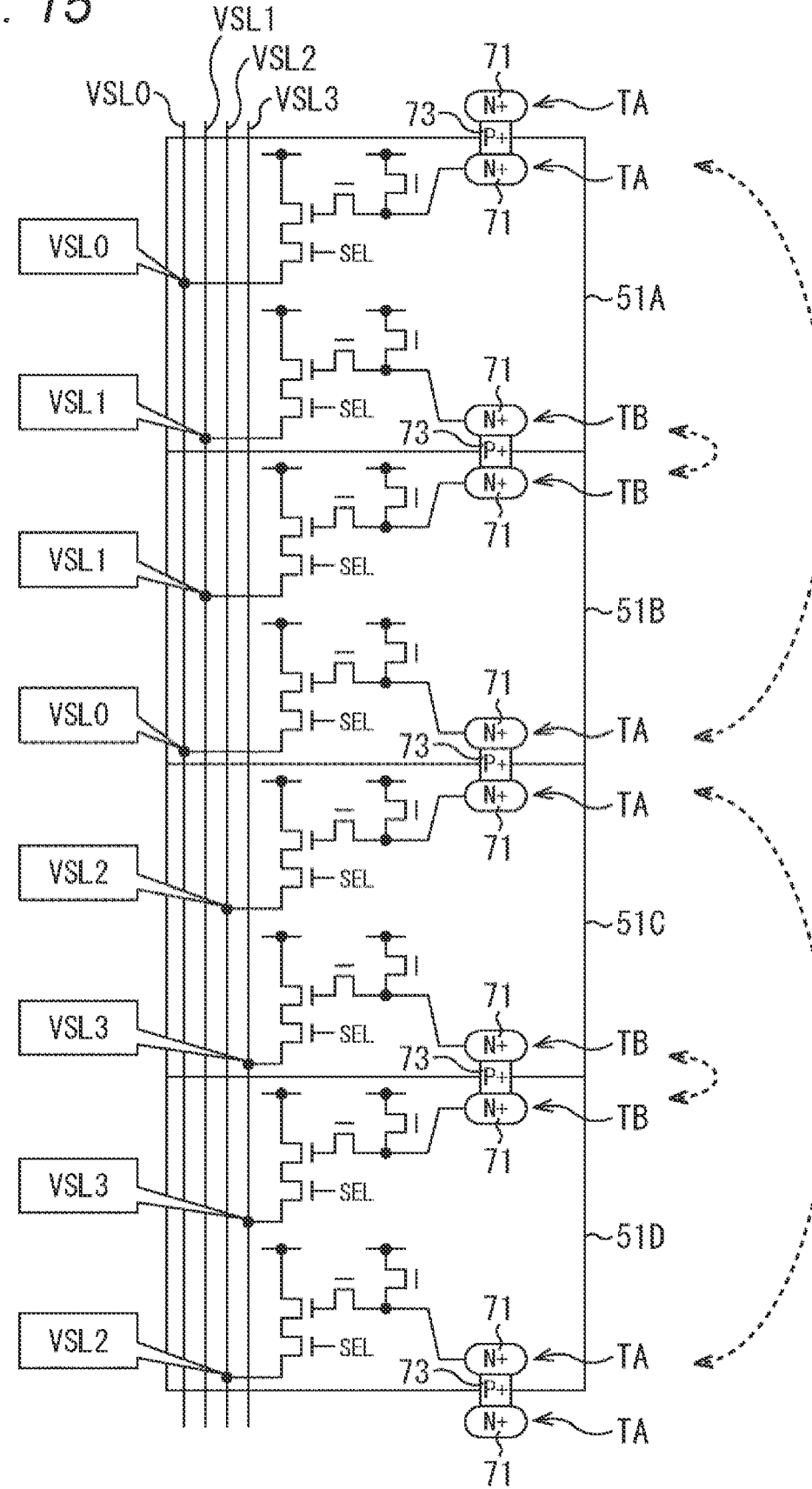
FIG. 15 is a diagram illustrating a second wiring example of the vertical signal lines.

FIG. 15 illustrates a second wiring example of the vertical signal line VSL.

In FIG. 15, description of points similar to those of the first wiring example illustrated in FIG. 14 will be appropriately omitted, and points different from the first wiring example will be described.

The second wiring example of FIG. 15 is common to the first wiring example in that the first taps TA of the paired two pixels 51 are connected to the same vertical signal line VSL, and the second taps TB of the paired two pixels 51 are connected to the same vertical signal line VSL.

Note, however, that although the point that the first taps TA are connected to the vertical signal line VSL0 in the paired two pixels 51A and 51B is the same as in the first wiring example illustrated in FIG. 14, the second taps TB are connected to the vertical signal line VSL1 instead of the vertical signal line VSL2.

As for the paired two pixels 51C and 51D, although the point that the paired two second taps TB are connected to vertical signal line VSL3 is the same as in the first wiring example, the first taps TA are connected to the vertical signal line VSL2 instead of the vertical signal line VSL1.

As a result, in the second wiring example, the vertical signal line VSL0 outputs the detection signal of the first taps TA of the pair of the pixel 51A and the pixel 51B, and the vertical signal line VSL1 outputs the detection signal of the second taps TB of the pair of the pixel 51A and the pixel 51B to the column processing unit 23. The vertical signal line VSL2 outputs a detection signal of the first taps TA of the pair of the pixel 51C and the pixel 51D, and the vertical signal line VSL3 outputs a detection signal of the second taps TB of the pair of the pixel 51C and the pixel 51D. Accordingly, the four vertical signal lines VSL0 to VSL3 are arranged such that the vertical signal line VSL for transmitting the detection signal of the first taps TA and the vertical signal line VSL for transmitting the detection signal of the second taps TB are alternately arranged (TA, TB, TA, TB).

The driving of the first drive mode and the second drive mode in the second wiring example is similar to that in the first wiring example. Accordingly, in the first drive mode, the reading speed can be increased. In the second drive mode, even in a case where the signal amount per pixel is small, a sufficient S/N ratio can be secured by adding up the detection signals of two pixels.

In the first wiring example of FIG. 14 and the second wiring example of FIG. 15, in the second drive mode in which the detection signals of the two taps T are added up and output, the two taps T for adding up the detection signals are closed within the two pixels forming the pair. As a result, it is possible to reduce the operation deviation between the first taps TA or the second taps TB between the pair of two vertically adjacent pixels, and to reduce the distortion of the high-speed operation.

Moreover, in the second wiring example of FIG. 15, since the vertical signal line VSL for transmitting the detection signal of the first taps TA and the vertical signal line VSL for transmitting the detection signal of the second taps TB are alternately arranged (TA, TB, TA, TB), the coupling capacitance between the adjacent vertical signal lines VSL can be made uniform, and noise can be reduced.

(Third Wiring Example of Vertical Signal Line VSL)

Figure 16:
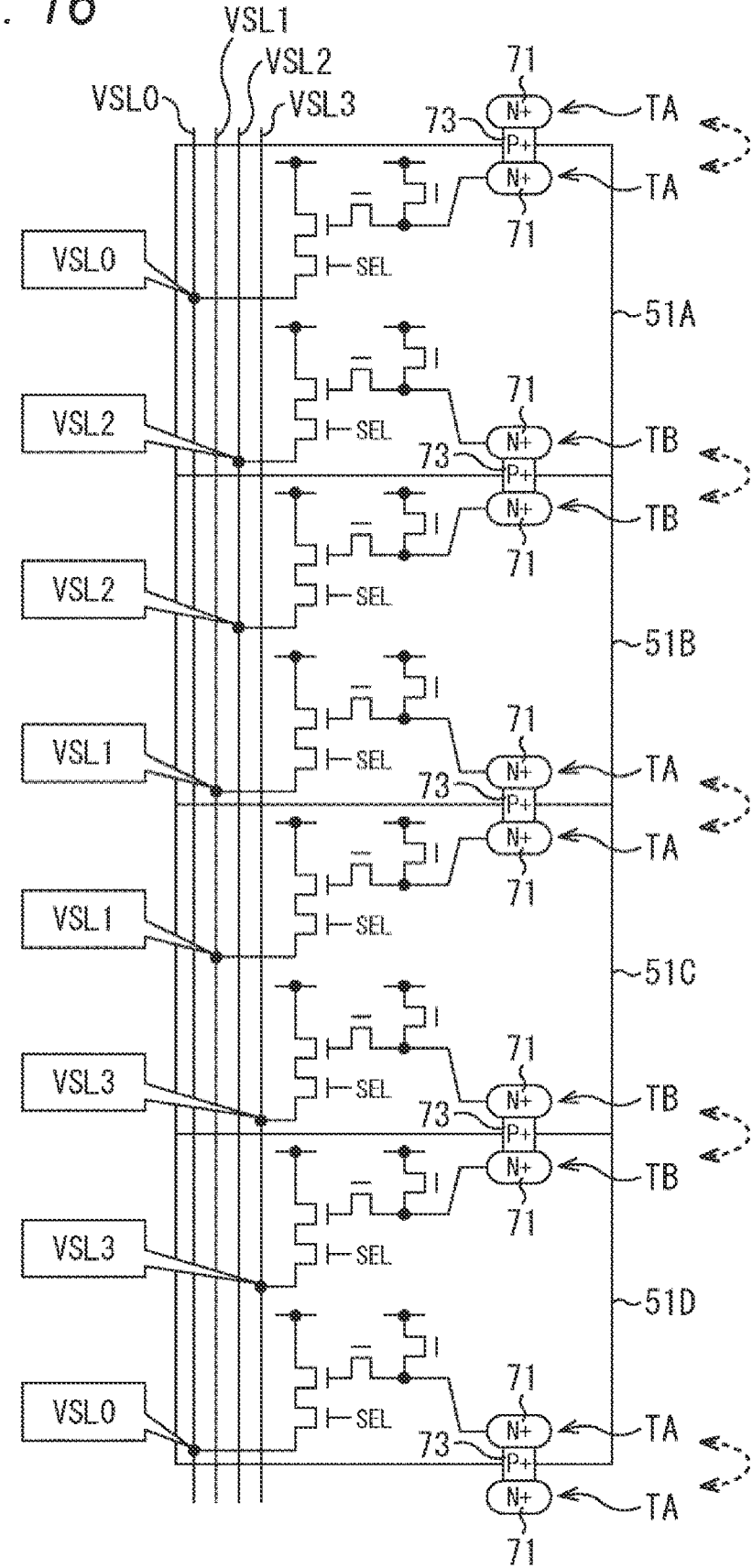
FIG. 16 is a diagram illustrating a third wiring example of the vertical signal lines.

FIG. 16 illustrates a third wiring example of the vertical signal line VSL.

In FIG. 16, description of points similar to those of the first wiring example illustrated in FIG. 14 will be appropriately omitted, and points different from the first wiring example will be described.

In the third wiring example of FIG. 16, in the second drive mode in which the two detection signals are added up and output, in both the first taps TA and the second taps TB, the two taps T for adding up the detection signals share the P+ semiconductor region 73 as the voltage application unit.

For example, since the two second taps TB arranged at the pixel boundary between the pixel 51A and the pixel 51B are both connected to the vertical signal line VSL2, the two second taps TB are the two taps T for adding up and outputting the detection signals in the second drive mode, and share the P+ semiconductor region 73 arranged at the pixel boundary between the pixel 51A and the pixel 51B.

Since the two first taps TA arranged at the pixel boundary between the pixel 51B and the pixel 51C are both connected to the vertical signal line VSL1, the two first taps TA are the two taps T for adding up and outputting the detection signals in the second drive mode, and share the P+ semiconductor region 73 arranged at the pixel boundary between the pixel 51B and the pixel 51C.

Since the two second taps TB arranged at the pixel boundary between the pixel 51C and the pixel 51D are both connected to the vertical signal line VSL3, the two second taps TB are the two taps T for adding up and outputting the detection signals in the second drive mode, and share the P+ semiconductor region 73 arranged at the pixel boundary between the pixel 51C and the pixel 51D.

On the other hand, in the first wiring example illustrated in FIG. 14, in the second drive mode, the second taps TB share the P+ semiconductor region 73 as the voltage application unit as in the case of the third wiring example, but the two taps T for adding up the detection signals of the first taps TA do not share the P+ semiconductor region 73 as the voltage application unit.

For example, in the pair of the pixel 51A and the pixel 51B in FIG. 14, regarding the second tap TB, the second tap TB of the pixel 51A and the second tap TB of the pixel 51B for adding up the detection signals share the P+ semiconductor region 73 arranged at the pixel boundary between the pixel 51A and the pixel 51B, but regarding the first tap TA, the first tap TA of the pixel 51A and the first tap TA of the pixel 51B for adding up the detection signals do not share the P+ semiconductor region 73. In other words, the P+ semiconductor region 73 of the first tap TA of the pixel 51A and the P+ semiconductor region 73 of the first tap TA of the pixel 51B are different P+ semiconductor regions 73.

Additionally, in the third wiring example of FIG. 16, the two first taps TA having the shared tap structure arranged at the pixel boundary between the pixel 51A and the pixel 51 (not illustrated) above the pixel 51A are both connected to the vertical signal line VSL0. The two second taps TB having the shared tap structure arranged at the pixel boundary between the pixel 51A and the pixel 51B are both connected to the vertical signal line VSL2. The two first taps TA having the shared tap structure arranged at the pixel boundary between the pixel 51B and the pixel 51C are both connected to the vertical signal line VSL1. The two second taps TB having the shared tap structure arranged at the pixel boundary between the pixel 51C and the pixel 51D are both connected to the vertical signal line VSL3. As a result, the four vertical signal lines VSL0 to VSL3 are arranged such that the two vertical signal lines (vertical signal lines VSL0, VSL1) transmitting the detection signal of the first taps TA are adjacent to each other, and the two vertical signal lines (vertical signal lines VSL2, VSL3) transmitting the detection signal of the second taps TB are adjacent to each other (TA, TA, TB, TB).

In the first drive mode in which the detection signal of each pixel 51 is output in units of one pixel, the light receiving device 1 outputs the detection signal to the outside of the pixel array unit 20 (column processing unit 23) in units of two rows of odd rows or even rows. Accordingly, the reading speed can be increased.

On the other hand, in the second drive mode in which the detection signals of the two taps T are added up and output, the light receiving device 1 adds up the detection signals of the two first taps TA or second taps TB corresponding to two pixels, and outputs the detection signals to the outside of the pixel array unit 20 in units corresponding to four rows. Even in a case where the signal amount per pixel is small, a sufficient S/N ratio can be secured.

According to the third wiring example, in the second drive mode, since the P+ semiconductor region 73 which is the voltage application unit of the two taps T for adding up and outputting the detection signals is shared, it is possible to curb variations in the applied voltages applied to the two taps T for adding up and outputting the detection signals.
(Fourth Wiring Example of Vertical Signal Line VSL)

Figure 17:
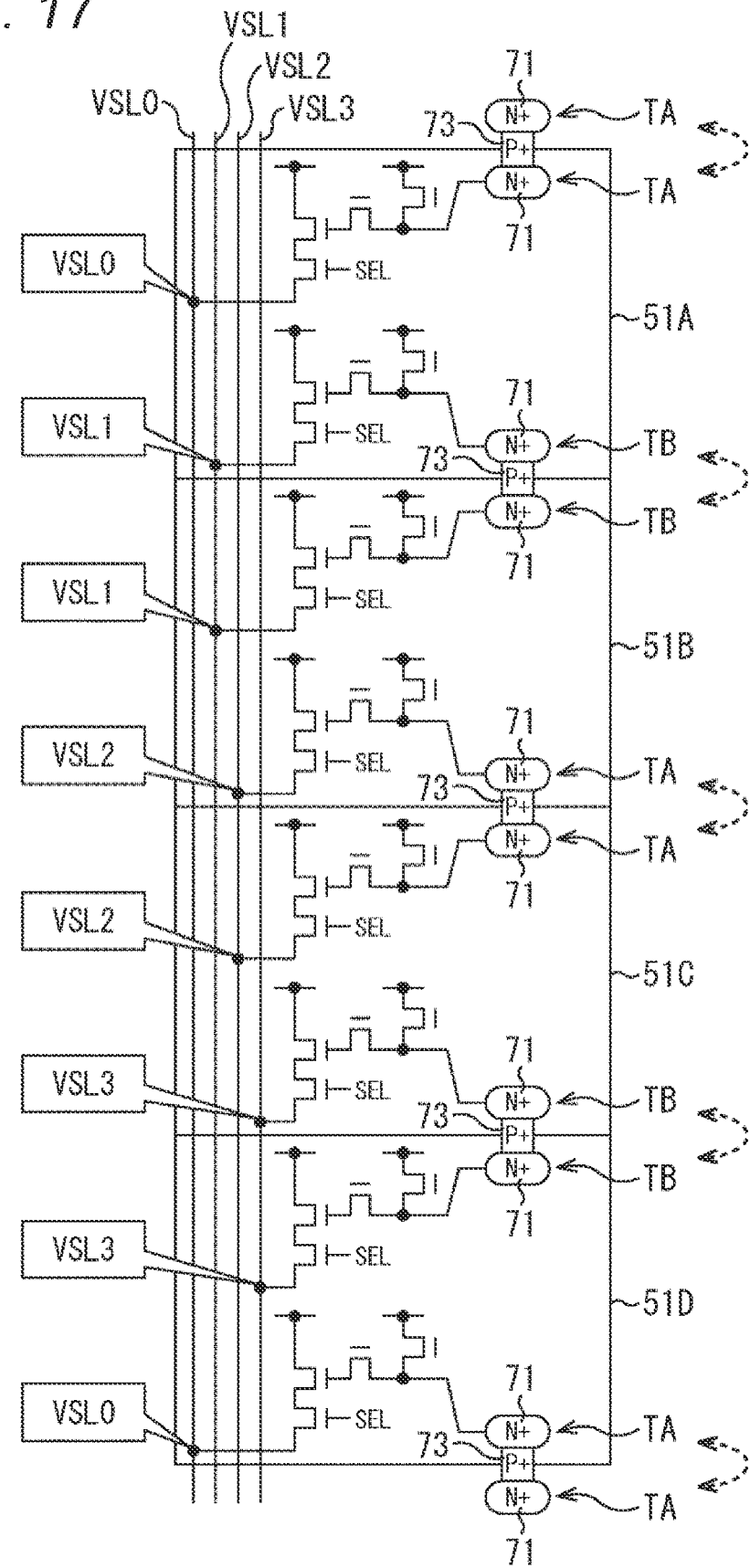
FIG. 17 is a diagram illustrating a fourth wiring example of the vertical signal lines.

FIG. 17 illustrates a fourth wiring example of the vertical signal line VSL.

In FIG. 17, description of points similar to those of the first to third wiring examples described above will be appropriately omitted, and points different from the first to third wiring examples will be described.

The fourth wiring example of FIG. 17 is a configuration in which, in the second wiring example illustrated in FIG. 15, in the second drive mode in which the two detection signals are added up and output, the two taps T for adding up the detection signals share the P+ semiconductor region 73 as the voltage application unit.

In other words, the fourth wiring example in FIG. 17 is common to the third wiring example in FIG. 16 in that in the second drive mode in which the two detection signals are added up and output, in both the first taps TA and the second taps TB, the two taps T for adding up the detection signals share the P+ semiconductor region 73 as the voltage application unit.

On the other hand, in the third wiring example of FIG. 16, the two second taps TB arranged at the pixel boundary between the pixel 51A and the pixel 51B are connected to the vertical signal line VSL2, but in the fourth wiring example of FIG. 17, the two second taps TB are connected to the vertical signal line VSL1. Additionally, in the third wiring example, the two first taps TA arranged at the pixel boundary between the pixel 51B and the pixel 51C are connected to the vertical signal line VSL1, but in the fourth wiring example of FIG. 17, the two first taps TA are connected to the vertical signal line VSL2. As a result, the four vertical signal lines VSL0 to VSL3 are arranged such that the vertical signal line VSL for transmitting the detection signal of the first taps TA and the vertical signal line VSL for transmitting the detection signal of the second taps TB are alternately arranged (TA, TB, TA, TB) as in the case of the second wiring example illustrated in FIG. 15.

In the first drive mode in which the detection signal of each pixel 51 is output in units of one pixel, the light receiving device 1 outputs the detection signal to the outside of the pixel array unit 20 (column processing unit 23) in units of two rows of odd rows or even rows. Accordingly, the reading speed can be increased.

On the other hand, in the second drive mode in which the detection signals of the two taps T are added up and output, the light receiving device 1 adds up the detection signals of the two first taps TA or second taps TB corresponding to two pixels, and outputs the detection signals to the outside of the pixel array unit 20 in units corresponding to four rows. Even in a case where the signal amount per pixel is small, a sufficient S/N ratio can be secured.

According to the fourth wiring example, in the second drive mode, since the P+ semiconductor region 73 which is the voltage application unit of the two taps T for adding up and outputting the detection signals is shared, it is possible to curb variations in the applied voltages applied to the two taps T for adding up and outputting the detection signals.

According to the first to fourth wiring examples in which four vertical signal lines VSL are arranged for one pixel column, it is possible to selectively use a drive mode (first drive mode) in which the resolution is improved with the signal output as a pixel unit and a drive mode (second drive mode) in which the S/N ratio of the signal is improved rather than the resolution, depending on the application or the like. In other words, it is possible to achieve an increase in the number of pixels while also curbing a decrease in distance measurement accuracy due to the increase in the number of pixels.

<7. Planar Arrangement Example of Five Metal Films M1 to M5>

Next, a detailed configuration of the multilayer wiring layer 111 formed on the side opposite to the light incident surface side of the substrate 61 will be described with reference to FIGS. 18 to 23.

Note that the configuration illustrated in FIGS. 18 to 23 corresponds to the configuration described in FIGS. 5 and 6, but will be described as a different configuration with different reference numerals.

Figure 18:
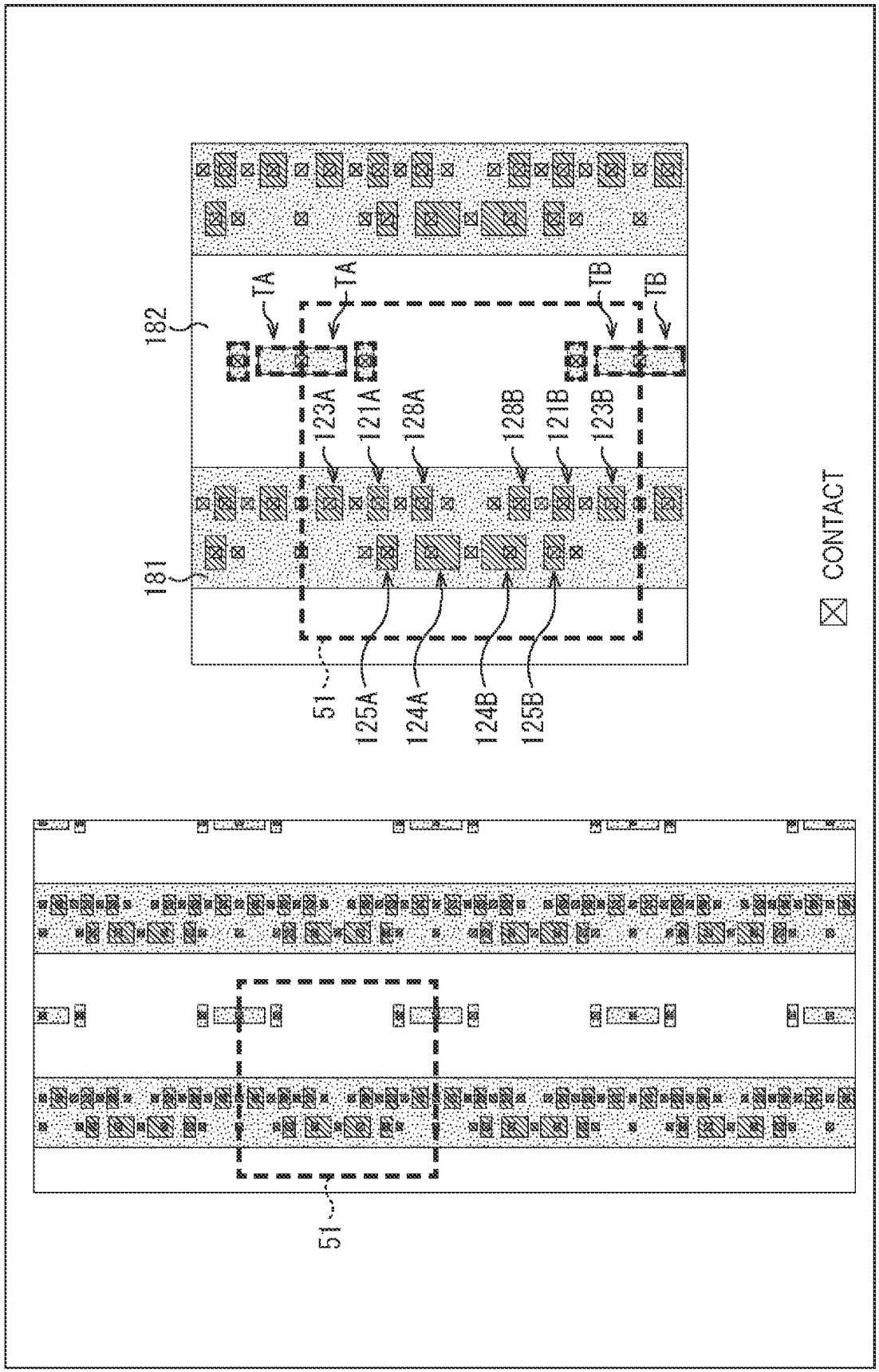
FIG. 18 is a plan view of a gate formation surface between a multilayer wiring layer and a substrate.

FIG. 18 is a plan view of a gate formation surface which is an interface between the substrate 61 and the multilayer wiring layer 111 and on which gate electrodes and contacts of the pixel transistors Tr are formed.

The left plan view of FIG. 18 is a plan view including a region of multiple pixels arranged in the vertical direction of the pixel array unit 20, and a region of one predetermined pixel 51 is indicated by a broken line. The right plan view of FIG. 18 is an enlarged view of a region near the pixel 51 indicated by a broken line in the left plan view. In the enlarged view, the region of the first tap TA and the second tap TB is indicated by a broken line.

The gate formation surface of the substrate 61 includes an active region 181 in which the gate electrodes of the pixel transistors Tr, contacts with the P+ semiconductor region 73 as the voltage application unit, contacts with the N+ semiconductor region 71 as the charge detection unit, and the like are formed, and an oxide film region 182 that is the rest of the gate formation surface. The oxide film region 182 corresponds to, for example, the oxide film 64, the separation portion 75, and the like in FIG. 2. Note that in FIGS. 19 to 23, the active region 181 is superimposed as a lower layer with reference signs omitted for a better understanding of the positional relationship.

In the region of one pixel 51, the first tap TA including the N+ semiconductor region 71-1, the P+ semiconductor region 73-1, and other parts and the second tap TB including the N+ semiconductor region 71-2, the P+ semiconductor region 73-2, and other parts are arranged at pixel boundaries so as to be symmetric with respect to a pixel middle line (not illustrated) in the vertical direction of the pixel 51.

The transfer transistor 121A, the reset transistor 123A, the amplification transistor 124A, the selection transistor 125A, and the switching transistor 128A which are the pixel transistors Tr that control the first tap TA, and the transfer transistor 121B, the reset transistor 123B, the amplification transistor 124B, the selection transistor 125B, and the switching transistor 128B which are the pixel transistors Tr that control the second tap TB are arranged so as to be symmetric with respect to the pixel middle line in the vertical direction of the pixel 51.

By arranging the multiple pixel transistors Tr for controlling the first tap TA or the second tap TB in two columns in the active region 181, each pixel transistor Tr can be arranged with a margin. In particular, since the gate electrode of the amplification transistor 124 can be formed with the largest size, noise characteristics of the amplification transistor 124 can be curbed.

Figure 19:
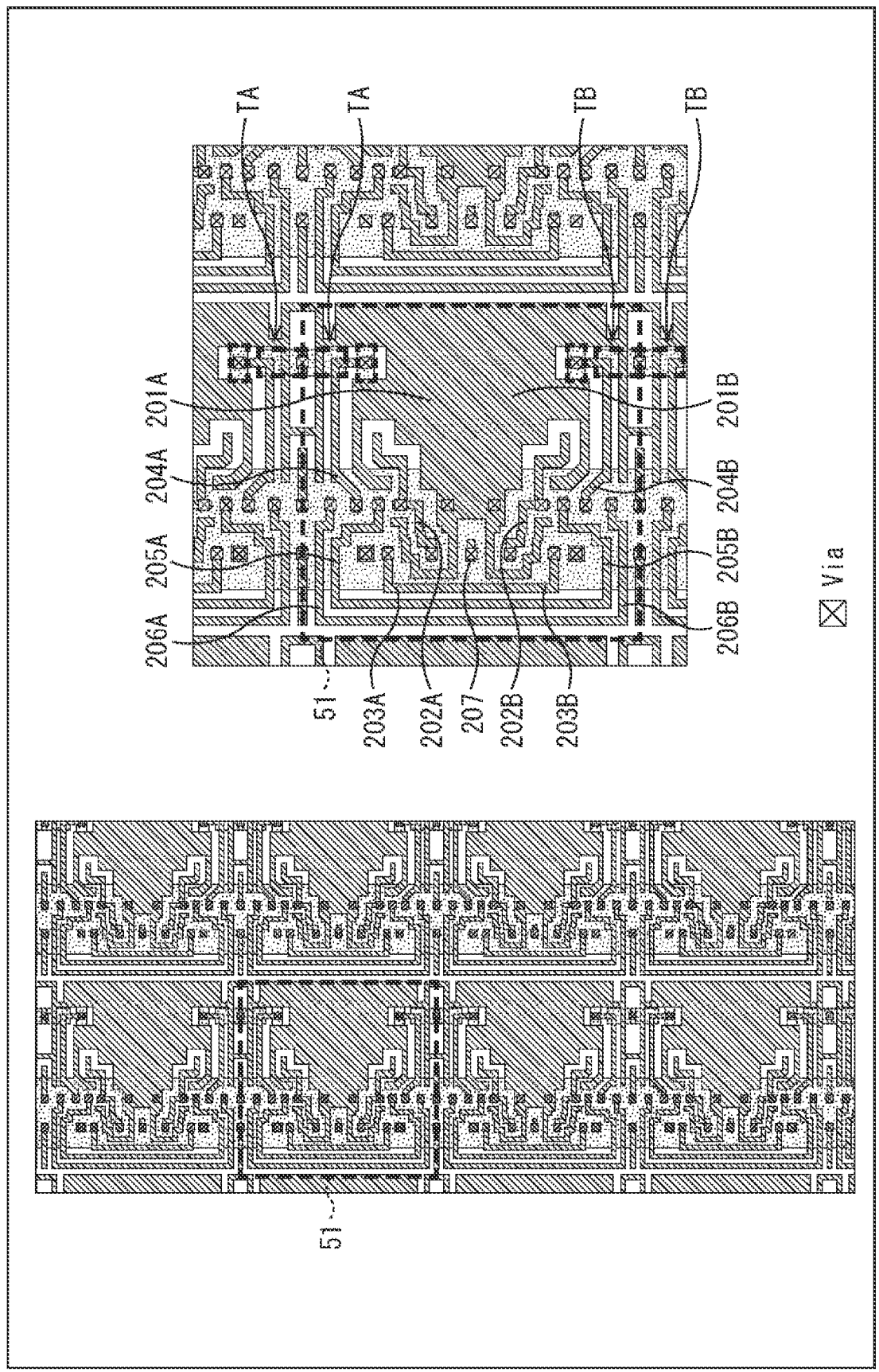
FIG. 19 is a diagram illustrating a planar arrangement example of a metal film M1 which is a first layer of the multilayer wiring layer.

FIG. 19 illustrates a planar arrangement example of the metal film M1 which is the first layer closest to the substrate 61 among the five metal films M1 to M5 of the multilayer wiring layer 111.

The relationship between the left plan view and the right plan view of FIG. 19 is similar to that of FIG. 18.

In the metal film M1 which is the first layer of the multilayer wiring layer 111, metal films 201A and 201B as the reflection members 115 (FIG. 5) that reflect infrared light are formed between the first tap TA and the second tap TB of the pixel 51. Although the boundary between the metal films 201A and 201B is not illustrated, the metal films 201A and 201B are formed symmetrically with respect to the vertical direction of the pixel 51 in the region of the pixel 51. As illustrated in FIG. 19, in the region of the pixel 51, the regions of the metal films 201A and 201B are formed to be the largest. By causing the infrared light passing through the substrate 61 and incident on the multilayer wiring layer 111 to be reflected back to the substrate 61, the amount of infrared light to be photoelectrically converted in the substrate 61 can be increased, and sensitivity is improved.

Note that the potentials of the metal films 201A and 201B are predetermined VSS potentials, and are, for example, GND in the present embodiment.

Figure 20:
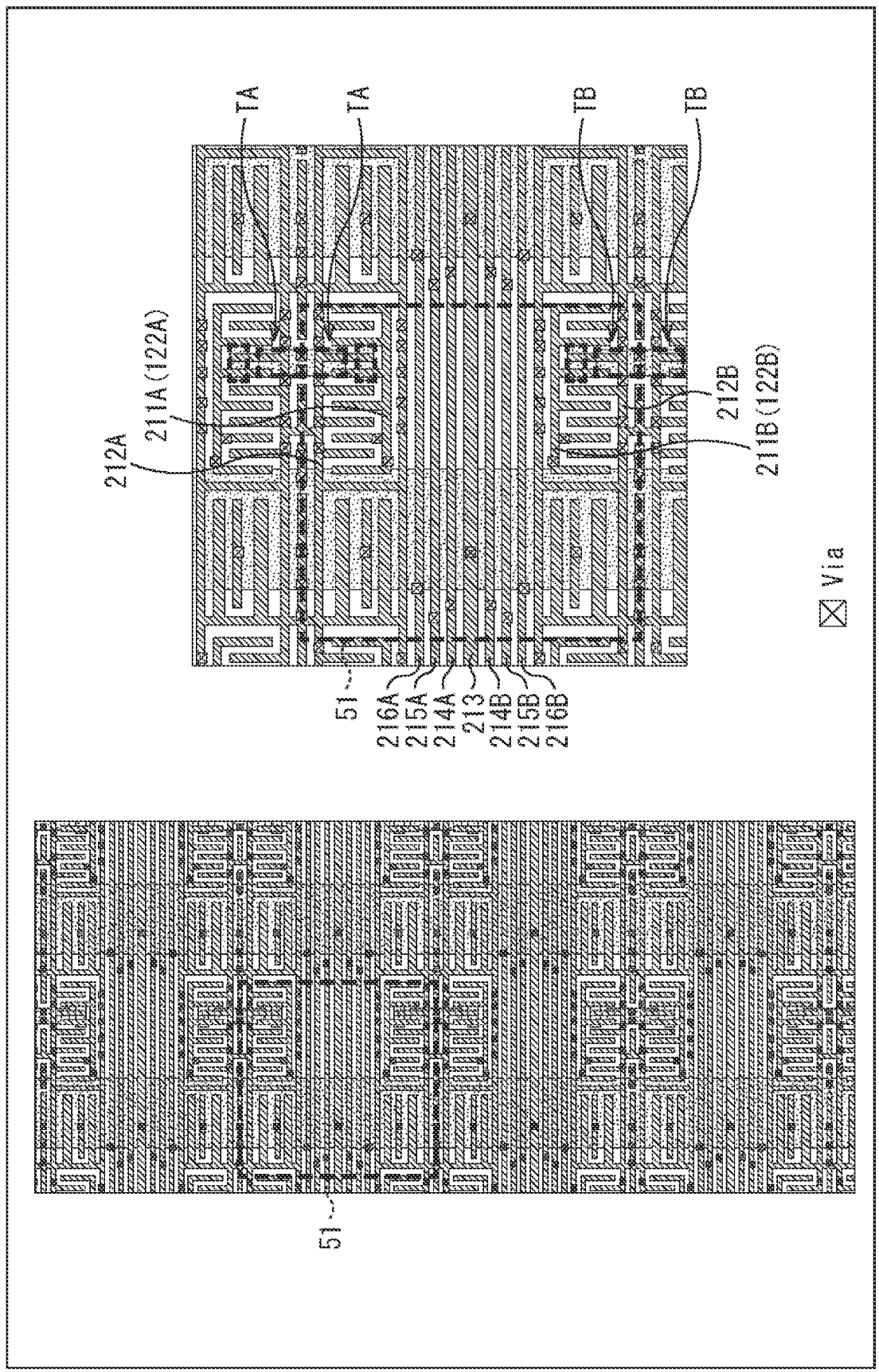
FIG. 20 is a diagram illustrating a planar arrangement example of a metal film M2 which is a second layer of the multilayer wiring layer.

A metal film 202A is wiring that connects the gate electrode of the amplification transistor 124A and the FD 122A (FIG. 20). A metal film 202B is wiring that connects the gate electrode of the amplification transistor 124B and the FD 122B (FIG. 20). The metal film 202A and the metal film 202B are also arranged so as to be symmetric with respect to the pixel middle line in the vertical direction of the pixel 51.

Metal films 203A and 203B are wirings connected to the selection transistors 125A and 125B. A metal film 204A is wiring connected to the N+ semiconductor region 71-1 which is the charge detection unit of the first tap TA of the pixel 51, and a metal film 204B is wiring connected to the N+ semiconductor region 71-2 which is the charge detection unit of the second tap TB of the pixel 51.

Metal films 205A and 205B are wirings connected to the transfer transistors 121A and 121B. Metal films 206A and 206B are wirings connected to the reset transistors 123A and 123B.

The metal films 203A to 206A related to the first tap TA and the metal films 203B to 206B related to the second tap TB are arranged so as to be symmetric with respect to the pixel middle line in the vertical direction of the pixel 51. The power supply voltage VDD is supplied to a contact 207 located at a pixel middle portion in the vertical direction of the pixel 51.

The metal film 201A as shield wiring is disposed between the metal film 202A connecting the gate electrode of the amplification transistor 124A and the FD 122A (FIG. 20) and the contact 207 to which the power supply voltage VDD is supplied. As a result, the influence amount of the potential of the FD 122A on the potential fluctuation of the power supply voltage VDD is reduced, and noise is curbed.

The metal film 201A as shield wiring is similarly disposed between the metal film 202A connecting the gate electrode of the amplification transistor 124A and the FD 122A (FIG. 20) and the metal film 203A as the wiring connected to the selection transistor 125A. As a result, the influence amount of the potential of the FD 122A on the potential fluctuation of the selection transistor 125A is reduced, and noise is curbed.

The metal film 201A as shield wiring is similarly arranged between the metal film 202A that connects the gate electrode of the amplification transistor 124A and the FD 122A (FIG. 20) and the metal film 204A that is the wiring connected to the N+ semiconductor region 71-1 that is the charge detection unit of the first tap TA. As a result, the influence amount of the potential of the FD 122A on the potential fluctuation of the charge detection unit of the first tap TA is reduced, and noise is curbed.

The same applies to the metal films 201B to 206B related to the second tap TB arranged so as to be symmetric with respect to the pixel middle line in the vertical direction of the pixel 51.

Since the pixel transistors Tr that drive the first tap TA and the pixel transistors Tr that drive the second tap TB in the pixel are formed symmetrically with respect to the vertical direction, the wiring load is uniformly adjusted between the first tap TA and the second tap TB. As a result, drive variation of the first tap TA and the second tap TB is reduced.

FIG. 20 illustrates a planar arrangement example of the metal film M2 which is the second layer of the five metal films M1 to M5 of the multilayer wiring layer 111.

The relationship between the left plan view and the right plan view of FIG. 20 is similar to that of FIG. 18.

In the metal film M2 which is the second layer of the multilayer wiring layer 111, the FD 122A of the pixel 51 includes a comb-shaped metal film 211A. A metal film 212A of GND (VSS potential) is formed in a comb shape so as to be inserted into the comb-shaped gap of the metal film 211A as the FD 122A. By forming both the metal film 212A as the FD 122A and the metal film 212A of the GND (VSS potential) in a comb shape and securing larger regions facing each other, it is possible to increase the storage capacity of the FD 122A and widen the dynamic range. Additionally, the metal film 212A of the GND is arranged so as to surround the metal film 211A as the FD 122A, and reduces the amount of influence of other potential changes on the potential of the FD 122A to curb noise.

In the metal film M2, the FD 122B of the pixel 51 is formed at a position symmetrical to the FD 122A with respect to the pixel middle line in the vertical direction of the pixel 51. The FD 122B similarly includes a comb-shaped metal film 211B, and a comb-shaped metal film 212B of GND (VSS potential) is formed so as to face the comb-shaped metal film 211B. The metal film 212B of GND (VSS potential) is arranged so as to surround the metal film 211B as the FD 122B to curb noise.

In the metal film M2, the FDs 122A and 122B are arranged in regions not overlapping the formation region of the pixel transistors Tr of FIGS. 18 and 19. As a result, potential fluctuation received from the metal film (wiring) connected to the pixel transistors Tr is reduced, and noise is curbed. Note that the FDs 122A and 122B may overlap a part of the formation region of the pixel transistors Tr of FIGS. 18 and 19.

The metal film 211A as the FD 122A is connected to the metal film M1 by two or more vias. The metal film 211B as the FD 122B is also connected to the metal film M1 by two or more vias. As a result, the influence of resistance change due to process variation is reduced, and noise is curbed.

A metal film 213 arranged at an intermediate position in the vertical direction of the pixel 51 is wiring for supplying the power supply voltage VDD. The metal films 214A and 214B arranged above and below the metal film 213 are wirings that transmit the drive signal TRG supplied to the transfer transistors 121A and 121B. Metal films 215A and 215B disposed outside the metal films 214A and 214B are wirings that transmit the drive signal RST supplied to the reset transistors 123A and 123B. Metal films 216A and 216B arranged outside the metal films 215A and 215B are wirings that transmit the selection signal SEL supplied to the selection transistors 125A and 125B.

By arranging the wirings for transmitting the control signals of the multiple pixel transistors Tr for controlling the first tap TA or the second tap TB so as to be symmetric with respect to the pixel middle line in the vertical direction of the pixel 51, drive variation of the first tap TA and the second tap TB is reduced.

Figure 21:
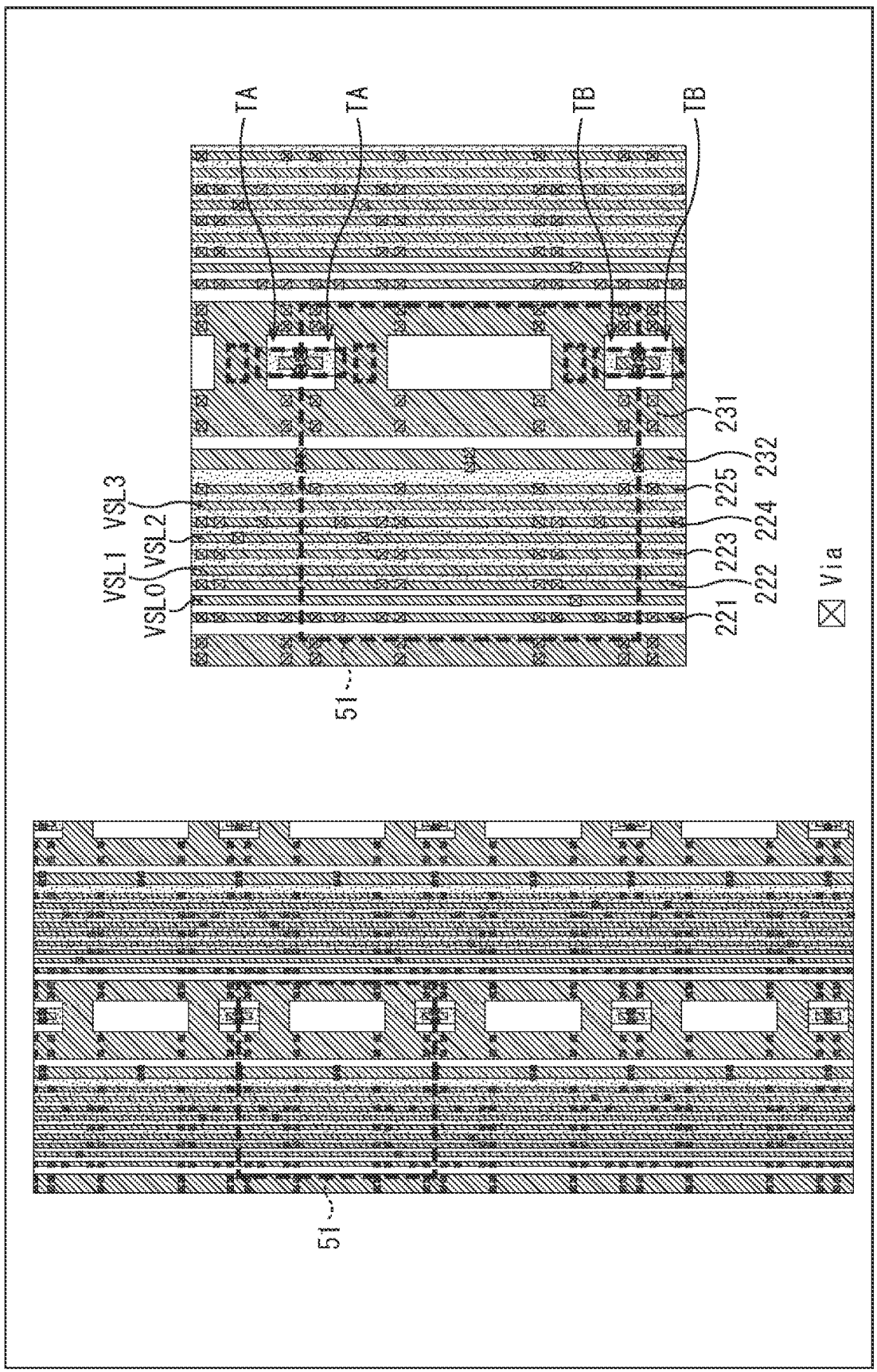
FIG. 21 is a diagram illustrating a planar arrangement example of a metal film M3 which is a third layer of the multilayer wiring layer.

FIG. 21 illustrates a planar arrangement example of the metal film M3 which is the third layer of the five metal films M1 to M5 of the multilayer wiring layer 111.

The relationship between the left plan view and the right plan view of FIG. 21 is similar to that of FIG. 18.

The vertical signal lines VSL0 to VSL3 are arranged in the metal film M3 which is the third layer. One of wirings 221 to 225 is arranged on each side of each of the vertical signal lines VSL0 to VSL3, and each of the wirings 221 to 225 is connected to GND (VSS potential). By disposing any one of the wirings 221 to 225 connected to the GND between the vertical signal lines VSL0 to VSL3, potential fluctuation from the adjacent vertical signal lines VSL is reduced, and noise is curbed. Note that in a case where the potentials of two adjacent vertical signal lines VSL among the vertical signal lines VSL0 to VSL3 are the same potential, the GND wiring (any of wirings 221 to 225) therebetween may be omitted.

The region where the vertical signal lines VSL0 to VSL3 are arranged is a region whose position in the plane direction in the pixel 51 does not overlap the FDs 122A and 122B of the metal film M2. As a result, the potential fluctuation that the FDs 122A and 122B receive from the vertical signal lines VSL0 to VSL3 is reduced, and noise is curbed.

In a region of the metal film M3 corresponding to the positions of the metal films 211A and 211B as the FDs 122A and 122B of the metal film M2, wiring 231 connected to the GND (VSS potential) is arranged. As a result, the metal films 211A and 211B as the FDs 122A and 122B of the metal film M2 and the GND wiring of the metal film M3 are made to face each other in the stacking direction as well, so that the capacitance of the FD 122 is increased, potential fluctuation is reduced, and noise is curbed.

Figure 22:
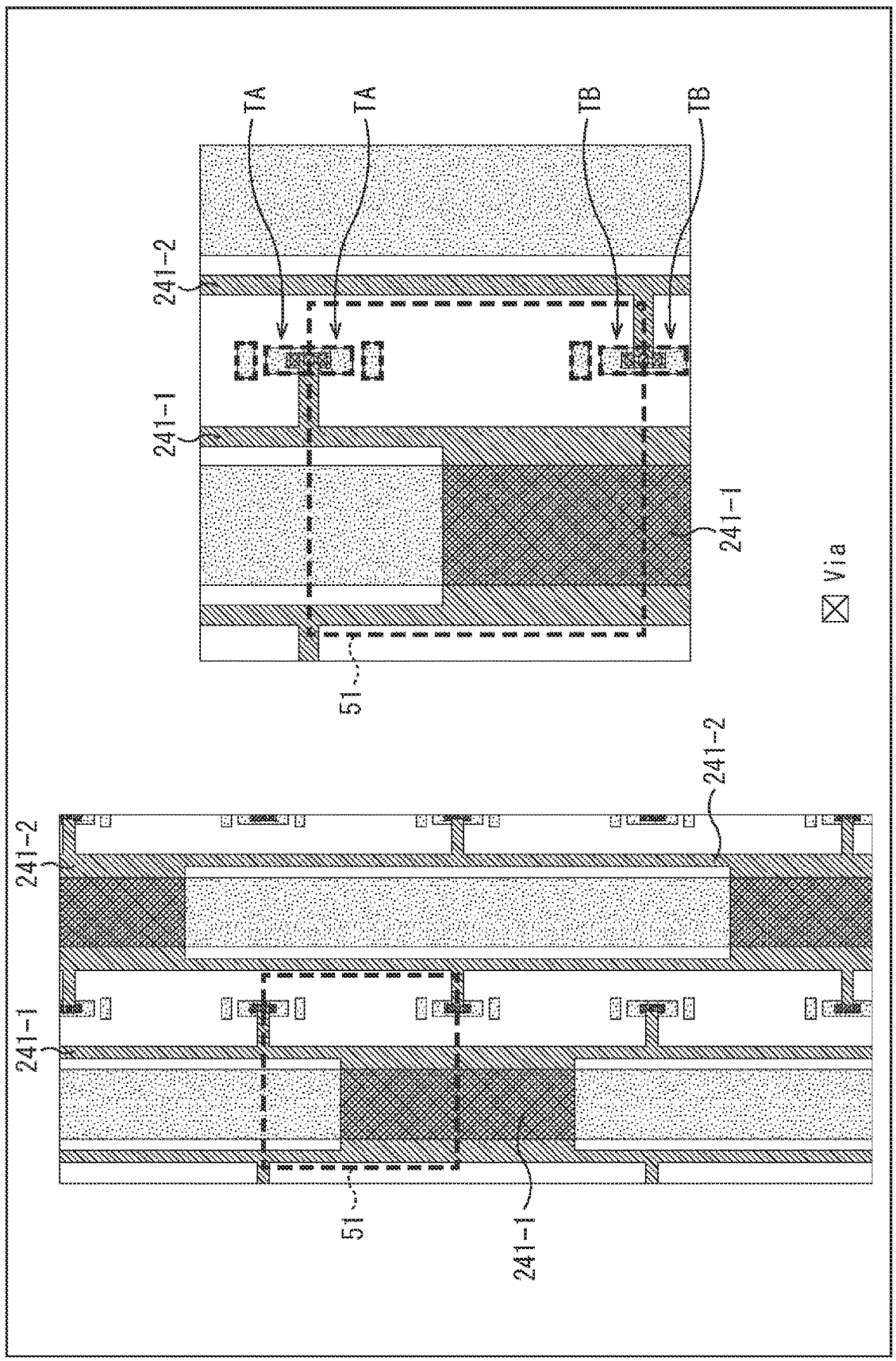
FIG. 22 is a diagram illustrating a planar arrangement example of a metal film M4 which is a fourth layer of the multilayer wiring layer.

FIG. 22 illustrates a planar arrangement example of the metal film M4 which is the fourth layer of the five metal films M1 to M5 of the multilayer wiring layer 111.

The relationship between the left plan view and the right plan view of FIG. 22 is similar to that of FIG. 18.

In the fourth metal film M4 of the multilayer wiring layer 111, voltage supply lines 241-1 and 241-2 for applying the predetermined voltage MIX_A or MIX_B to the P+ semiconductor regions 73-1 and 73-2, which are voltage application units of the taps T of the pixels 51, are formed. In the example of FIG. 22, the voltage supply line 241-1 is connected to the first tap TA of the pixel 51 indicated by the broken line through a via, and the voltage supply line 241-2 is connected to the second tap TB of the pixel 51 indicated by the broken line through a via. Of the voltage supply lines 241-1 and 241-2 in FIG. 22, a region indicated by a hatched lattice pattern indicates a via region connected to the metal film M5 illustrated in FIG. 23.

The wiring region extending in the vertical direction of the voltage supply lines 241-1 and 241-2 of the metal film M4 is a region that does not overlap the region of the vertical signal lines VSL0 to VSL3 of the metal film M3 in the planar direction. As a result, the influence of the voltage MIX_A or MIX_B of the voltage supply lines 241-1 and 241-2 on the potentials of the vertical signal lines VSL0 to VSL3 is reduced, and noise is curbed.

Figure 23:
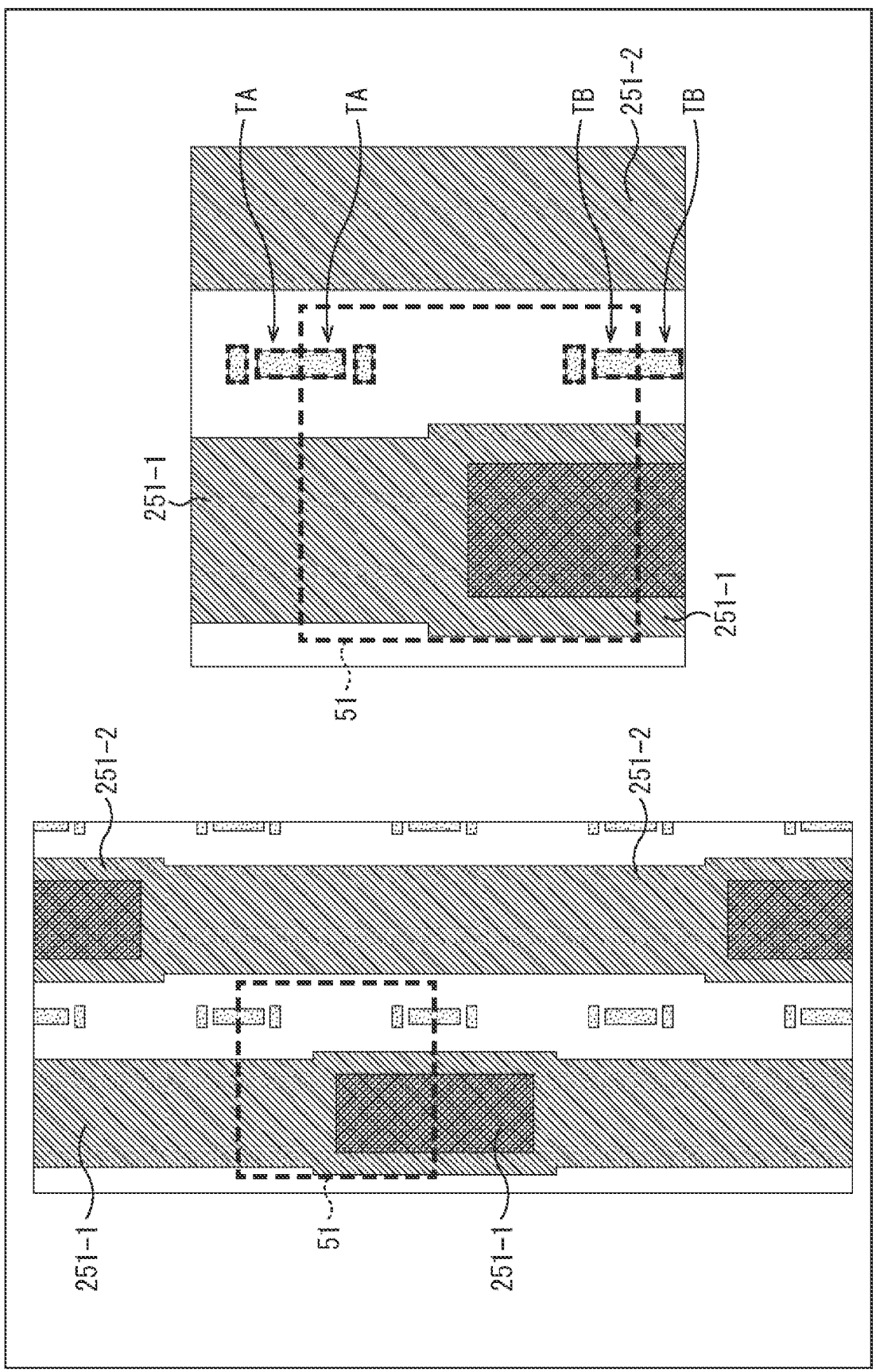
FIG. 23 is a diagram illustrating a planar arrangement example of a metal film M5 which is a fifth layer of the multilayer wiring layer.

FIG. 23 illustrates a planar arrangement example of the metal film M5 which is the fifth layer of the five metal films M1 to M5 of the multilayer wiring layer 111.

The relationship between the left plan view and the right plan view of FIG. 23 is similar to that of FIG. 18.

In the fifth metal film M5 of the multilayer wiring layer 111, voltage supply lines 251-1 and 251-2 for applying the predetermined voltage MIX_A or MIX_B to the P+ semiconductor regions 73-1 and 73-2, which are voltage application units of the taps T of the pixels 51, are formed. In the example of FIG. 23, the voltage supply line 251-1 is wiring connected to the first tap TA as in the case of the voltage supply line 241-1 of the metal film M4, and the voltage supply line 251-2 is wiring connected to the second tap TB.

Note, however, that the voltage supply line 251-1 of the metal film M5 is not directly connected to the first tap TA, and the predetermined voltage MIX_A is applied to the first tap TA through the voltage supply line 241-1 of the metal film M4. In the voltage supply line 251-1 of the metal film M5 in FIG. 23, a region indicated by a hatched lattice pattern indicates a via region in which the voltage supply line 241-1 and the voltage supply line 251-1 are connected in the stacking direction.

Similarly, the voltage supply line 251-2 of the metal film M5 is not directly connected to the second tap TB, and the predetermined voltage MIX_B is applied to the second tap TB through the voltage supply line 241-2 of the metal film M4. In the voltage supply line 251-2 of the metal film M5 in FIG. 23, a region indicated by a hatched lattice pattern indicates a via region in which the voltage supply line 241-2 and the voltage supply line 251-2 are connected in the stacking direction.

As can be seen with reference to the metal film M4 of FIG. 22 and the metal film M5 of FIG. 23, the position of the via region between the voltage supply lines 241-1 and 251-1 and the position of the via region between the voltage supply lines 241-2 and 251-2 are shifted in the vertical direction. As a result, the via region between the voltage supply lines 241-1 and 251-1 and the via region between the voltage supply lines 241-2 and 251-2 in the planar direction can be separated as much as possible, so that via formation is facilitated and the manufacturing process can be stabilized.

Since two layers of the voltage supply line 241 of the fourth metal film M4 and the voltage supply line 251 of the fifth metal film M5 are wired in the vertical direction of the pixel array unit 20, and the predetermined voltage MIX_A or MIX_B applied to the taps T of the pixels 51 in the vertical direction is transmitted in two layers, the wiring resistance in the vertical direction is reduced, and the propagation delay is reduced, so that in-plane characteristic variations of the pixel array unit 20 can be reduced.

<8. Configuration Example of DTI>

In FIGS. 4 to 6, the structure in which the DTI 65 is provided as the pixel separation portion in the pixel 51 adopting the tap structure (non-shared tap structure) not sharing the P+ semiconductor region 73 which is the voltage application unit of the tap T has been described.

Next, a structure in which a DTI as a pixel separation portion is provided in the pixel 51 having the tap T of the shared tap structure will be described with reference to FIGS. 24 to 32.

(First Pixel Separation Structure)

Figure 24:
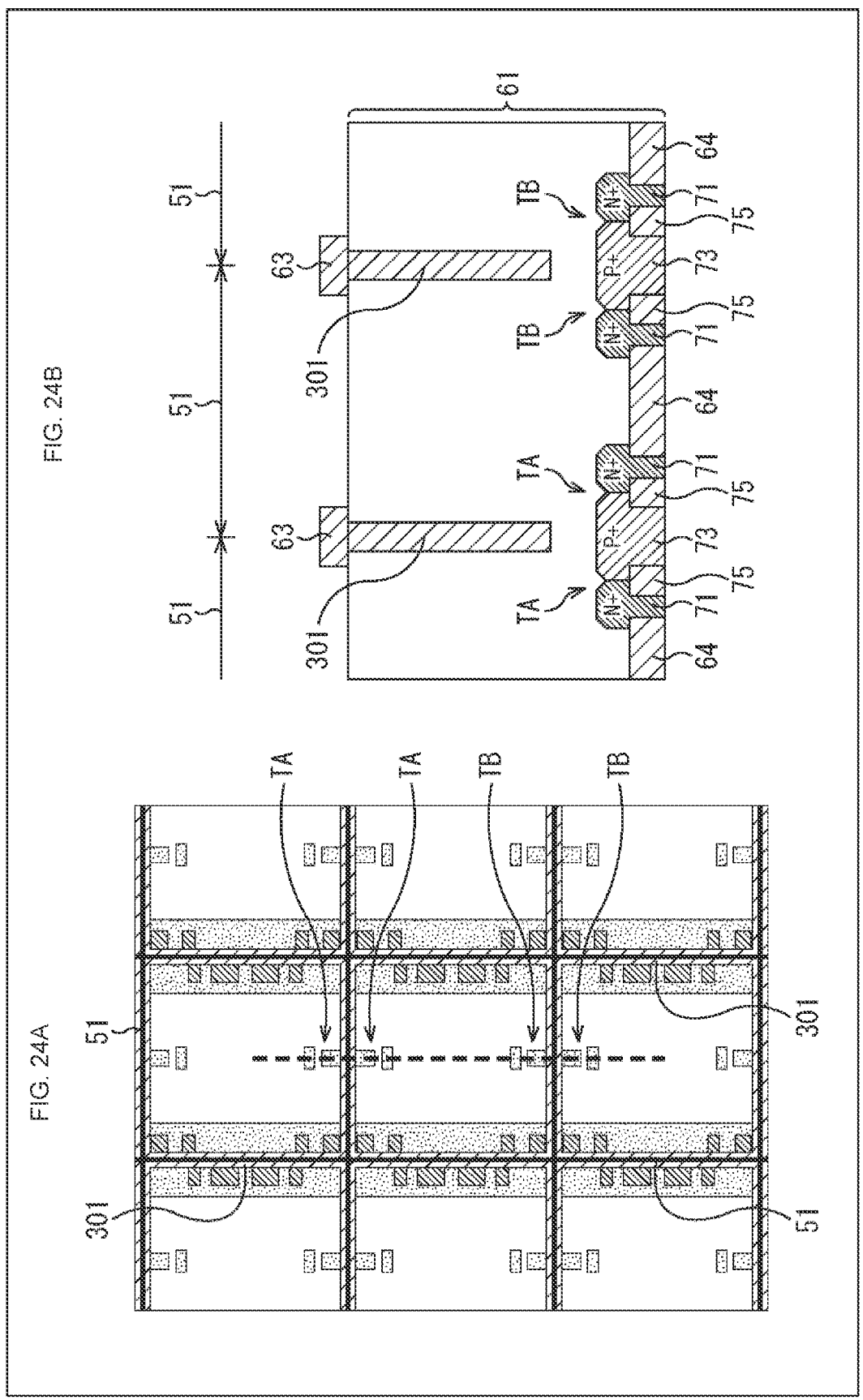
FIG. 24 is a diagram illustrating a first pixel separation structure of the pixels.

A of FIG. 24 is a plan view illustrating a first pixel separation structure. Note that in A of FIG. 24, the boundary line of the pixels 51 indicated by a solid line is for describing the separation between the adjacent pixels 51, and does not represent any structure. The same applies to FIGS. 25 to 32.

B of FIG. 24 is a pixel cross-sectional view of a line segment passing through the taps T, corresponding to the broken line portion of A of FIG. 24.

In the first pixel separation structure, as illustrated in A of FIG. 24, a DTI 301 is arranged at the boundary portion of the pixels 51. A planar shape of the DTI 301 is a lattice shape, and the lattice pitch is equal to the pixel pitch.

As illustrated in B of FIG. 24, the DTI 301 is formed by embedding an insulator (e.g., SiO2) in a groove portion (trench) formed by digging from the back surface side which is the light incident surface side of the substrate 61 to a predetermined depth. The material to be embedded in the groove portion of the DTI 301 may include, for example, only an insulating layer such as SiO2, or may have a double structure in which the outer side (pixel center side) of a metal layer such as tungsten is covered with an insulator. The DTI 301 is disposed so as to overlap at least a part of the P+ semiconductor region 73 which is the voltage application unit of the tap T (first tap TA or second tap TB) in plan view. Additionally, the inter-pixel light-shielding film 63 is formed on an upper surface of the DTI 301.

By forming the DTI 301 of the first pixel separation structure, it is possible to curb occurrence of crosstalk due to incidence of infrared light once incident on one pixel 51 on an adjacent pixel 51. Additionally, since the separation characteristic of infrared light between pixels can be improved, sensitivity can be improved.

(Second Pixel Separation Structure)

Figure 25:
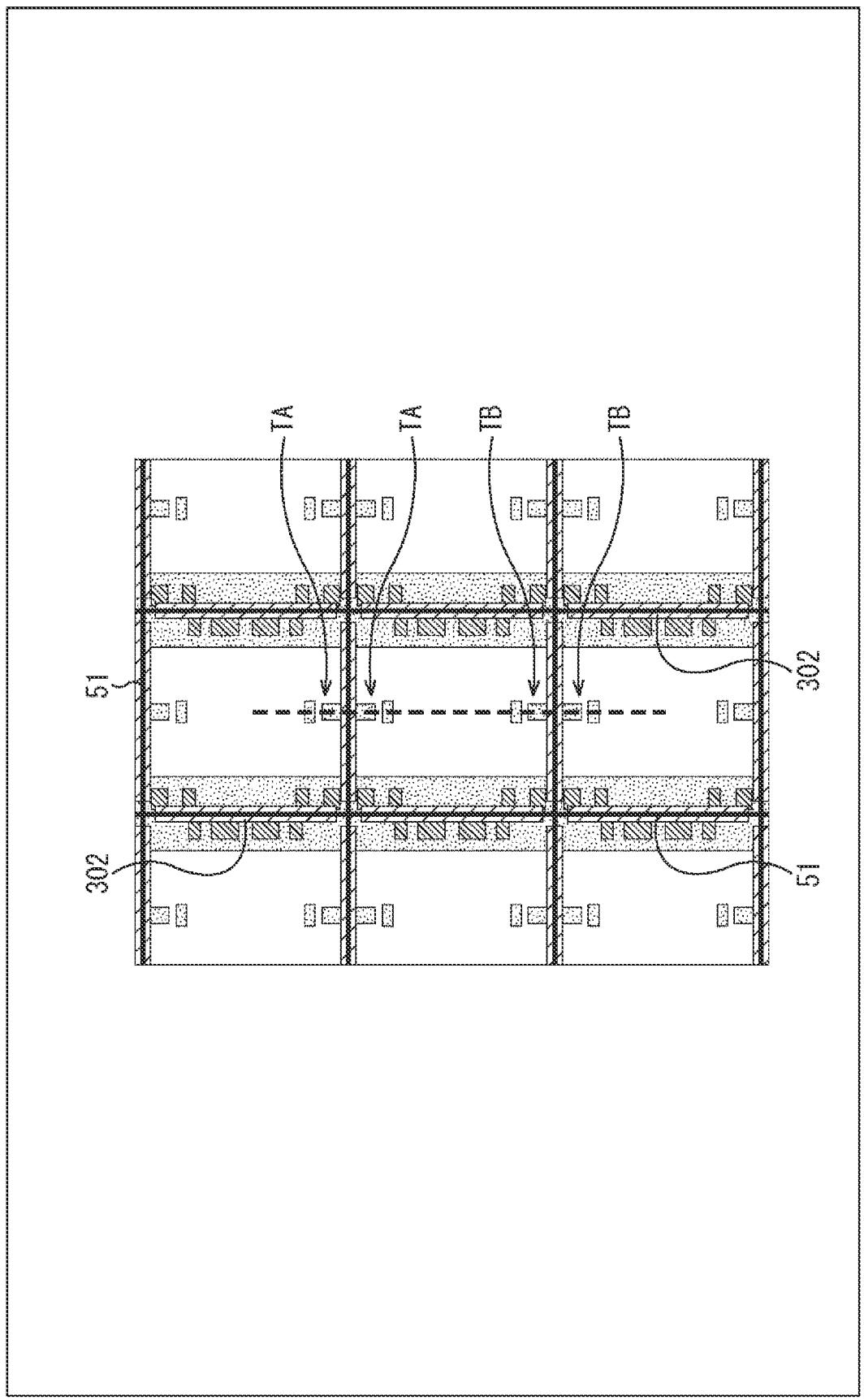
FIG. 25 is a diagram illustrating a second pixel separation structure of the pixels.

FIG. 25 is a plan view illustrating a second pixel separation structure.

In the second pixel separation structure, too, as illustrated in FIG. 25, DTIs 302 are arranged in a lattice shape along the pixel boundary of the pixels 51.

The pixel cross-sectional view of the broken line portion in FIG. 25 is the same as the cross-sectional view of the first pixel separation structure illustrated in B of FIG. 24, and thus illustration is omitted.

The difference between the first pixel separation structure in FIG. 24 and the second pixel separation structure in FIG. 25 is that the DTI 301 is formed at the intersection where the lattice intersects as well in the first pixel separation structure, whereas the DTI 302 is not formed at the intersection where the lattice intersects in the second pixel separation structure. The method of forming the DTI 302 and the material embedded in the groove portion are similar to those of the DTI 301.

By forming the DTI 302 having the second pixel separation structure, it is possible to curb occurrence of crosstalk due to incidence of infrared light once incident on one pixel 51 on an adjacent pixel 51. Additionally, since the separation characteristic of infrared light between pixels can be improved, sensitivity can be improved.

Moreover, according to the DTI 302 in which the separation structure is not formed at the intersection of the lattice, the width (width in plane direction) of the groove portion at the intersection increases when the DTI is formed, and it is possible to curb occurrence of an overcurrent due to excessive depth of the groove portion.

(Third Pixel Separation Structure)

Figure 26:
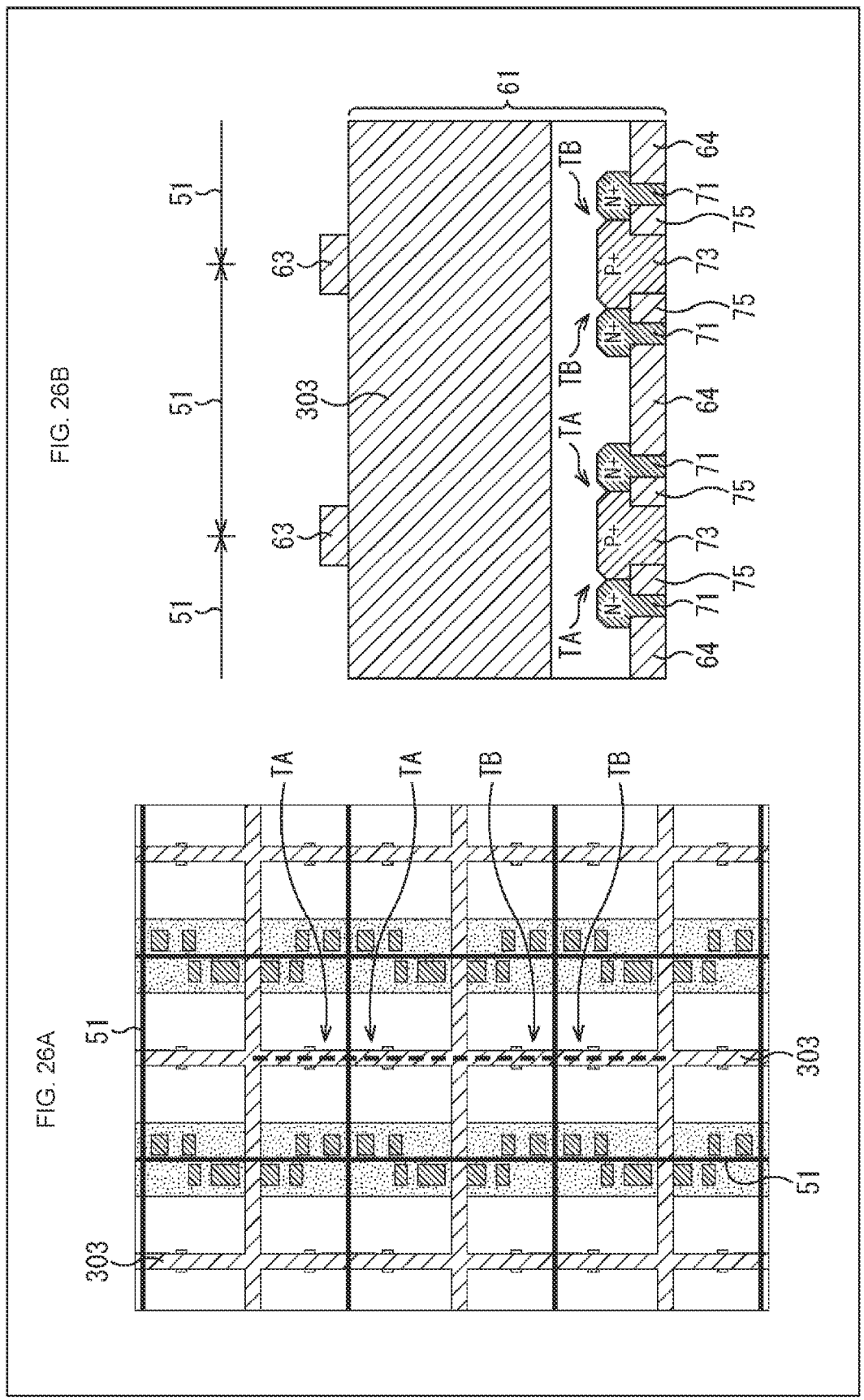
FIG. 26 is a diagram illustrating a third pixel separation structure of the pixels.

A of FIG. 26 is a plan view illustrating a third pixel separation structure.

B of FIG. 26 is a pixel cross-sectional view of a line segment passing through the taps T, corresponding to the broken line portion of A of FIG. 26.

As illustrated in A of FIG. 26, in the third pixel separation structure, as in the case of the first pixel separation structure illustrated in A of FIG. 24, DTIs 303 are arranged in a lattice shape at intervals equal to the pixel pitch. The difference between the DTI 303 of the third pixel separation structure and the DTI 301 of the first pixel separation structure is the position where the DTI 303 is formed.

That is, the position of the DTI 303 of the third pixel separation structure is shifted by a half pitch of the lattice in the vertical direction and the horizontal direction from the position of the DTI 301 of the first pixel separation structure. In other words, while the DTI 301 of the first pixel separation structure is formed such that the intersection of the lattice is at the position of the boundary portion of the pixel 51, the DTI 303 of the third pixel separation structure is formed such that the intersection of the lattice is at the position of the central portion of the planar region of the pixel 51.

Since the DTI 303 is formed on the line segment connecting the first tap TA and the second tap TB, the pixel cross-sectional view corresponding to the broken line portion in A of FIG. 26 is as illustrated in B of FIG. 26.

The on-chip lens 62 is formed such that incident light is condensed at the center portion of the planar region of the pixel 51, in other words, at an intermediate position between the first tap TA and the second tap TB. Accordingly, the condensing portion of the incident light is an intersection of the DTI 303. Since diffraction of the incident light by the DTI 303 increases, sensitivity can be improved.

(Fourth Pixel Separation Structure)

Figure 27:
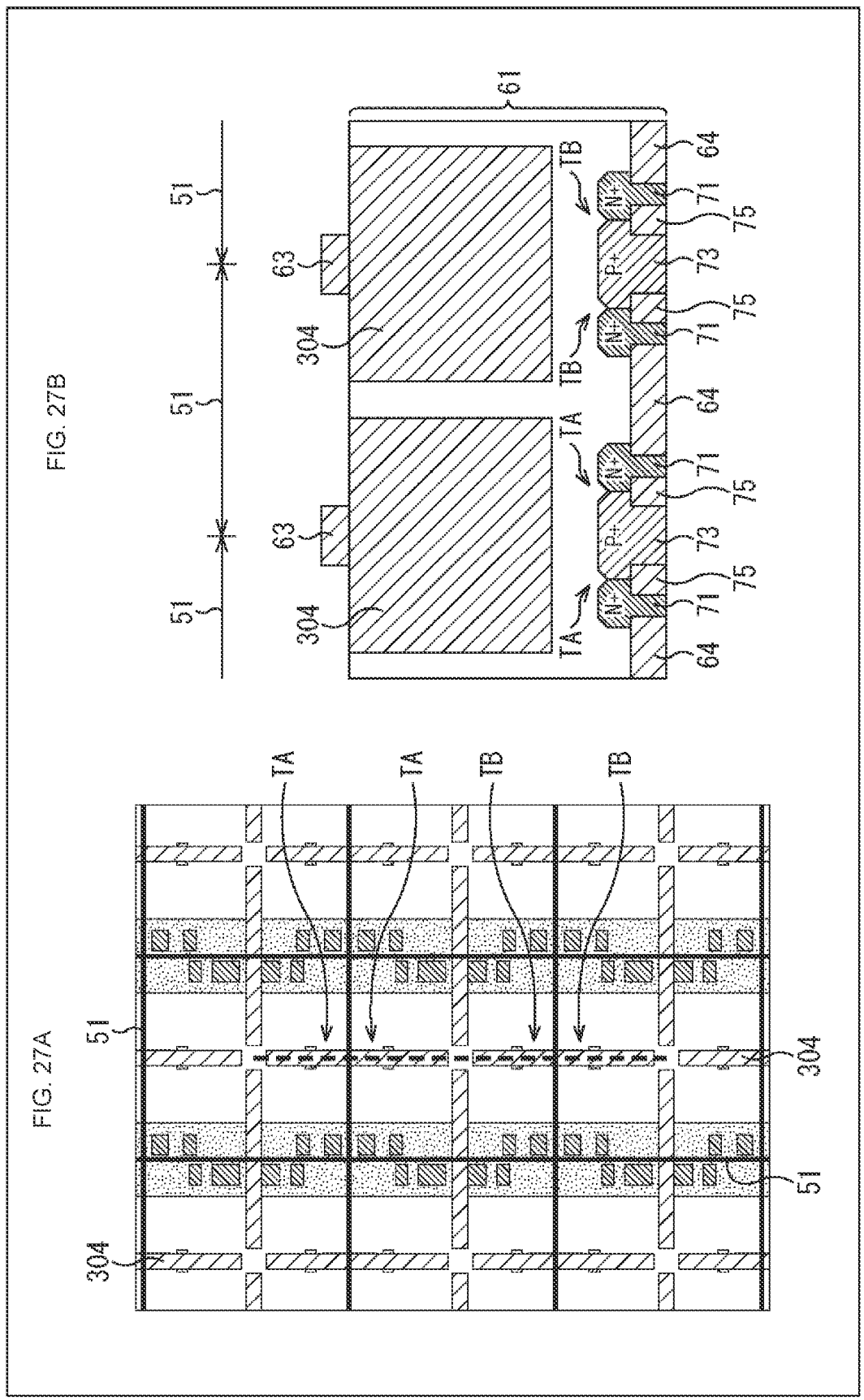
FIG. 27 is a diagram illustrating a fourth pixel separation structure of the pixels.

A of FIG. 27 is a plan view illustrating a fourth pixel separation structure.

B of FIG. 27 is a pixel cross-sectional view of a line segment passing through the taps T, corresponding to the broken line portion of A of FIG. 27.

In the fourth pixel separation structure, a DTI 304 is formed. The DTI 304 has a structure in which an intersection of the DTI 303 of the third pixel separation structure is not provided. In other words, the DTI 304 of the fourth pixel separation structure is common to the third pixel separation structure of FIG. 26 in that the intersection of the lattice is formed at the position of the central portion of the planar region of the pixel 51, and is common to the second pixel separation structure of FIG. 25 in that the separation structure is not provided at the intersection.

According to the fourth pixel separation structure, as in the case of the third pixel separation structure, since the intersection of the DTI 304 is the central portion of the pixel region, diffraction of incident light by the DTI 304 increases, and sensitivity can be improved.

Additionally, in the DTI 304, since the separation structure is not formed at the intersection of the lattice, as in the case of the second pixel separation structure, it is possible to curb occurrence of an overcurrent due to formation of an excessively deep groove portion.

(Fifth Pixel Separation Structure)

Figure 28:
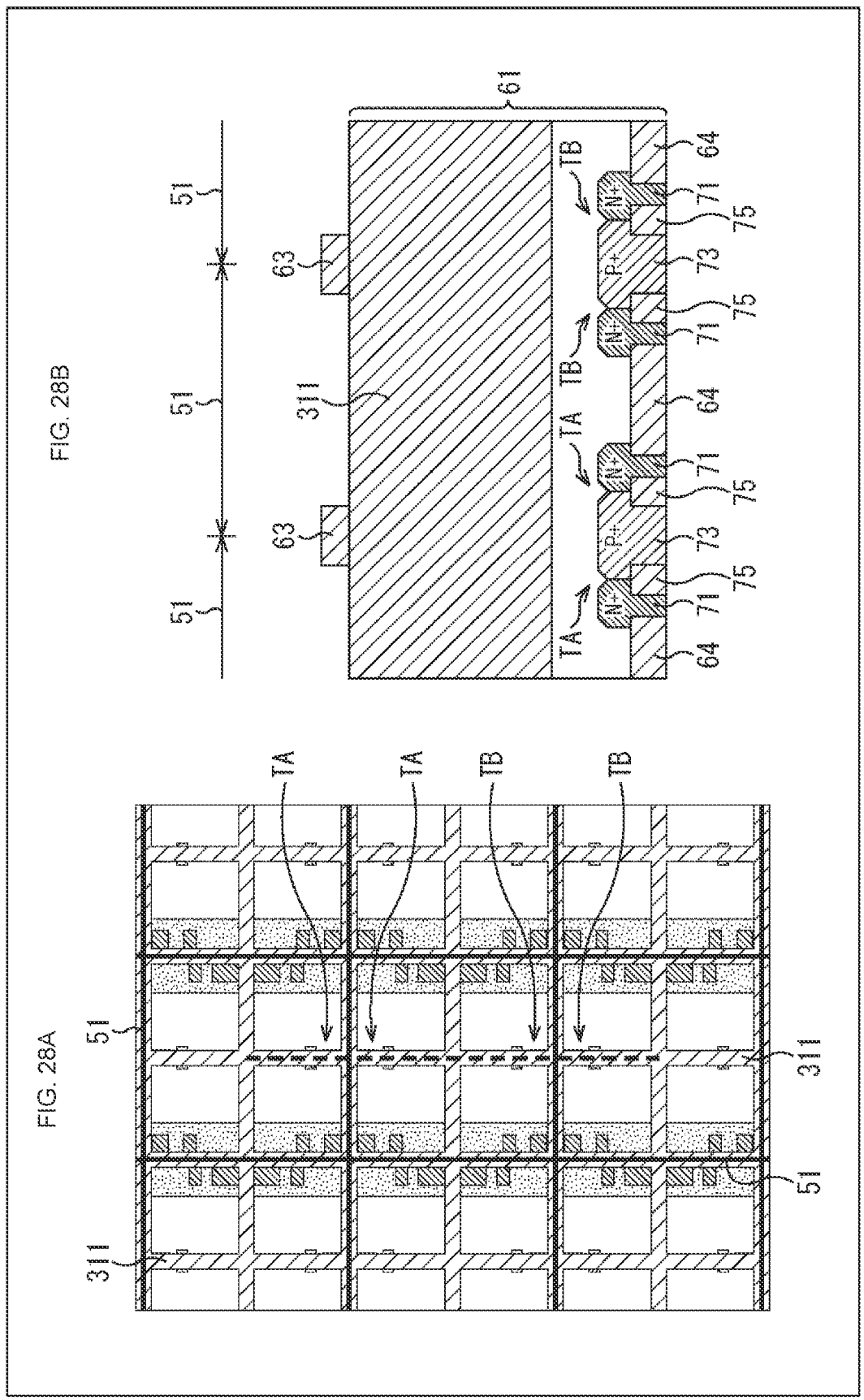
FIG. 28 is a diagram illustrating a fifth pixel separation structure of the pixels.

A of FIG. 28 is a plan view illustrating a fifth pixel separation structure.

B of FIG. 28 is a pixel cross-sectional view of a line segment passing through the taps T, corresponding to the broken line portion of A of FIG. 28.

In the fifth pixel separation structure, a DTI 311 is formed. A planar shape of the DTI 311 is a lattice shape, and the lattice pitch is half (½) of the pixel pitch.

In other words, the DTI 311 of the fifth pixel separation structure is a separation structure in which the lattice pitch of the DTI 301 of the first pixel separation structure illustrated in FIG. 24 or of the DTI 303 of the third pixel separation structure illustrated in FIG. 26 is changed to half. As a result, the DTI 311 is formed at the boundary portion of the pixels 51, and is also formed on lines dividing the rectangular pixel region into two in the vertical direction and the in horizontal direction.

A pixel cross-sectional view corresponding to the broken line portion in A of FIG. 28 is as illustrated in B of FIG. 28 and is similar to B of FIG. 26.

According to the fifth pixel separation structure, as in the case of the first pixel separation structure, it is possible to curb occurrence of crosstalk due to incidence of infrared light once incident on one pixel 51 on the adjacent pixel 51. Additionally, as in the case of the third pixel separation structure, the light condensing portion of the incident light is an intersection of the DTI 311. Since diffraction of the incident light by the DTI 311 increases, sensitivity can be improved.

(Sixth Pixel Separation Structure)

Figure 29:
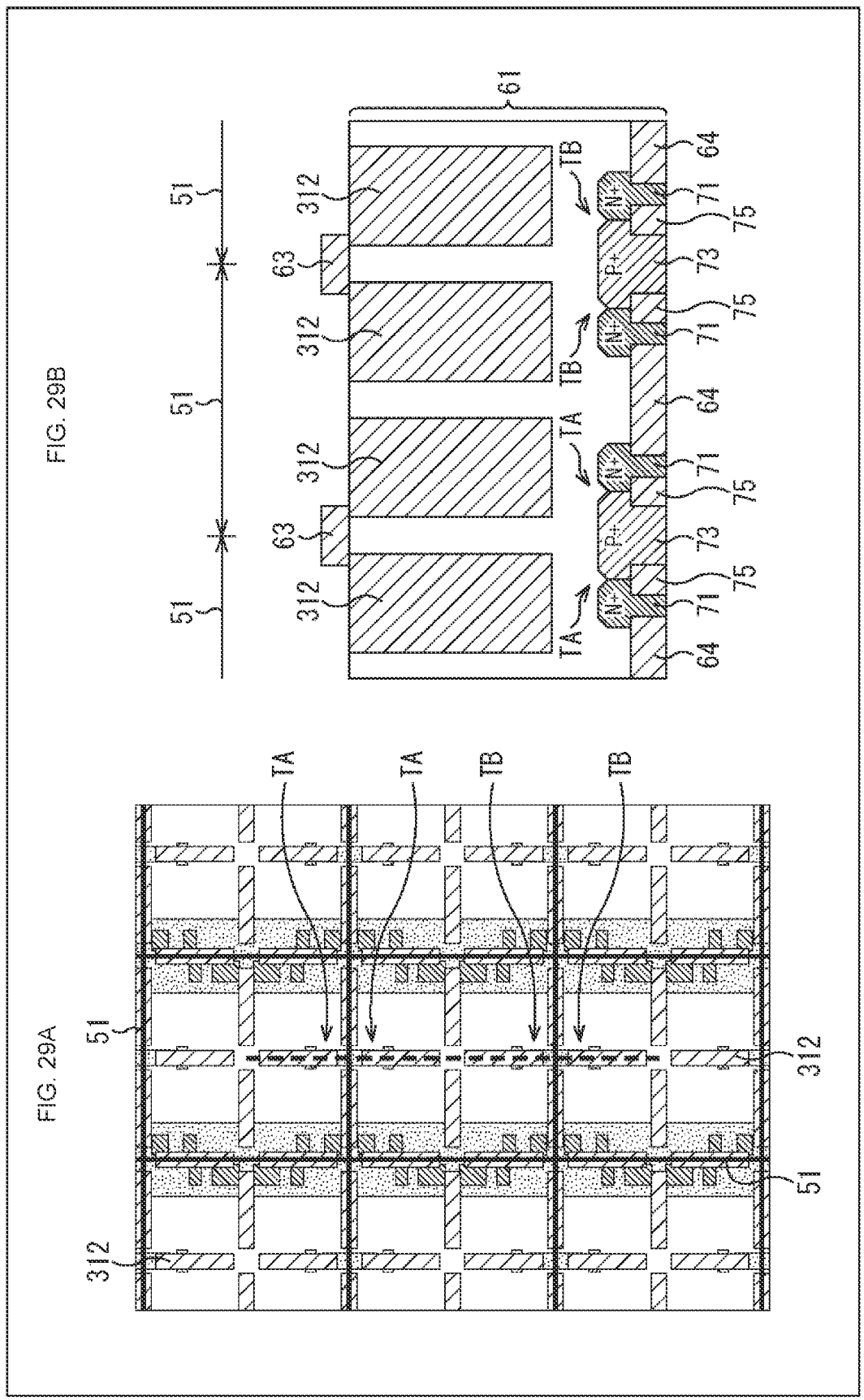
FIG. 29 is a diagram illustrating a sixth pixel separation structure of the pixels.

A of FIG. 29 is a plan view illustrating a sixth pixel separation structure.

B of FIG. 29 is a pixel cross-sectional view of a line segment passing through the taps T, corresponding to the broken line portion of A of FIG. 29.

In the sixth pixel separation structure, a DTI 312 is formed. The DTI 312 has a structure in which the intersection of the DTI 311 of the fifth pixel separation structure illustrated in FIG. 28 is not provided. Specifically, the planar shape of the DTI 312 is a lattice shape, and the lattice pitch is half (½) of the pixel pitch. As illustrated in B of FIG. 29, the DTI 312 is not provided at the pixel boundary portion and the pixel center portion corresponding to the intersection of the lattice.

According to the sixth pixel separation structure, as in the case of the first pixel separation structure, it is possible to curb occurrence of crosstalk due to incidence of infrared light once incident on one pixel 51 on the adjacent pixel 51. Additionally, as in the case of the third pixel separation structure, the light condensing portion of the incident light is an intersection of the DTI 312. Since diffraction of the incident light by the DTI 312 increases, sensitivity can be improved. Moreover, since the DTI 312 is not formed at the intersection of the lattice, as in the case of the second pixel separation structure, it is possible to curb occurrence of an overcurrent due to formation of an excessively deep groove portion.

(Pixel Structure to which Antireflection Structure is Added)

In the pixel 51 having the first to sixth pixel separation structures illustrated in FIGS. 24 to 29, a fine uneven structure can be formed on the light incident surface of the substrate 61.

Figure 30:
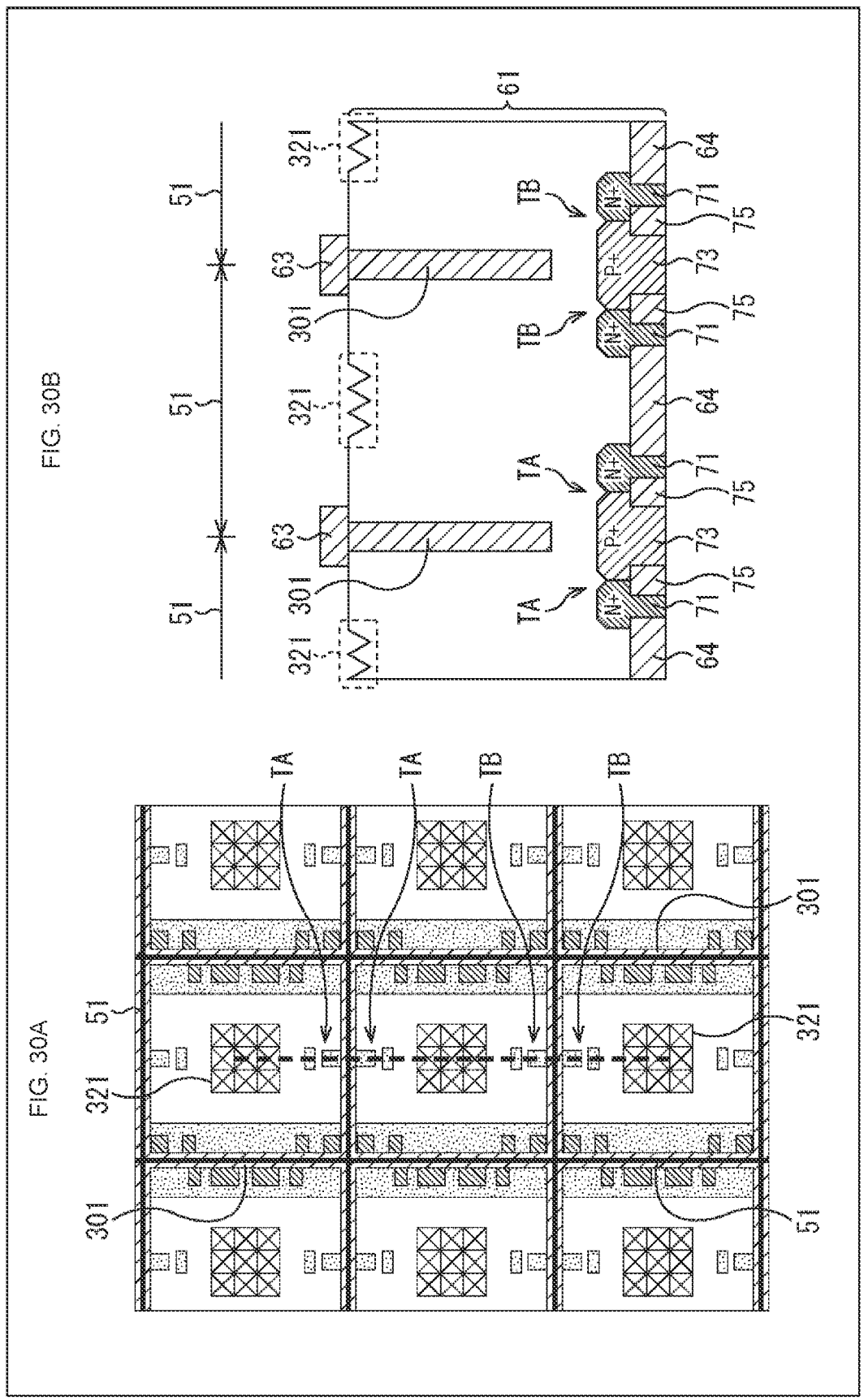
FIG. 30 is a diagram illustrating a first pixel separation structure provided with an uneven structure.

FIG. 30 is a plan view and a cross-sectional view illustrating a pixel structure in which an uneven structure is provided in the pixel 51 having the first pixel separation structure illustrated in FIG. 24.

Accordingly, FIGS. 30 and 24 are different only in whether or not an uneven portion 321 is provided on the light incident surface of the substrate 61, and the other parts are the same.

As illustrated in the plan view in A of FIG. 30, the uneven portion 321 is formed in a region including the central portion of the pixel region. As illustrated in the cross-sectional view of B of FIG. 30, the uneven portion 321 has, for example, an inverted pyramid structure in which multiple quadrangular pyramid-shaped regions having apexes on the tap T side are regularly arranged. The bottom surface shape of each quadrangular pyramid is, for example, a square, and each quadrangular pyramid-shaped region is formed by digging the substrate 61 so that it protrudes toward the tap T side. Note that the uneven portion 321 may have a normal pyramid structure in which multiple quadrangular pyramid regions having apexes on the on-chip lens 62 side, which is the side on which light is incident, are regularly arranged. Note that the apex of the inverted pyramid structure or the normal pyramid structure may have a curvature and a rounded shape.

In the example of FIG. 30, the uneven portion 321 has a structure in which quadrangular pyramid shapes are arranged in 3×3. However, the size and the number of repeating units (quadrangular pyramid shapes) are arbitrary. In the example of FIG. 30, the uneven portion 321 is formed only near the center of the pixel region. However, the uneven portion may be formed in any region of the light incident surface of the substrate 61 as long as it is a portion where the DTI 301 is not formed. The uneven portions 321 may be formed on the entire light incident surface except the portion of the DTI 301.

Although not illustrated, the uneven portion 321 can be formed on the light incident surface of the substrate 61 in the pixel 51 having the second to sixth pixel separation structures illustrated in FIGS. 25 to 29 as well.

The diffracted light of the incident light is increased by the uneven portion 321, and a gradient of the refractive index is formed, so that reflection is reduced. As a result, since the amount of incident light to be photoelectrically converted can be increased, sensitivity can be improved.

(Seventh Pixel Separation Structure)

Figure 31:
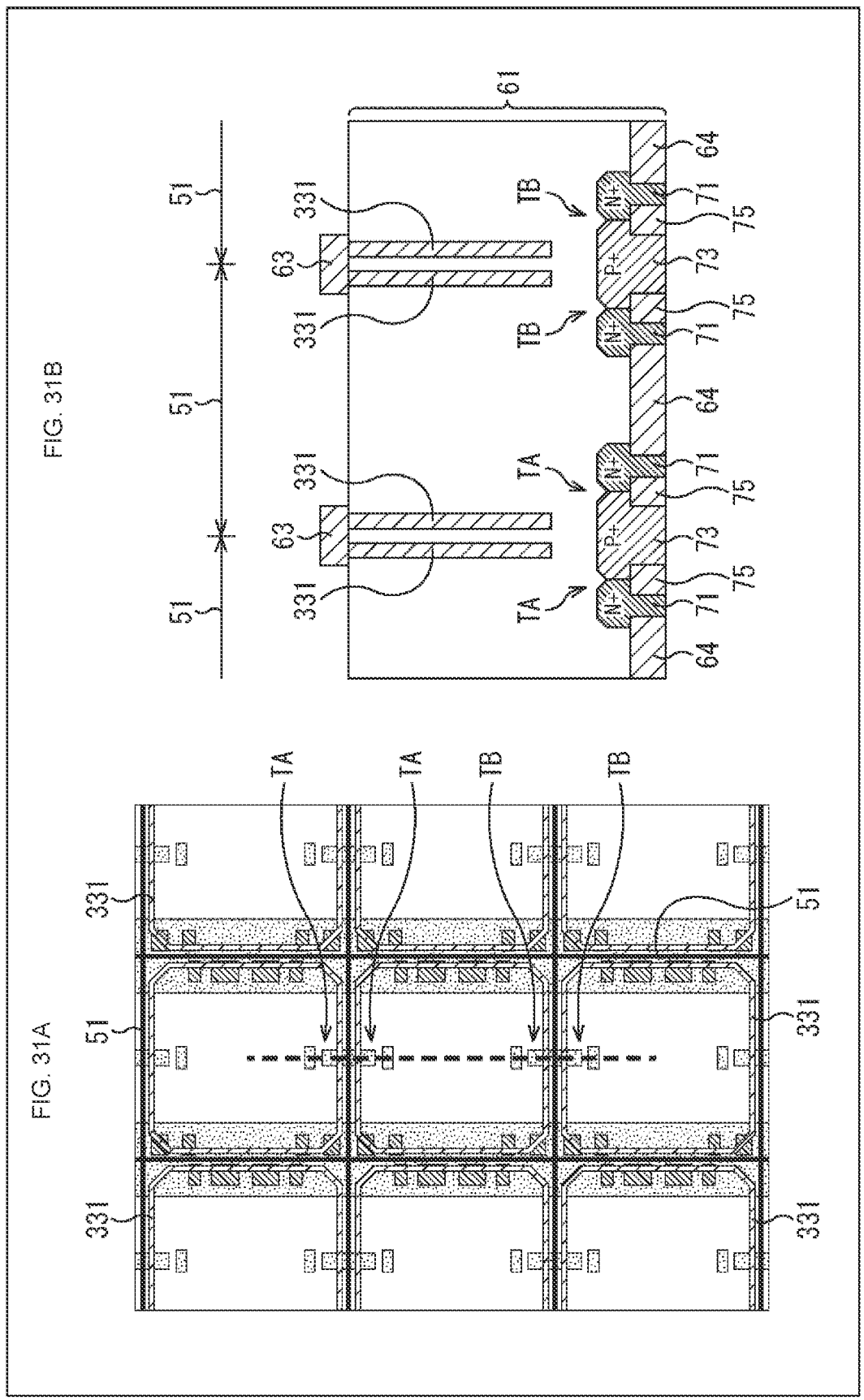
FIG. 31 is a diagram illustrating a seventh pixel separation structure of the pixels.

A of FIG. 31 is a plan view illustrating a seventh pixel separation structure.

B of FIG. 31 is a pixel cross-sectional view of a line segment passing through the taps T, corresponding to the broken line portion of A of FIG. 31.

In the seventh pixel separation structure, DTIs 331 are formed. Compared with the DTI 301 of the first pixel separation structure of FIG. 24, while the DTI 301 is formed at the boundary portion of the pixels 51 as a barrier shared by the two adjacent pixels 51, the DTI 331 of FIG. 31 is formed to be an individual barrier for each pixel. As a result, as illustrated in B of FIG. 31, the DTI 331 is formed to serve as a double barrier between adjacent pixels.

As illustrated in the plan view of A of FIG. 31, the corner portion of the DTI 331 formed in a rectangular shape along the boundary portion of the pixel 51 is chamfered so that the sides do not form a right angle, and an intersection of 90 degrees is not formed. As a result, it is possible to curb the occurrence of defects and damage at the time of forming the groove portion of the intersection, and it is possible to curb the occurrence of noise charge.

With the DTI 331, it is possible to curb occurrence of crosstalk due to incidence of infrared light once incident on one pixel 51 on an adjacent pixel 51. Additionally, since the separation characteristic of infrared light between pixels can be improved, sensitivity can be improved.

(Pixel Structure to which Antireflection Structure is Added)

An uneven structure can be provided for the seventh pixel separation structure as well.

FIG. 32 is a plan view and a cross-sectional view in which the uneven portion 321 is provided in the pixel 51 having the seventh pixel separation structure illustrated in FIG. 31. Accordingly, FIGS. 31 and 32 are different only in whether or not the uneven portion 321 is provided on the light incident surface of the substrate 61, and the other parts are the same.

Note that while the uneven portion 321 illustrated in FIG. 30 has a structure in which quadrangular pyramid shapes as repeating units are arranged in 3×3, the uneven portion 321 of FIG. 32 has a structure in which quadrangular pyramid shapes are arranged in 4×4.

In the seventh pixel separation structure, too, by providing the uneven portion 321, the diffracted light of the incident light increases and a gradient of the refractive index is formed, so that reflection is reduced. As a result, since the amount of incident light to be photoelectrically converted can be increased, sensitivity can be improved.

Note that in the DTI 301, the DTI 302, the DTI 303, the DTI 304, the DTI 311, the DTI 312, and the DTI 331 illustrated as the first to seventh pixel separation structures described above, a side wall and a bottom surface of the DTI may be covered with a fixed charge film, so that the fixed charge film is added to the configuration.

In the case of adding the fixed charge film, the fixed charge film may be formed on the side wall and the bottom surface of the groove portion (trench) formed by digging from the back surface side which is the light incident surface side of the substrate 61 to a predetermined depth, and then the insulator may be embedded. As the fixed charge film, it is preferable to use a material that can be deposited on the substrate 61 such as silicon to generate fixed charge and enhance pinning, and a high refractive index material film or a high dielectric film having negative charge can be used. As a specific material, for example, an oxide or nitride containing at least one element of hafnium (Hf), aluminum (Al), zirconium (Zr), tantalum (Ta), or titanium (Ti) can be applied. Examples of the film forming method include a chemical vapor deposition method (hereinafter referred to as CVD method), a sputtering method, and an atomic layer deposition method (hereinafter referred to as ALD method). By using the ALD method, the SiO2 film that reduces the interface state during film formation can be simultaneously formed to a film thickness of about 1 nm. Additionally, examples of the material other than the above materials include oxides, nitrides, or the like containing at least one element of lanthanum (La), praseodymium (Pr), cerium (Ce), neodymium (Nd), promethium (Pm), samarium (Sm), europium (Eu), gadolinium (Gd), terbium (Tb), dysprosium (Dy), holmium (Ho), thulium (Tm), ytterbium (Yb), lutetium (Lu), or yttrium (Y). Moreover, the fixed charge film can be formed by a hafnium oxynitride film or an aluminum oxynitride film.

Silicon (Si) or nitrogen (N) may be added to the material of the above fixed charge film as long as the insulating properties are not impaired. The concentration is appropriately determined within a range in which the insulating properties of the film are not impaired. As described above, the addition of silicon (Si) or nitrogen (N) makes it possible to increase the heat resistance of the film and the ability to prevent ion implantation in the process.

By covering the side wall and the bottom surface of the DTI with the fixed charge film, an inversion layer is formed on a surface in contact with the fixed charge film. As a result, since the silicon interface is pinned by the inversion layer, generation of dark current is curbed. The curb in generation of dark current contributes to improvement of sensitivity of the pixel 51. Additionally, in a case where the groove portion is formed in the substrate 61, physical damage may occur on the side wall and the bottom surface of the groove portion, and depinning may occur in the periphery of the groove portion. In view of this problem, by forming a fixed charge film having a large amount of fixed charge on the side wall and the bottom surface of the groove portion, depinning is prevented. In the case where the fixed charge film is formed on the side wall and the bottom surface of the DTI, the fixed charge film can be integrally and simultaneously formed with the fixed charge film 66 formed on the light incident surface side of the substrate 61.

<9. Substrate Configuration Example of Light Receiving Device>

Figure 33:
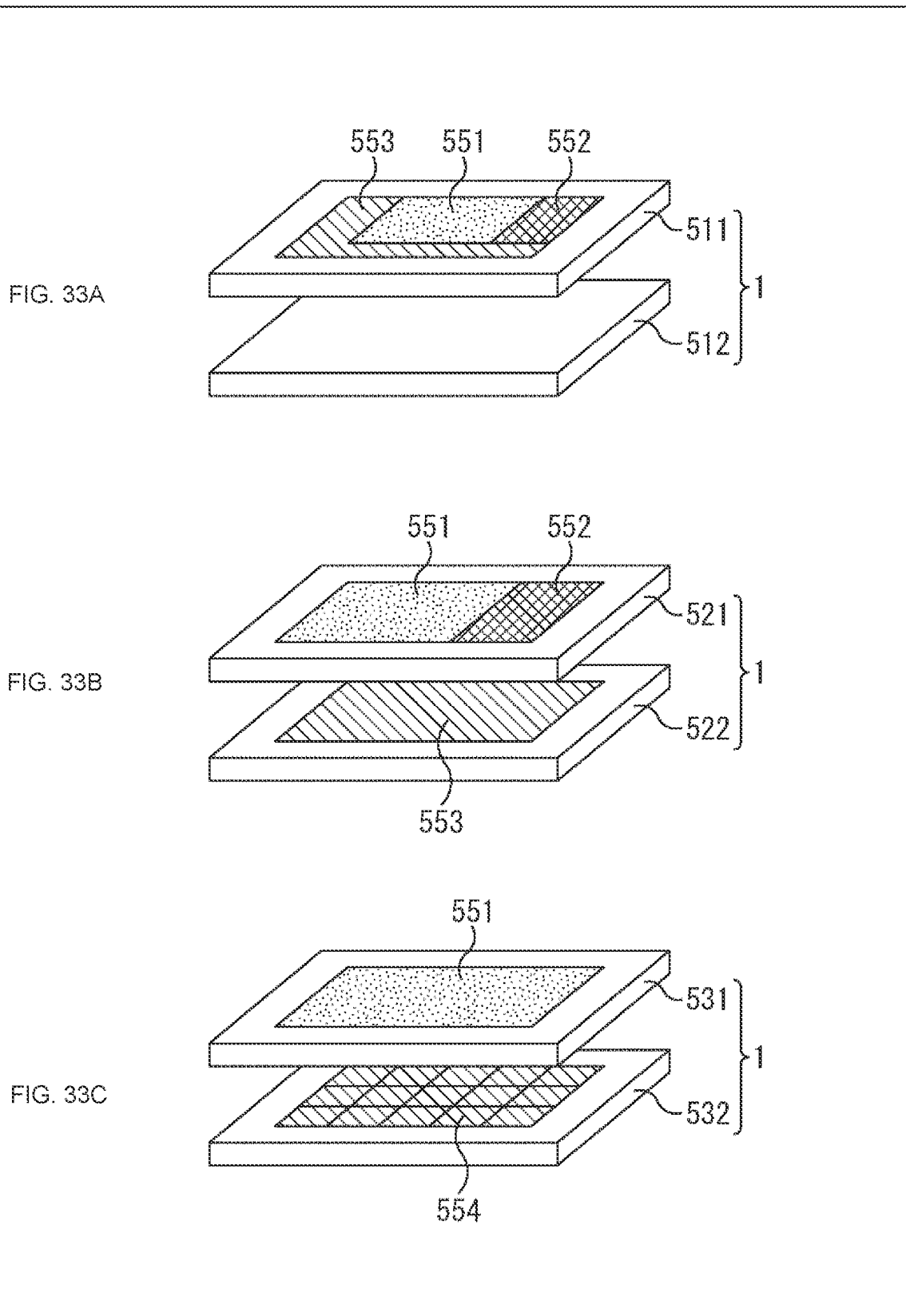
FIG. 33 is a diagram illustrating a substrate configuration of the light receiving device.

The light receiving device 1 of FIG. 1 can adopt any one of the substrate configurations A to C of FIG. 33.

A of FIG. 33 illustrates an example in which the light receiving device 1 includes one semiconductor substrate 511 and a support substrate 512 below the semiconductor substrate 511.

In this case, on the upper semiconductor substrate 511, a pixel array region 551 corresponding to the above-described pixel array unit 20, a control circuit 552 that controls each pixel of the pixel array region 551, and a logic circuit 553 including a signal processing circuit of the detection signal are formed.

The control circuit 552 includes the vertical drive unit 22 and horizontal drive unit 24 described above, and other parts. The logic circuit 553 includes the column processing unit 23 that performs AD conversion processing and the like on the detection signal, and the signal processing unit 31 that performs distance calculation processing of calculating a distance from a ratio of detection signals acquired by two or more taps T in the pixel, calibration processing, and the like.

Alternatively, as illustrated in B of FIG. 33, the light receiving device 1 may be configured such that a first semiconductor substrate 521 on which the pixel array region 551 and the control circuit 552 are formed, and a second semiconductor substrate 522 on which the logic circuit 553 is formed are stacked. Note that the first semiconductor substrate 521 and the second semiconductor substrate 522 are electrically connected by through vias or Cu—Cu metal bonding, for example.

Alternatively, as illustrated in C of FIG. 33, the light receiving device 1 may be configured such that a first semiconductor substrate 531 on which only the pixel array region 551 is formed, and a second semiconductor substrate 532 on which an area control circuit 554 in which a control circuit that controls each pixel and a signal processing circuit that processes the detection signal are provided in units of one pixel or in units of multiple pixel areas is formed are stacked. The first semiconductor substrate 531 and the second semiconductor substrate 532 are electrically connected by through vias or Cu—Cu metal bonding, for example.

According to the configuration in which the control circuit and the signal processing circuit are provided in units of one pixel or in units of areas as in the light receiving device 1 of C of FIG. 33, the optimum drive timing and gain can be set for each divided control unit, and the optimized distance information can be acquired regardless of the distance and the reflectance. Additionally, since the distance information can be calculated by driving not the entire surface of the pixel array region 551 but only a part of the region, it is also possible to curb power consumption according to the operation mode.

<10. Configuration Example of Distance Measuring Module>

Figure 34:
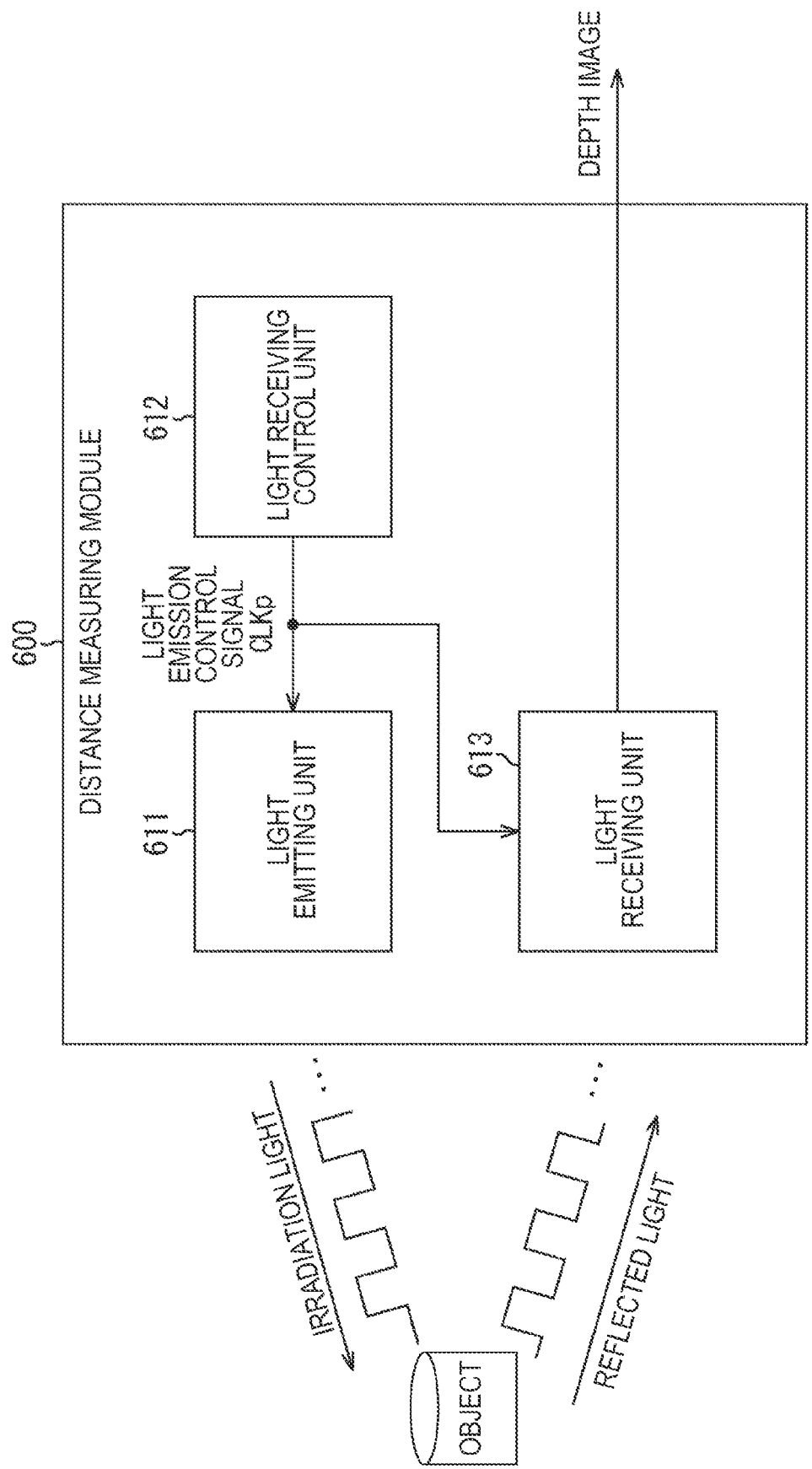
FIG. 34 is a block diagram illustrating a configuration example of a distance measuring module.

FIG. 34 is a block diagram illustrating a configuration example of a distance measuring module that outputs distance measurement information using the light receiving device 1.

A distance measuring module 600 includes a light emitting unit 611, a light emission control unit 612, and a light receiving unit 613.

The light emitting unit 611 has a light source that emits light of a predetermined wavelength, and irradiates an object with irradiation light whose brightness varies periodically. For example, the light emitting unit 611 has a light emitting diode that emits infrared light having a wavelength in a range of 780 nm to 1000 nm as a light source, and generates irradiation light in synchronization with a rectangular wave light emission control signal CLKp supplied from the light emission control unit 612.

Note that the light emission control signal CLKp is not limited to a rectangular wave as long as it is a periodic signal. For example, the light emission control signal CLKp may be a sine wave.

The light emission control unit 612 supplies the light emission control signal CLKp to the light emitting unit 611 and the light receiving unit 613 to control the irradiation timing of the irradiation light. The frequency of the light emission control signal CLKp is 20 megahertz (MHz), for example. Note that the frequency of the light emission control signal CLKp is not limited to 20 megahertz (MHz), and may be 5 megahertz (MHz) or the like.

The light receiving unit 613 receives light reflected from an object, calculates distance information for each pixel according to the light reception result, generates a depth image in which the distance to the object is represented by a grayscale value for each pixel, and outputs the depth image.

The light receiving device 1 described above is used as the light receiving unit 613, and the light receiving device 1 as the light receiving unit 613 calculates distance information for each pixel from the signal intensity detected by the charge detection unit (N+ semiconductor region 71) of each of the first tap TA and the second tap TB of each pixel 51 of the pixel array unit 20, on the basis of the light emission control signal CLKp, for example.

As described above, the light receiving device 1 of FIG. 1 can be incorporated as the light receiving unit 613 of the distance measuring module 600 that obtains and outputs the distance information to the subject by the indirect ToF scheme. By adopting, as the light receiving unit 613 of the distance measuring module 600, each configuration example of the light receiving device 1 described above, such as the light receiving device in which four vertical signal lines VSL are wired for each pixel column, the resolution and the reading speed as the distance measuring module 600 can be improved.

As described above, according to the present technology, the ranging characteristics of the light receiving device as the CAPD sensor can be improved.

Note that in the present technology, the tap structure and wiring of vertical signal lines VSL described above can be arbitrarily combined. For example, the light receiving device 1 may adopt either a shared tap structure or a non-shared tap structure for a configuration in which four vertical signal lines VSL are arranged for each pixel column. Additionally, the pixels having the shared tap structure or the non-shared tap structure and the first to seventh pixel separation structures can be arbitrarily combined.

Additionally, while an example of using electrons as signal carriers has been described above, holes generated by photoelectric conversion may be used as signal carriers. In such a case, the charge detection unit for detecting signal carriers may be configured by a P+ semiconductor region, the voltage application unit for generating an electric field in the substrate may be configured by an N+ semiconductor region, and holes as signal carriers may be detected in the charge detection unit provided in the tap T.

<11. Example of Application to Movable Body>

The technology of the present disclosure (present technology) can be applied to various products. For example, the technology of the present disclosure may be implemented as a device mounted on any type of movable bodies including a car, an electric car, a hybrid electric car, a motorcycle, a bicycle, a personal mobility, an airplane, a drone, a ship, a robot, and the like.

Figure 35:
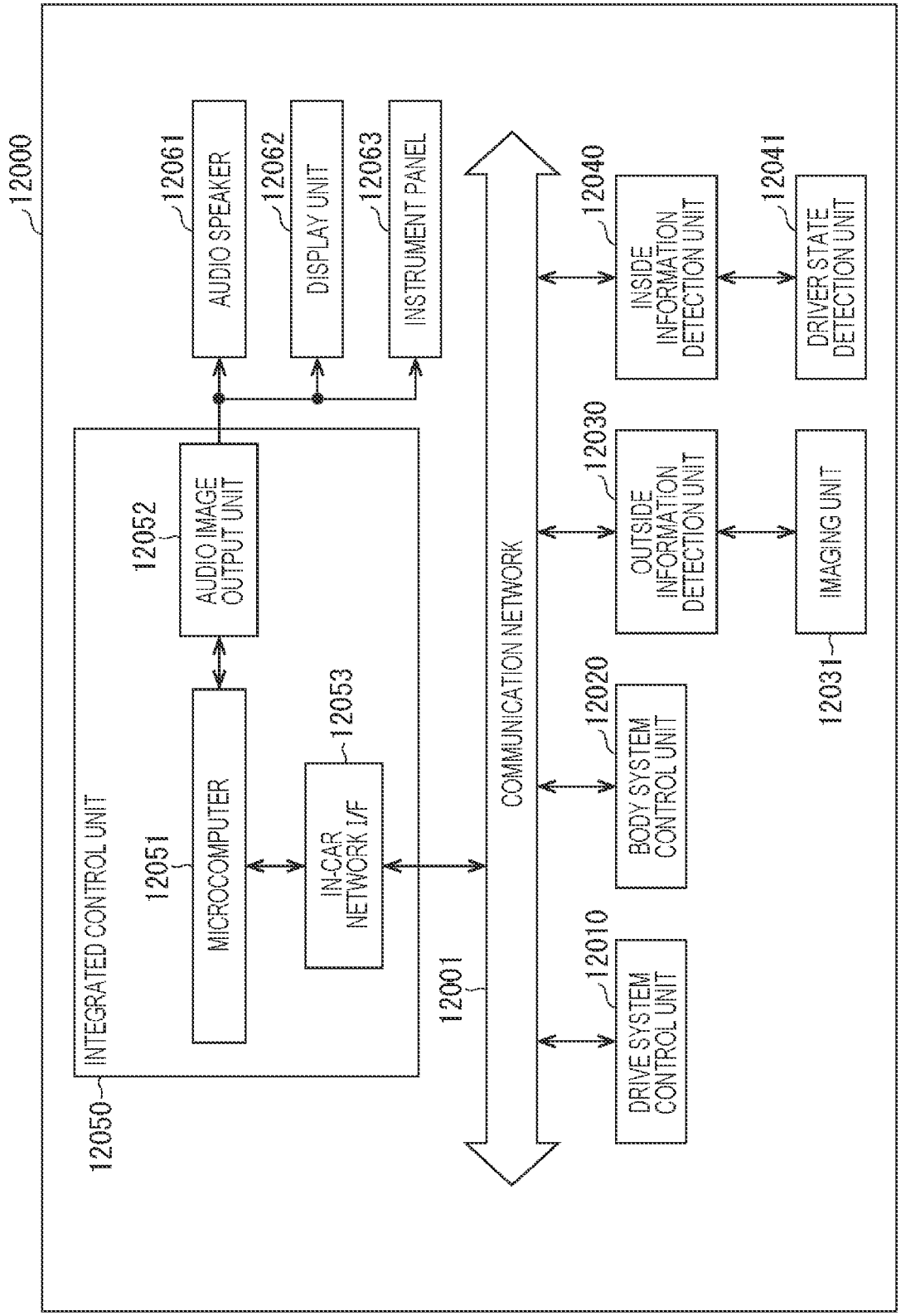
FIG. 35 is a block diagram illustrating an example of a schematic configuration of a vehicle control system.

FIG. 35 is a block diagram illustrating a schematic configuration example of a vehicle control system which is an example of a mobile control system to which the technology according to the present disclosure can be applied.

A vehicle control system 12000 includes multiple electronic control units connected through a communication network 12001. In the example shown in FIG. 35, the vehicle control system 12000 includes a drive system control unit 12010, a body system control unit 12020, an outside information detection unit 12030, an inside information detection unit 12040, and an integrated control unit 12050. Additionally, as a functional configuration of the integrated control unit 12050, a microcomputer 12051, an audio image output unit 12052, and an in-car network interface (I/F) 12053 are shown.

The drive system control unit 12010 controls the operation of devices related to the drive system of the vehicle according to various programs. For example, the drive system control unit 12010 functions as a controller of a drive force generation device for generating a drive force of a vehicle such as an internal combustion engine or a drive motor, a drive force transmission mechanism for transmitting the drive force to wheels, a steering mechanism that adjusts the steering angle of the vehicle, a braking device that generates a braking force of the vehicle, and the like.

The body system control unit 12020 controls the operation of various devices equipped on the vehicle body according to various programs. For example, the body system control unit 12020 functions as a controller of a keyless entry system, a smart key system, a power window device, or various lamps such as a headlamp, a back lamp, a brake lamp, a blinker, or a fog lamp. In this case, the body system control unit 12020 may receive input of radio waves transmitted from a portable device substituting a key or signals of various switches. The body system control unit 12020 receives input of these radio waves or signals, and controls a door lock device, a power window device, a lamp, and the like of the vehicle.

The outside information detection unit 12030 detects information outside the vehicle equipped with the vehicle control system 12000. For example, an imaging unit 12031 is connected to the outside information detection unit 12030. The outside information detection unit 12030 causes the imaging unit 12031 to capture an image of the outside of the vehicle, and receives the captured image. The outside information detection unit 12030 may perform object detection processing or distance detection processing of a person, a vehicle, an obstacle, a sign, characters on a road surface, or the like on the basis of the received image.

The imaging unit 12031 is an optical sensor that receives light and outputs an electrical signal corresponding to the amount of light received. The imaging unit 12031 can output an electric signal as an image or can output the electrical signal as distance measurement information. Additionally, the light received by the imaging unit 12031 may be visible light or non-visible light such as infrared light.

The inside information detection unit 12040 detects information inside the vehicle. For example, a driver state detection unit 12041 that detects a state of a driver is connected to the inside information detection unit 12040. The driver state detection unit 12041 includes a camera for capturing an image of the driver, for example, and the inside information detection unit 12040 may calculate the degree of fatigue or concentration of the driver or determine whether or not the driver is asleep, on the basis of the detection information input from the driver state detection unit 12041.

The microcomputer 12051 can calculate a control target value of the drive force generation device, the steering mechanism, or the braking device on the basis of the information outside or inside the vehicle acquired by the outside information detection unit 12030 or the inside information detection unit 12040, and output a control command to the drive system control unit 12010. For example, the microcomputer 12051 can perform coordinated control aimed to achieve functions of an advanced driver assistance system (ADAS) including collision avoidance or shock mitigation of a vehicle, follow-up traveling based on an inter-vehicle distance, vehicle speed maintenance traveling, vehicle collision warning, vehicle lane departure warning, or the like.

Additionally, the microcomputer 12051 can control the drive force generation device, the steering mechanism, the braking device, or the like on the basis of the information around the vehicle acquired by the outside information detection unit 12030 or the inside information detection unit 12040, to perform coordinated control aimed for automatic driving of traveling autonomously without depending on the driver's operation, for example.

Additionally, the microcomputer 12051 can output a control command to the body system control unit 12020 on the basis of the information outside the vehicle acquired by the outside information detection unit 12030. For example, the microcomputer 12051 can control the headlamp according to the position of the preceding vehicle or oncoming vehicle detected by the outside information detection unit 12030, and perform coordinated control aimed for glare prevention such as switching from high beam to low beam.

The audio image output unit 12052 transmits an output signal of at least one of audio or an image to an output device capable of visually or aurally giving notification of information to a passenger or the outside of a vehicle. In the example of FIG. 35, an audio speaker 12061, a display unit 12062, and an instrument panel 12063 are shown as examples of the output device. The display unit 12062 may include at least one of an onboard display or a head-up display, for example.

Figure 36:
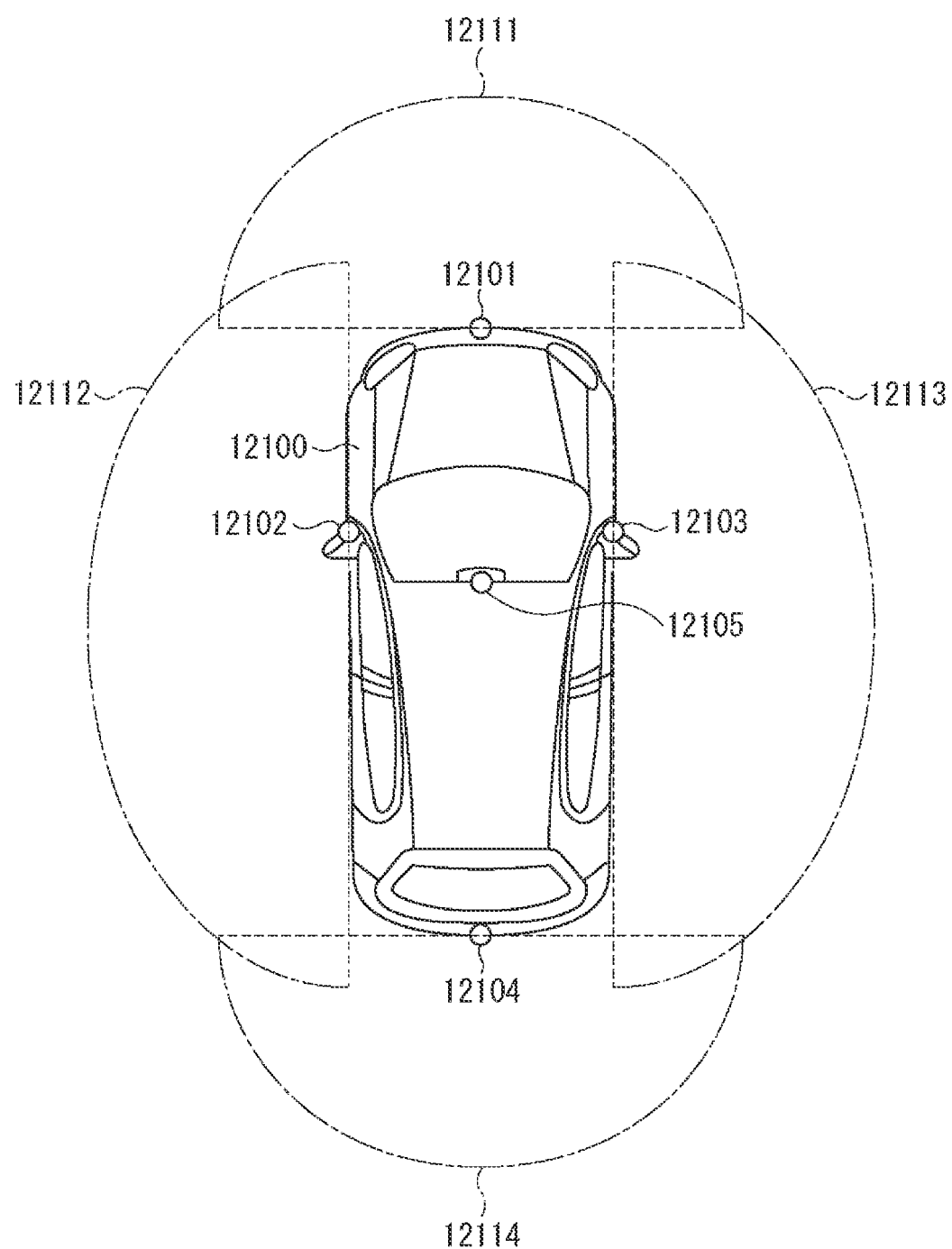
FIG. 36 is an explanatory diagram illustrating an example of installation positions of an outside information detection unit and an imaging unit.

FIG. 36 is a diagram illustrating an example of the installation position of the imaging unit 12031.

In FIG. 36, a vehicle 12100 includes imaging units 12101, 12102, 12103, 12104, and 12105 as the imaging unit 12031.

For example, the imaging units 12101, 12102, 12103, 12104, and 12105 are provided in positions such as a front nose, a side mirror, a rear bumper, a back door, and an upper portion of a windshield in the vehicle interior of the vehicle 12100. The imaging unit 12101 provided on the front nose and the imaging unit 12105 provided on the upper portion of the windshield in the vehicle interior mainly acquire images of the front of the vehicle 12100. The imaging units 12102 and 12103 provided on the side mirrors mainly acquire images of the sides of the vehicle 12100. The imaging unit 12104 provided in the rear bumper or the back door mainly acquires an image of the rear of the vehicle 12100. Images of the front acquired by the imaging units 12101 and 12105 are mainly used to detect a preceding vehicle or a pedestrian, an obstacle, a traffic light, a traffic sign, a lane, or the like.

Note that FIG. 36 shows an example of the imaging ranges of the imaging units 12101 to 12104. An imaging range 12111 indicates the imaging range of the imaging unit 12101 provided on the front nose, imaging ranges 12112 and 12113 indicate the imaging ranges of the imaging units 12102 and 12103 provided on the side mirrors, respectively, and an imaging range 12114 indicates the imaging range of the imaging unit 12104 provided on the rear bumper or the back door. For example, by superimposing the pieces of image data captured by the imaging units 12101 to 12104, a bird's eye view image of the vehicle 12100 as viewed from above can be obtained.

At least one of the imaging units 12101 to 12104 may have a function of acquiring distance information. For example, at least one of the imaging units 12101 to 12104 may be a stereo camera including multiple imaging devices, or may be an imaging device having pixels for phase difference detection.

For example, the microcomputer 12051 can measure the distance to each three-dimensional object in the imaging ranges 12111 to 12114 and the temporal change of this distance (relative velocity with respect to vehicle 12100) on the basis of the distance information obtained from the imaging units 12101 to 12104, to extract, as a preceding vehicle, the closest three-dimensional object on the traveling path of the vehicle 12100 in particular, the three-dimensional object traveling at a predetermined speed (e.g., 0 km/h or more) in substantially the same direction as the vehicle 12100. Moreover, the microcomputer 12051 can set an inter-vehicle distance to be secured in advance before the preceding vehicle, and perform automatic brake control (including follow-up stop control), automatic acceleration control (including follow-up start control), and the like. As described above, it is possible to perform coordinated control aimed for automatic driving of traveling autonomously without depending on the driver's operation, for example.

For example, on the basis of the distance information obtained from the imaging units 12101 to 12104, the microcomputer 12051 can extract three-dimensional object data regarding three-dimensional objects by classifying the data into a two-wheeled vehicle, an ordinary vehicle, a large vehicle, a pedestrian, and other three-dimensional objects such as a telephone pole, and use the data for automatic avoidance of obstacles. For example, the microcomputer 12051 identifies obstacles around the vehicle 12100 as obstacles visible or hardly visible to the driver of the vehicle 12100. Then, the microcomputer 12051 can determine the collision risk indicating the degree of risk of collision with each obstacle, and when the collision risk is a setting value or more and there is a possibility of a collision, the microcomputer 12051 can perform driving support for collision avoidance by outputting a warning to the driver through the audio speaker 12061 or the display unit 12062, or by performing forcible deceleration or avoidance steering through the drive system control unit 12010.

At least one of the imaging units 12101 to 12104 may be an infrared camera that detects infrared light. For example, the microcomputer 12051 can recognize a pedestrian by determining whether or not a pedestrian is present in the images captured by the imaging units 12101 to 12104. Such pedestrian recognition is performed by a procedure of extracting feature points in images captured by the imaging units 12101 to 12104 as infrared cameras, and a procedure of performing pattern matching processing on a series of feature points indicating the outline of an object to determine whether or not the object is a pedestrian, for example. When the microcomputer 12051 determines that a pedestrian is present in the images captured by the imaging units 12101 to 12104 and recognizes the pedestrian, the audio image output unit 12052 controls the display unit 12062, so that a square outline for emphasis is superimposed on the recognized pedestrian. Additionally, the audio image output unit 12052 may control the display unit 12062, so that an icon or the like indicating a pedestrian is displayed in a desired position.

Hereinabove, an example of the vehicle control system to which the technology of the present disclosure can be applied has been described. The technology according to the present disclosure is applicable to the imaging unit 12031 among the configurations described above. Specifically, for example, by applying the light receiving device 1 illustrated in FIG. 1 to the imaging unit 12031, characteristics such as resolution and reading speed can be improved.

Additionally, the embodiment of the present technology is not limited to the above-described embodiment, and various modifications can be made without departing from the scope of the present technology.

Additionally, the effect described in the present specification is merely an illustration and is not restrictive. Hence, other effects can be obtained.

Note that the present technology can also be configured in the following manner.

(1)

A light receiving device including a pixel array unit in which pixels each having a first tap detecting charge photoelectrically converted by a photoelectric conversion unit and a second tap detecting charge photoelectrically converted by the photoelectric conversion unit are two-dimensionally arranged in a matrix, in which the first tap and the second tap each have a voltage application unit that applies a voltage, the pixel array unit has a groove portion formed by digging from a light incident surface side of a substrate to a predetermined depth, and the groove portion is arranged so as to overlap at least a part of the voltage application unit in plan view.

(2)

The light receiving device according to (1) above, in which a planar shape of the groove portion is a lattice shape.

(3)

The light receiving device according to (2) above, in which a lattice pitch is equal to a pixel pitch.

(4)

The light receiving device according to (2) above, in which a lattice pitch is equal to half a pixel pitch.

(5)
The light receiving device according to any one of (2) to (4) above, in which
the groove portion is not formed at an intersection of the lattice.

(6)
The light receiving device according to any one of (2) to (5) above, in which
in the groove portion, an intersection of the lattice is a position of a boundary portion of the pixels.

(7)
The light receiving device according to any one of (2) to (5) above, in which
in the groove portion, an intersection of the lattice is a position of a central portion of the pixel.

(8)
The light receiving device according to any one of (1) to (3) above, in which
the groove portion is doubly formed between adjacent pixels.

(9)
The light receiving device according to any one of (1) to (7) above, in which
an insulating layer or a metal layer is embedded in the groove portion.

(10)
The light receiving device according to any one of (1) to (9) above, in which
the pixel array unit further has a light-shielding film between pixels on the light incident surface side of the substrate.

(11)
The light receiving device according to any one of (1) to (10) above, in which
the voltage application unit is shared by two adjacent pixels.

(12)
The light receiving device according to any one of (1) to (11) above, in which
the pixel has an uneven portion on the light incident surface of the substrate.

(13)
A distance measuring module including
a light receiving device having a pixel array unit in which pixels each having a first tap detecting charge photoelectrically converted by a photoelectric conversion unit and a second tap detecting charge photoelectrically converted by the photoelectric conversion unit are two-dimensionally arranged in a matrix,
the first tap and the second tap each having a voltage application unit that applies a voltage,
the pixel array unit having a groove portion formed by digging from a light incident surface side of a substrate to a predetermined depth, and
the groove portion arranged so as to overlap at least a part of the voltage application unit in plan view.

REFERENCE SIGNS LIST

1 Light receiving device
20 Pixel array unit
21 Tap drive unit
51 Pixel
TA First tap
TB Second tap
VSL (VSL0 to VSL3) Vertical signal line
61 Substrate
62 On-chip lens
71 N+ semiconductor region
73 P+ semiconductor region
111 Multilayer wiring layer
M1 to M5 Metal film
121 Transfer transistor
122 FD
123 Reset transistor
124 Amplification transistor
125 Selection transistor
127 Additional capacitor
128 Switching transistor
301 to 304 DTI
311, 312 DTI
321 Uneven portion
331 DTI

The invention claimed is:

1. A light receiving device, comprising:
a pixel array unit including:
a plurality of pixels, wherein
the plurality of pixels is arranged two-dimensionally in a matrix, and each pixel of the plurality of pixels includes:
a first tap configured to detect charge photoelectrically converted by a photoelectric conversion unit, wherein the first tap includes a first voltage application unit configured to apply a first voltage; and
a second tap configured to detect the charge photoelectrically converted by the photoelectric conversion unit, wherein the second tap includes a second voltage application unit configured to apply a second voltage; and
a groove portion, wherein
the groove portion is formed by digging from a light incident surface side of a substrate to a predetermined depth, and
the groove portion is arranged so as to overlap at least a part of one of the first voltage application unit or the second voltage application unit in a plan view.

2. The light receiving device according to claim 1, wherein a planar shape of the groove portion is a lattice shape.

3. The light receiving device according to claim 2, wherein a lattice pitch of a lattice is equal to a pixel pitch of the plurality of pixels.

4. The light receiving device according to claim 2, wherein a lattice pitch of a lattice is equal to half a pixel pitch of the plurality of pixels.

5. The light receiving device according to claim 2, wherein the groove portion is absent at an intersection of a lattice.

6. The light receiving device according to claim 2, wherein
in the groove portion, an intersection of a lattice is a position of a boundary portion of the plurality of pixels.

7. The light receiving device according to claim 2, wherein
in the groove portion, an intersection of a lattice is a position of a central portion of a pixel of the plurality of pixels.

8. The light receiving device according to claim 2, wherein the groove portion is a double structure between adjacent pixels of the plurality of pixels.

9. The light receiving device according to claim 1, wherein one of an insulating layer or a metal layer is in the groove portion.

10. The light receiving device according to claim 1, wherein
the pixel array unit further includes a light-shielding film between each pixel of the plurality of pixels, and
the light-shielding film is on the light incident surface side of the substrate.

11. The light receiving device according to claim 1, wherein the first voltage application unit is shared by two adjacent pixels of the plurality of pixels.

12. The light receiving device according to claim 1, wherein each pixel of the plurality of pixels has an uneven portion on the light incident surface side of the substrate.

13. A distance measuring module, comprising:
a light receiving device comprising:
a pixel array unit including:
a plurality of pixels, wherein
the plurality of pixels is arranged two-dimensionally in a matrix, and each pixel of the plurality of pixels includes:
a first tap configured to detect charge photoelectrically converted by a photoelectric conversion unit, wherein the first tap includes a first voltage application unit configured to apply a first voltage; and
a second tap configured to detect the charge photoelectrically converted by the photoelectric conversion unit, wherein the second tap includes a second voltage application unit configured to apply a second voltage; and a groove portion, wherein
the groove portion is formed by digging from a light incident surface side of a substrate to a predetermined depth, and
the groove portion arranged so as to overlap at least a part of one of the first voltage application unit or the second voltage application unit in a plan view.

* * * * *